US010068885B2

(12) United States Patent
Makimura et al.

(10) Patent No.: US 10,068,885 B2
(45) Date of Patent: Sep. 4, 2018

(54) OPTICAL APPARATUS

(71) Applicant: ROHM CO., LTD., Kyoto-shi, Kyoto (JP)

(72) Inventors: Yuji Makimura, Kyoto (JP); Okimoto Kondo, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/628,229

(22) Filed: Jun. 20, 2017

(65) Prior Publication Data

US 2017/0301661 A1    Oct. 19, 2017

Related U.S. Application Data

(63) Continuation of application No. 15/246,151, filed on Aug. 24, 2016, now Pat. No. 9,716,083, which is a
(Continued)

(30) Foreign Application Priority Data

Jan. 20, 2011  (JP) ................ 2011-009366
Feb. 17, 2011  (JP) ................ 2011-032400
(Continued)

(51) Int. Cl.
*H01L 27/15*     (2006.01)
*H01L 25/16*     (2006.01)
(Continued)

(52) U.S. Cl.
CPC ........... *H01L 25/167* (2013.01); *H01H 57/00* (2013.01); *H01H 59/0009* (2013.01);
(Continued)

(58) Field of Classification Search
CPC ............... H01H 57/00; H01H 59/0009; H01L 31/02005; H01L 31/02164;
(Continued)

(56) References Cited

U.S. PATENT DOCUMENTS 5,291,038 A    3/1994  Hanamoto et al.
6,545,811 B1   4/2003  Fujimoto
(Continued)

FOREIGN PATENT DOCUMENTS

JP    2000-150951    5/2000
JP    2002-359394    12/2002
(Continued)

*Primary Examiner* — Yosef Gebreyesus
(74) *Attorney, Agent, or Firm* — Hamre, Schumann, Mueller & Larson, P.C.

(57) ABSTRACT

An optical apparatus includes a substrate 1, a wiring pattern 8 formed on the substrate 1, a light-receiving element 3 and a light-emitting element 2 provided on the substrate 1 and spaced apart from each other in a direction x, a light-transmitting resin 4 covering the light-receiving element 3, a light-transmitting resin 5 covering the light-emitting element 2, and a light-shielding resin 6 covering the light-transmitting resin 4 and the light-transmitting resin 5. The wiring pattern 8 includes a first light-blocking portion 83 interposed between the light-shielding resin 6 and the substrate 1 and positioned between the light-receiving element 3 and the light-emitting element 2 as viewed in x-y plane. The first light-blocking portion 83 extends across the light-emitting element 2 as viewed in the direction x.

30 Claims, 38 Drawing Sheets

Related U.S. Application Data continuation of application No. 14/743,411, filed on Jun. 18, 2015, now Pat. No. 9,449,956, which is a continuation of application No. 13/980,446, filed as application No. PCT/JP2012/050460 on Jan. 12, 2012, now Pat. No. 9,130,109.

(30) Foreign Application Priority Data

Feb. 17, 2011 (JP) ................... 2011-032401
Mar. 9, 2011 (JP) ................... 2011-052040

(51) Int. Cl.

| | |
|---|---|
| *H01L 31/0216* | (2014.01) |
| *H01L 31/16* | (2006.01) |
| *H01L 31/173* | (2006.01) |
| *H01L 31/0352* | (2006.01) |
| *H01L 31/02* | (2006.01) |
| *H01H 57/00* | (2006.01) |
| *H01H 59/00* | (2006.01) |
| *G01V 8/10* | (2006.01) |

(52) U.S. Cl.

CPC .. *H01L 31/02005* (2013.01); *H01L 31/02164* (2013.01); *H01L 31/035272* (2013.01); *H01L 31/16* (2013.01); *H01L 31/173* (2013.01); *G01V 8/10* (2013.01); *H01L 2224/48227* (2013.01); *H01L 2224/49171* (2013.01); *H01L 2924/3025* (2013.01); *H01L 2933/0091* (2013.01)

(58) Field of Classification Search

CPC ............. H01L 31/035272; H01L 31/16; H01L 31/173; H01L 25/167; H01L 2224/48227; H01L 2224/49171; H01L 2924/3025; H01L 2933/0091; G01V 8/10

See application file for complete search history.

(56) References Cited

U.S. PATENT DOCUMENTS

| | | | |
|---|---|---|---|
| 7,235,804 | B2 | 6/2007 | Aki |
| 8,677,605 | B2 | 3/2014 | Lim et al. |
| 9,130,109 | B2 | 9/2015 | Makimura |
| 2002/0154366 | A1 | 10/2002 | Horio |
| 2002/0180369 | A1 | 12/2002 | Koyama |
| 2002/0181898 | A1 | 12/2002 | Nakano |
| 2003/0189213 | A1 | 10/2003 | Igaki et al. |
| 2004/0256618 | A1 | 12/2004 | Imai |
| 2005/0023489 | A1 | 2/2005 | Kikuchi |
| 2005/0219017 | A1 | 10/2005 | Shirakawa |
| 2007/0018123 | A1 | 1/2007 | Sano |
| 2007/0057364 | A1* | 3/2007 | Wang .................. C03C 8/02 257/701 |
| 2008/0142744 | A1 | 6/2008 | Ishihara |
| 2008/0159691 | A1 | 7/2008 | Aki |
| 2009/0189174 | A1 | 7/2009 | Lee |
| 2010/0074573 | A1* | 3/2010 | Yoshikawa ............ G02B 6/423 385/14 |
| 2010/0109021 | A1 | 5/2010 | Horio |
| 2010/0259766 | A1 | 10/2010 | Wiese et al. |
| 2011/0062473 | A1 | 3/2011 | Tanuma et al. |

FOREIGN PATENT DOCUMENTS

| | | |
|---|---|---|
| JP | 2004-272061 | 9/2004 |
| JP | 2006-173306 | 6/2006 |
| JP | 2010-34189 | 2/2010 |
| JP | 2010-123734 | 6/2010 |

* cited by examiner

FIG.4
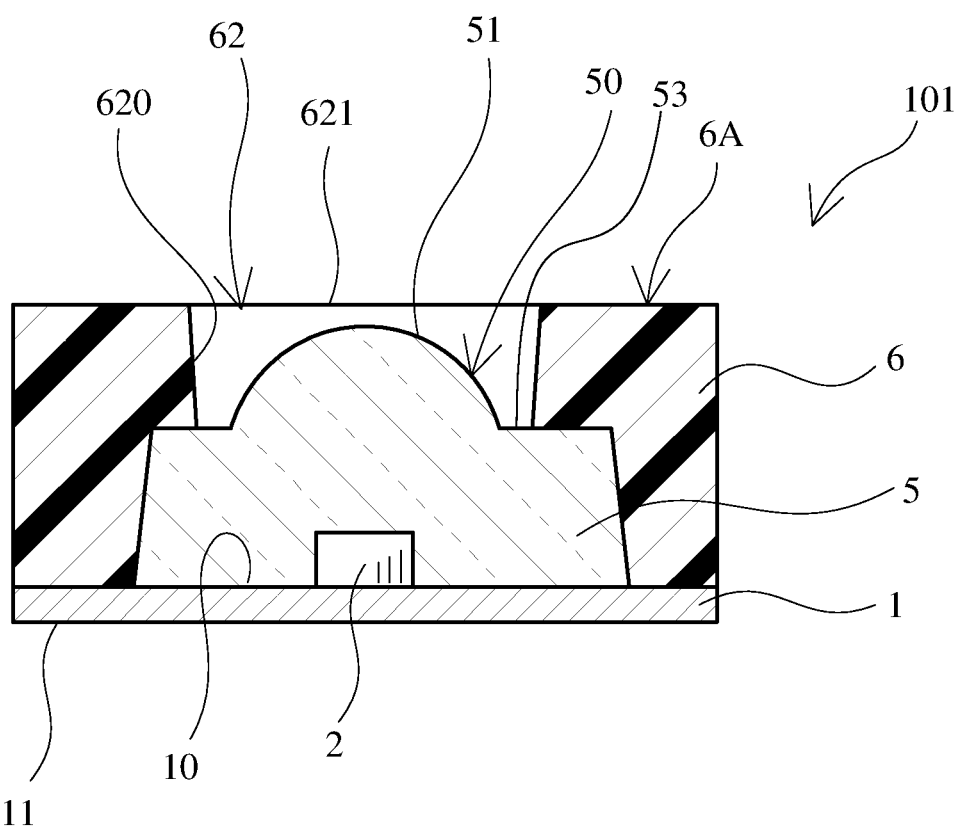
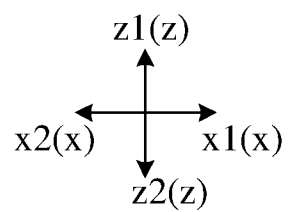

OPTICAL APPARATUS

TECHNICAL FIELD

The present invention relates to an optical apparatus.

BACKGROUND ART

FIG. 38 is a sectional view of an example of a proximity sensor. The proximity sensor 900 shown in the figure includes a glass-epoxy substrate 91, a light-emitting element 92, a light-receiving element 93, primary mold resin portions 94, 95, and a secondary mold resin portion 96. The light-emitting element 92 and the light-receiving element 93 are mounted on the glass-epoxy substrate 91. The light-emitting element 92 emits infrared light. The light-receiving element 93 sends out an electric signal corresponding to the amount of received infrared light. The primary mold resin portions 94 and 95 are transparent and transmit infrared light. The primary mold resin portion 94 covers the light-receiving element 93 on the glass-epoxy substrate 91. The primary mold resin portion 94 has a convex light-incident surface 940. The primary mold resin portion 95 covers the light-emitting element 92 on the glass-epoxy substrate 91. The primary mold resin portion 95 has a convex light-emitting surface 950. The secondary mold resin portion 96 is black and does not transmit infrared light. The secondary mold resin portion 96 covers the primary molding resin portions 94 and 95 on the glass-epoxy substrate 91. The secondary mold resin portion 96 has a first opening 961 and a second opening 962. The light-incident surface 940 is exposed to the direction z side through the first opening 961. The light-emitting surface 950 is exposed to the direction z side through the second opening 962. The highest point of the light-incident surface 940 is at the same position as the edge of the first opening 961 in the direction z. Similarly, the highest point of the light-emitting surface 950 is at the same position as the edge of the second opening 962 in the direction z. This type of proximity sensor is disclosed in e.g. Patent Document 1.

For instance, the proximity sensor 900 is incorporated in a touch panel type electronic device (such as a cell phone). The proximity sensor 900 is arranged adjacent to a liquid crystal display 902 of an electronic device. The proximity sensor 900 and the liquid crystal display 902 face a light-transmitting cover 903. The infrared light L91 emitted from the light-emitting element 92 travels through the light-emitting surface 950 toward the light-transmitting cover 903. The infrared light L91 then passes through the light-transmitting cover 903 to be reflected by the object 901. The infrared light L91 reflected by the object 901 passes through the light-transmitting cover 903 again. Then, the infrared light L91 passes through the light-incident surface 940 to be received by the light-receiving element 93. The light-receiving element 93 sends an electric signal corresponding to the amount of the received infrared light to a controller (not shown). When the output level from the light-receiving element 93 exceeds a predetermined threshold, the controller determines that the object 901 is close to the liquid crystal display 902. That is, in an electronic device, when a user holds a liquid crystal display 902 close to his or her cheek to make a phone call, the approach of the cheek is detected by the proximity sensor 900. By this, the touch panel operation using the liquid crystal display 902 is disabled during a phone call, whereby malfunction during a phone call is prevented. Also, during a phone call, the liquid crystal display 902 is set to an "off" state, which suppresses power consumption of the battery of the electronic device.

As shown in FIG. 38, the proximity sensor 900 is arranged to have a certain distance from the light-transmitting cover 903. Thus, some part of the infrared light emitted from the light-emitting surface 950 impinges on the light-transmitting cover 903 with a relatively large incident angle. The light impinging on the light-transmitting cover 903 with a relatively large incident angle is reflected by the light-transmitting cover 903 to become noise light L92. The noise light L92 impinging on the light-incident surface 940 can be received by the light-receiving element 93. When the noise light L92 is received by the light-receiving element 93, false detection may occur in which the controller determines the object 901 is close to the light-transmitting cover 903, though the object 901 is not actually close to the light-transmitting cover.

The proximity sensor 900 may include an illuminance sensor, in addition to the light-receiving element 93. Each of the illuminance sensor and the light-receiving element 93 is made of a chip and arranged on the glass-epoxy substrate 91. In recent years, there is an increasing demand for size reduction of such a proximity sensor 900.

In the proximity sensor 900, between the primary mold resin portion 94 and the primary mold resin portion 95, the same transparent resin as the material for the primary mold resin portions 94, 95 may be formed in the space between the secondary mold resin portion 96 and the glass-epoxy substrate 91. In this case, during the use of the proximity sensor 900, the light emitted from the light-emitting element 92 may pass through this transparent resin to be received by the light-receiving element 93. The above-described false detection may occur when the light emitted from the light-emitting element 92 passes through this transparent resin and received by the light-receiving element 93.

TECHNICAL REFERENCE

Patent Document

Patent Document 1: JP-A-2010-34189

SUMMARY OF THE INVENTION

Problems to be Solved by the Invention

The present invention has been conceived under the circumstances described above. It is therefore an object of the present invention to provide an optical apparatus that does not easily cause false detection.

Means for Solving the Problems

According to a first aspect of the present invention, there is provided an optical apparatus comprising a substrate, a wiring pattern on the substrate, a light-receiving element and a light-emitting element provided on the substrate and spaced apart from each other in a first direction perpendicular to a thickness direction of the substrate, a first light-transmitting resin covering the light-receiving element, a second light-transmitting resin covering the light-emitting element, and a light-shielding resin covering the first light-transmitting resin and the second light-transmitting resin. The wiring pattern includes a first light-blocking portion interposed between the light-shielding resin and the substrate and positioned between the light-receiving element and the light-emitting element as viewed in the thickness direction. The first light-blocking portion extends across the light-emitting element as viewed in the first direction.

According to a second aspect of the present invention, there is provided an optical apparatus comprising a substrate, a light-receiving element provided on the substrate, a first light-transmitting resin covering the light-receiving element, and a light-shielding resin covering the first light-transmitting resin and including a first opening. The first light-transmitting resin includes a light-incident surface exposed through the first opening. The light-shielding resin includes a first irregular surface. In the depth direction of the first opening, the first irregular surface is oriented in the direction from the light-receiving element toward the light-incident surface. The first irregular surface is positioned on a first direction side of the first opening, the first direction being perpendicular to the depth direction of the first opening.

According to a third aspect of the present invention, there is provided an optical apparatus comprising a substrate, a light-receiving element provided on the substrate, a first light-transmitting resin covering the light-receiving element, and a light-shielding resin covering the first light-transmitting resin and including a first opening. The first light-transmitting resin includes a light-incident surface exposed through the first opening. The light-receiving element includes a semiconductor substrate, an infrared light detecting portion provided on the semiconductor substrate, and a visible light detecting portion provided on the semiconductor substrate.

According to a fourth aspect of the present invention, there is provided an optical apparatus comprising a substrate, a light-receiving element provided on the substrate, a first light-transmitting resin covering the light-receiving element, and a light-shielding resin covering the first light-transmitting resin and including a first opening. The first light-transmitting resin includes a light-incident surface exposed through the first opening. The light-shielding resin includes a first inner circumferential wall defining the first opening. The first inner circumferential wall includes a first edge. In the depth direction of the first opening, the first edge is offset in the direction from the light-receiving element toward the light-incident surface from any portion of the first light-transmitting resin exposed through the first opening.

Preferably, the first light-blocking portion includes a first portion and a second portion spaced apart from each other, and the light-shielding resin includes a bonding portion that is sandwiched between the first portion and the second portion and in contact with the substrate.

Preferably, the bonding portion overlaps the light-emitting element in a second direction perpendicular to both of the thickness direction of the substrate and the first direction.

Preferably, each of the first portion and the second portion is in the form of a strip elongated in a second direction perpendicular to both of the thickness direction of the substrate and the first direction.

Preferably, the first light-blocking portion includes two joint portions spaced apart from each other as viewed in the thickness direction, with the bonding portion positioned therebetween. Each of the joint portions is connected to both of the first portion and the second portion.

Preferably, the wiring pattern includes a light-emitting element pad on which the light-emitting element is bonded.

Preferably, the wiring pattern includes a second light-blocking portion interposed between the light-shielding resin and the substrate. The second light-blocking portion overlaps the light-emitting element pad in the first direction.

Preferably, the second light-blocking portion includes a portion covered by the second light-transmitting resin.

Preferably, the second light-blocking portion is connected to the first light-blocking portion.

Preferably, the wiring pattern includes a third light-blocking portion interposed between the light-shielding resin and the substrate. The third light-blocking portion overlaps the light-emitting element pad in the first direction. The light-emitting element pad is positioned between the second light-blocking portion and the third light-blocking portion as viewed in the first direction.

Preferably, the third light-blocking portion includes a portion covered by the second light-transmitting resin.

Preferably, the third light-blocking portion is connected to the first light-blocking portion.

Preferably, the optical apparatus further comprises a wire bonded to the light-emitting element. The wiring pattern includes a wire bonding pad on which the wire is bonded. The third light-blocking portion is electrically connected to the wire bonding pad.

Preferably, the optical apparatus further comprises a wire bonded to the light-emitting element. The wiring pattern includes a wire bonding pad on which the wire is bonded, and a linking portion connected to the light-emitting element pad and the first light-blocking portion.

Preferably, the light-emitting element includes a cathode electrode and an anode electrode. The first light-blocking portion is electrically connected to the cathode electrode.

Preferably, the first light-blocking portion is a ground electrode.

Preferably, the wiring pattern includes a light-receiving element pad on which the light-receiving element is arranged, and a connecting portion connected to the light-receiving element pad and the first light-blocking portion.

Preferably, the first light-blocking portion includes a portion covered by the second light-transmitting resin.

Preferably, the wiring pattern includes a mounting terminal on a side of the substrate which is opposite from a side where the first light-blocking portion is provided.

Preferably, the optical apparatus further comprises a through-hole electrode electrically connected to the mounting terminal and penetrating the substrate.

Preferably, in the first irregular surface, the light-shielding resin includes a plurality of grooves extending in one direction.

Preferably, the first irregular surface includes first groove surfaces and second groove surfaces. Each of the first groove surfaces and each of the second groove surfaces define one of the grooves and face each other across the bottom of the groove. The second groove surface is further away from the first opening than the first groove surface is.

Preferably, the first groove surface is inclined at a first angle with respect to the first direction, and the second groove surface in inclined at a second angle smaller than the first angle with respect to the first direction.

Preferably, the first angle is 50-70°.

Preferably, each of the grooves extends in a second direction perpendicular to both of the depth direction and the first direction.

Preferably, each of the grooves extends circumferentially around the center of the first opening.

Preferably, each of the grooves extends in the first direction. The first irregular surface includes first groove surfaces and second groove surfaces. Each of the first groove surfaces and each of the second groove surfaces define one of the grooves and face each other across the bottom of the groove. The first groove surfaces are inclined at a first angle with respect to a second direction perpendicular to both of the depth direction and the first direction. The second groove surfaces are further away from an imaginary straight line extending through the center of the first opening in the first direction than the first groove surfaces are and inclined at a second angle smaller than the first angle with respect to the second direction.

Preferably, the light-shielding resin includes a second irregular surface oriented in the direction from the light-receiving element toward the light-incident surface in the depth direction of the first opening. The first opening is positioned between the first irregular surface and the second irregular surface.

Preferably, both of the first groove surfaces and the second groove surfaces are flat.

Preferably, the light-incident surface includes a portion that overlaps the infrared light detecting portion as viewed in the depth direction of the first opening.

Preferably, the light-receiving element includes a multilayered optical film that covers the infrared light detecting portion and transmits infrared light.

Preferably, part of the visible light detecting portion is positioned inside a smallest rectangular region that is the smallest rectangular region enclosing the infrared light detecting portion as viewed in the depth direction of the first opening.

Preferably, the entirety of the visible light detecting portion is positioned outside a smallest rectangular region that is the smallest rectangular region enclosing the infrared light detecting portion as viewed in the depth direction of the first opening.

Preferably, the light-receiving element includes a functional element portion that performs computation with respect to an output from the visible light detecting portion and an output from the infrared light detecting portion.

Preferably, the light-receiving element includes a multilayered optical film that covers the infrared light detecting portion and the functional element portion and transmits infrared light.

Preferably, the optical apparatus further includes a light-emitting element provided on the substrate. As viewed in the depth direction of the first opening, the infrared light detecting portion is further away from the light-emitting element than the visible light detecting portion is.

Preferably, the first inner circumferential wall is an inclined surface that proceeds toward the center of the first opening as proceeding toward the deeper side in the depth direction of the first opening.

Preferably, the first inner circumferential wall includes a first portion and a second portion facing each other in a first direction perpendicular to the depth direction of the first opening. The inclination angle of the first portion with respect to the depth direction of the first opening is larger than the inclination angle of the second portion with respect to the depth direction of the first opening.

Preferably, the inclination angle of the first portion with respect to the depth direction of the first opening is not less than 15°.

Preferably, the first light-transmitting resin includes a first projection received in the first opening, and the first projection provides the light-incident surface.

Preferably, the first projection is spaced apart from the first inner circumferential wall.

Preferably, the light-incident surface is flat.

Preferably, the optical apparatus further includes a light-emitting element provided on the base, and a second light-transmitting resin covering the light-emitting element. The light-shielding resin is interposed between the first light-transmitting resin and the second light-transmitting resin and covers the second light-transmitting resin. The light-shielding resin includes a second opening, and the second light-transmitting resin includes a light-emitting surface exposed through the second opening.

Preferably, the light-shielding resin includes a second inner circumferential wall defining the second opening. The second inner circumferential wall includes a second edge. In the depth direction of the second opening, the second edge is offset in the direction from the light-emitting element toward the light-emitting surface from any portion of the second light-transmitting resin exposed through the second opening.

Preferably, the second inner circumferential wall is an inclined surface that proceeds toward the center of the second opening as proceeding toward the deeper side in the depth direction of the second opening.

Preferably, the second light-transmitting resin includes a second projection received in the second opening, and the second projection provides the light-emitting surface.

Preferably, the second light-transmitting resin includes a first cut surface provided by the second projection, and a second cut surface provided by the second projection and positioned further away from the light-receiving element than the first cut surface is.

Preferably, the first cut surface faces the second inner circumferential wall. The second cut surface is exposed from the light-shielding resin to the side opposite from the side where the light-receiving element is arranged.

Preferably, the first cut surface is spaced apart from the second inner circumferential wall.

Preferably, the light emitting-surface is a convex surface.

According to a fifth aspect of the present invention, there is provided an electronic device comprising an optical apparatus provided by any one of the first through the fourth aspects of the present invention, and a light-transmitting cover facing the light-emitting surface.

Other features and advantages of the present invention will become more apparent from detailed description given below with reference to the accompanying drawings.

BRIEF DESCRIPTION OF THE DRAWINGS

FIG. 4 is a sectional view taken along lines IV-IV in FIG. 1;

MODE FOR CARRYING OUT THE INVENTION

First Embodiment

A first embodiment is described below with reference to FIGS. 1-25. The electronic device 801 shown in FIG. 22 includes an optical apparatus 101, a liquid crystal display 802 and a light-transmitting cover 803. For instance, the electronic device 801 is a cell phone of a touch panel type.

The liquid crystal display 802 displays icons used for carrying out various functions of the electronic device 801. For instance, the light-transmitting cover 803 is made of acrylic. The light-transmitting cover 803 transmits infrared light and visible light. The light-transmitting cover 803 faces the liquid crystal display 802 and the optical apparatus 101. The optical apparatus 101 is arranged as spaced apart from the light-transmitting cover 803 a distance d. For instance, the distance d is about 0.25-1 mm.

Figure 1:
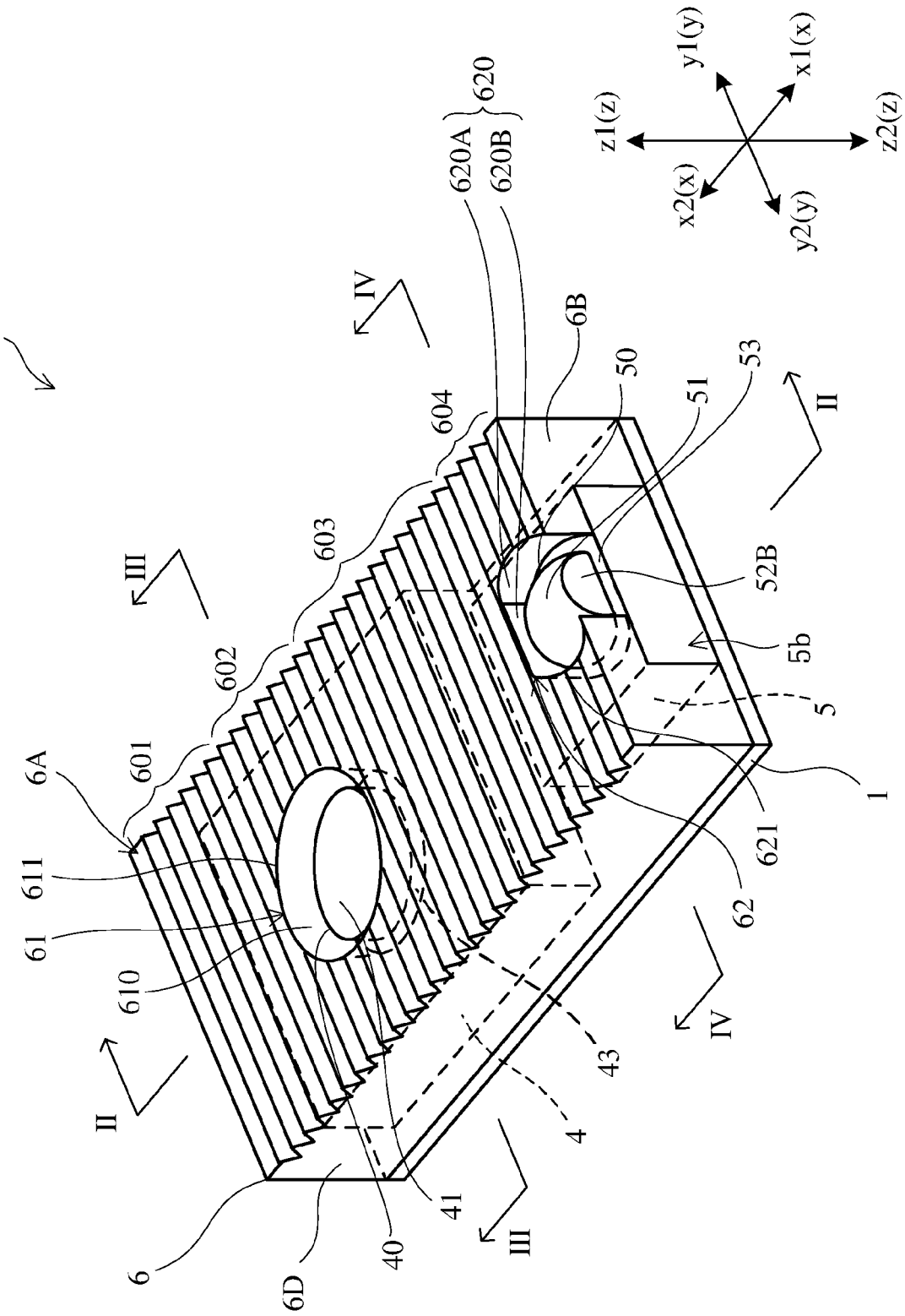
FIG. 1 is a perspective view of an optical apparatus according to a first embodiment.
Figure 2:
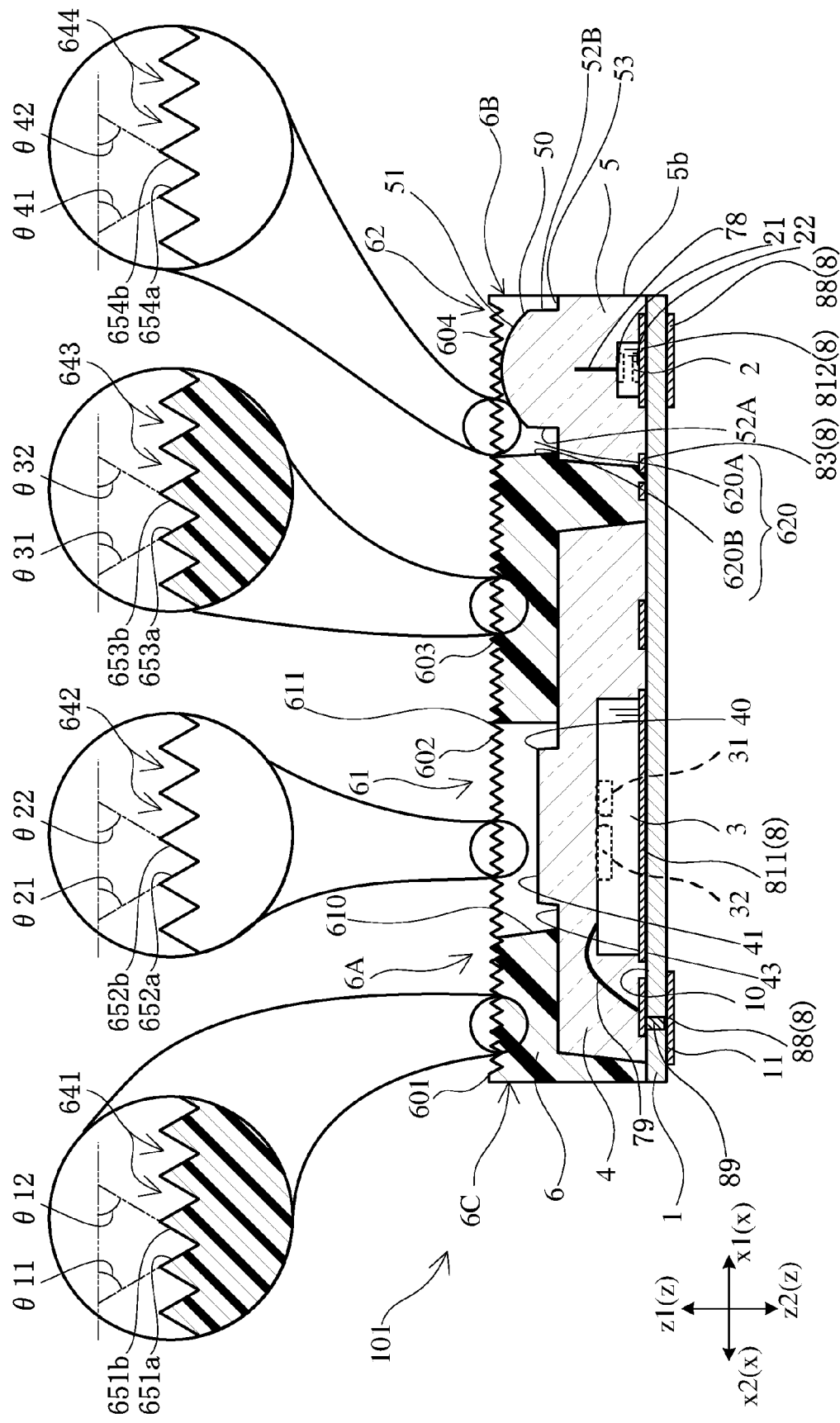
FIG. 2 is a sectional view taken along lines II-II in FIG. 1.
Figure 3:
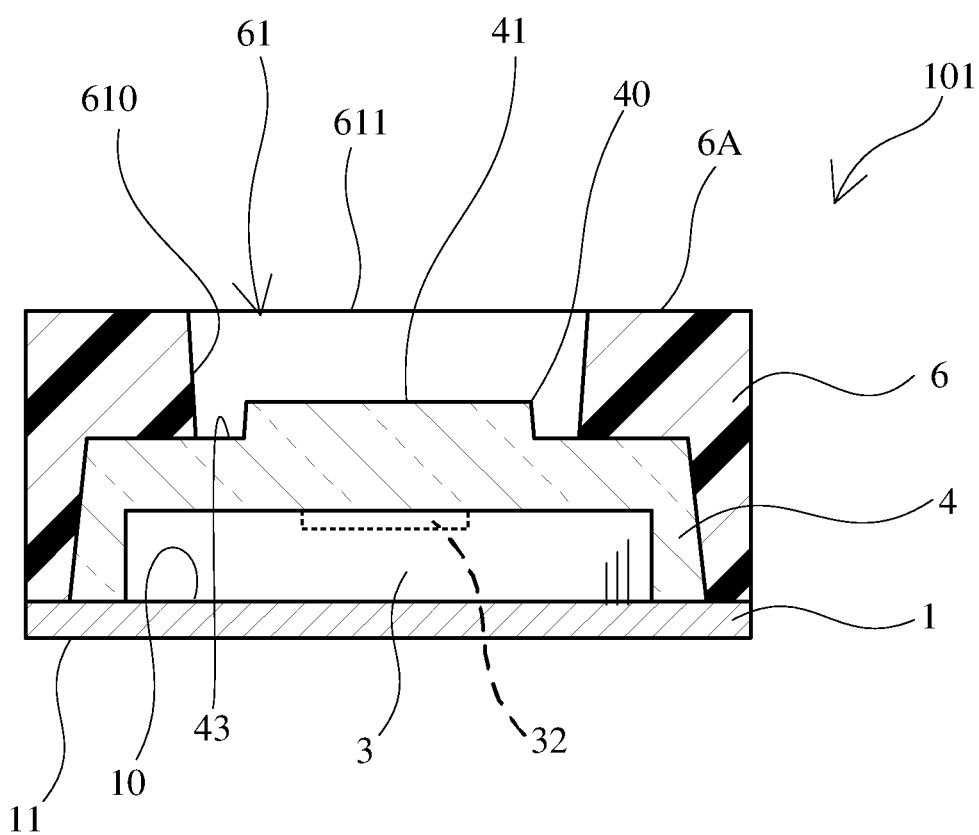
FIG. 3 is a sectional view taken along lines III-III in FIG. 1.
Figure 5:
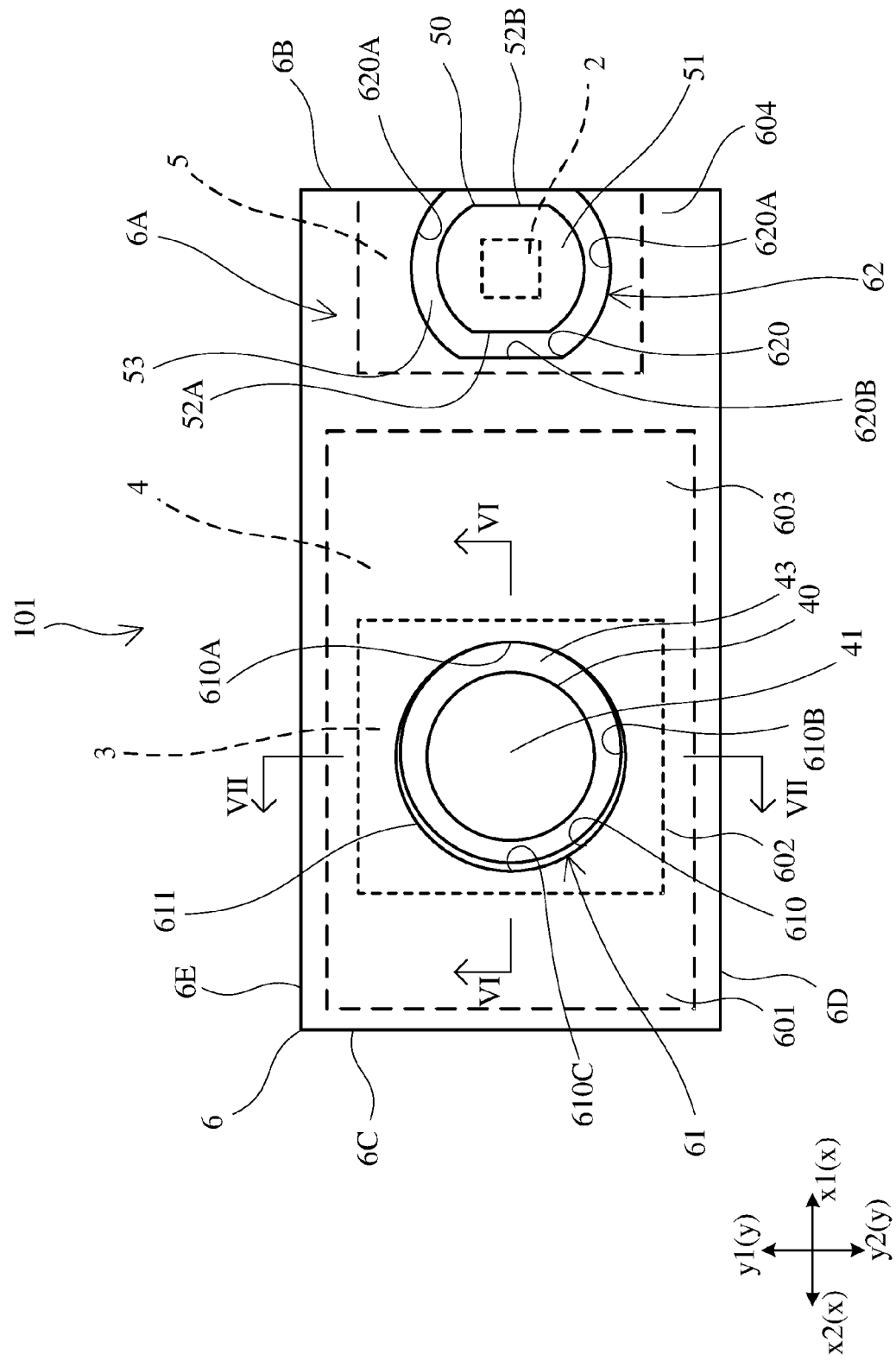
FIG. 5 is a plan view of the optical apparatus shown in FIG. 1.
Figure 6:
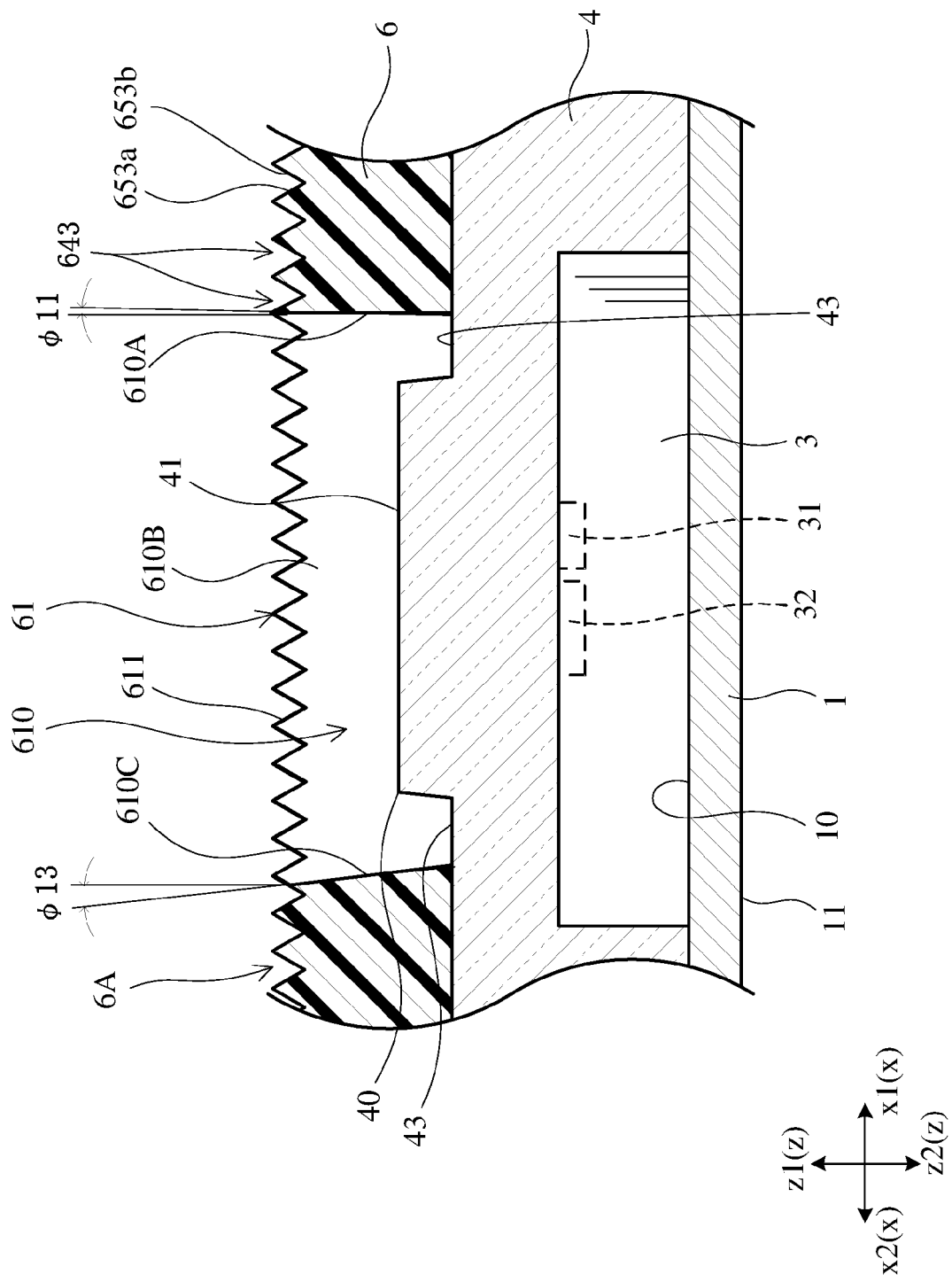
FIG. 6 is a sectional view taken along lines VI-VI in FIG. 5.
Figure 7:
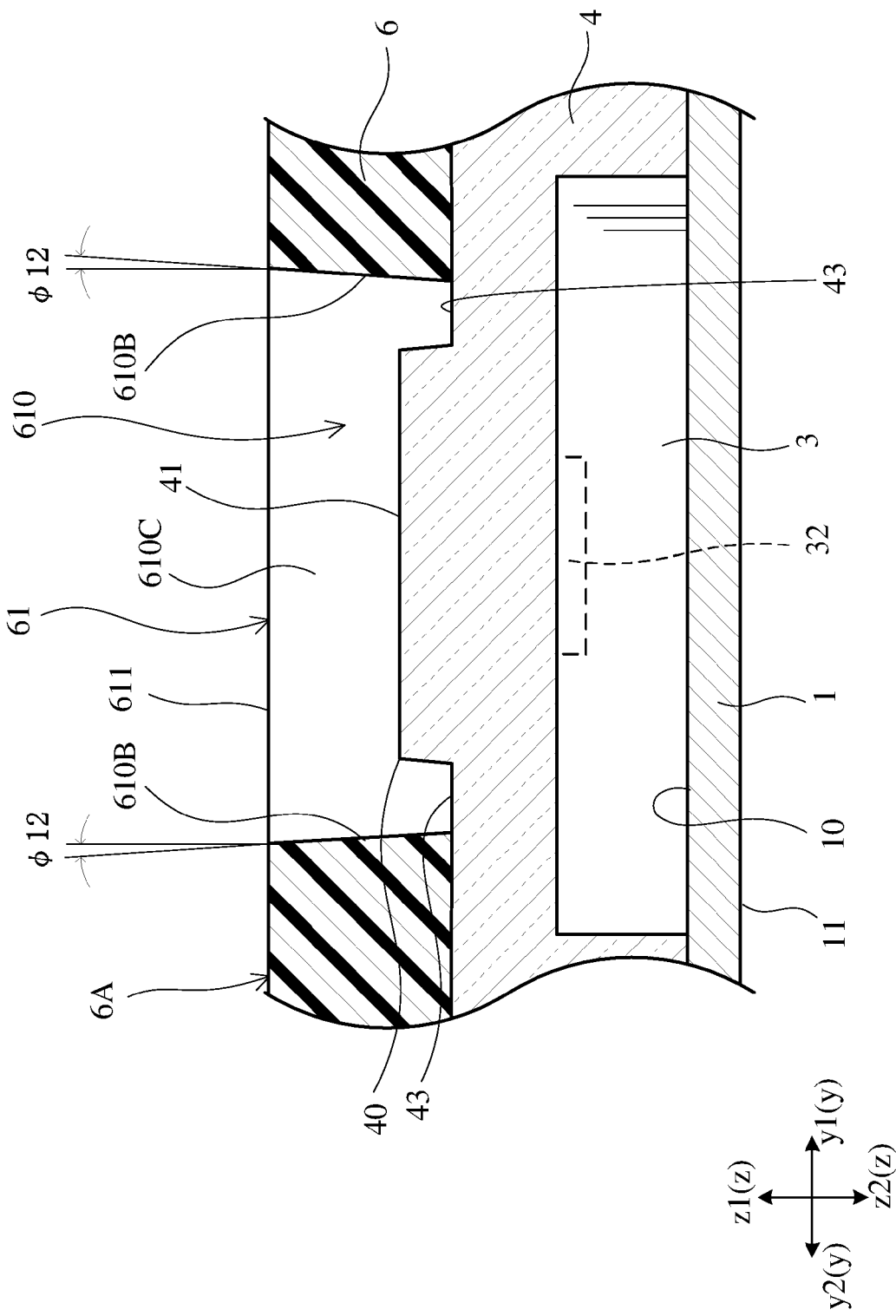
FIG. 7 is a sectional view taken along lines VII-VII in FIG. 5.
Figure 22:
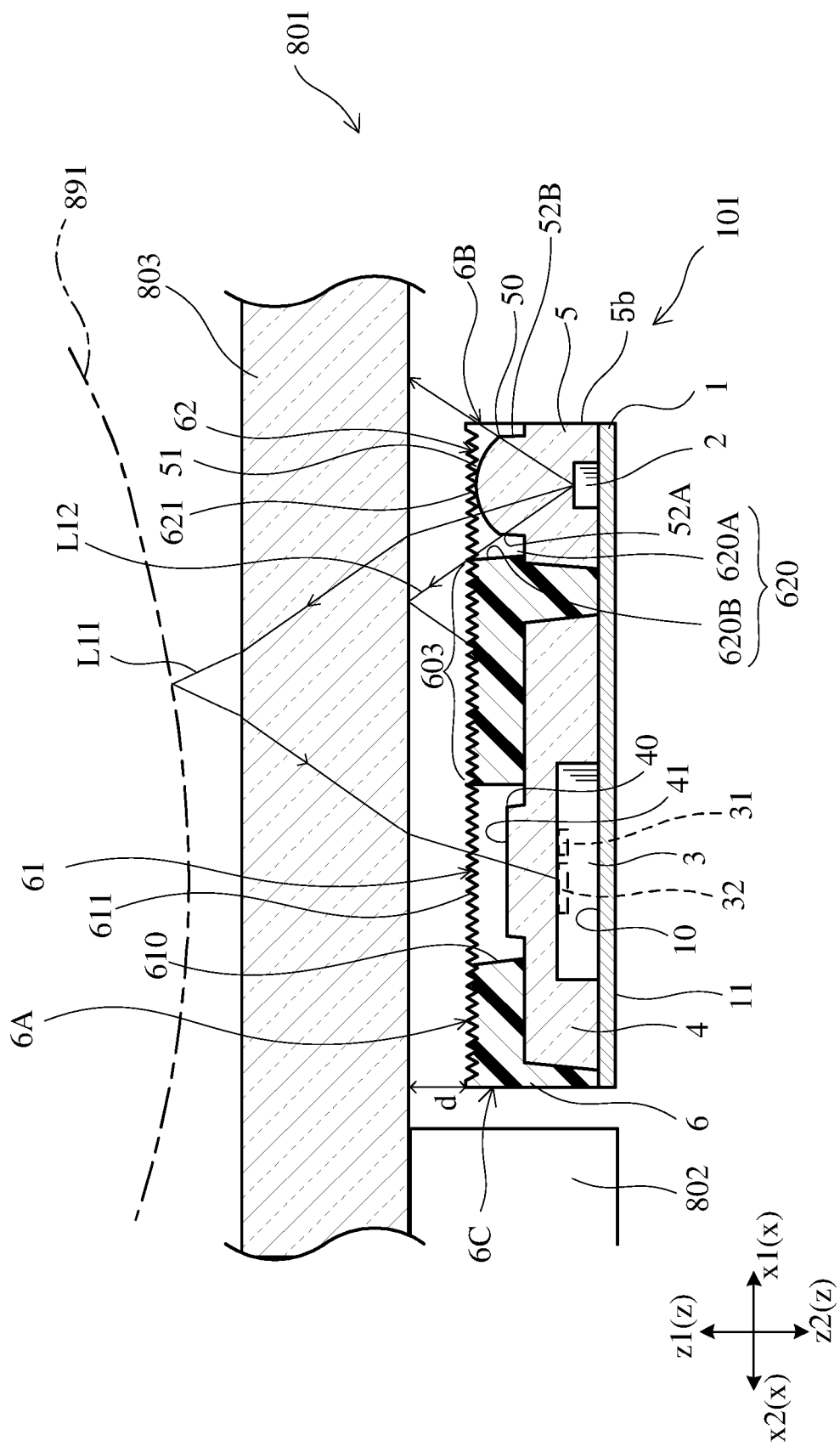
FIG. 22 is a sectional view of an electronic device according to the first embodiment.

FIG. 1 is a perspective view of the optical apparatus 101 shown in FIG. 22. FIG. 2 is a sectional view taken along lines II-II in FIG. 1. FIG. 3 is a sectional view taken along lines III-III in FIG. 1. FIG. 4 is a sectional view taken along lines IV-IV in FIG. 1. FIG. 5 is a plan view of the optical apparatus shown in FIG. 1. FIG. 6 is a sectional view taken along lines VI-VI in FIG. 5. FIG. 7 is a sectional view taken along lines VII-VII in FIG. 5.

The optical apparatus 101 shown in these figures is a proximity sensor and includes a substrate 1, a light-emitting element 2, a light-receiving element 3, light-transmitting resins 4, 5, a light-shielding resin 6, wires 78, 79 (see FIG. 2, not shown in FIGS. 3, 4, 6, 7 and so on), and a wiring pattern 8 (see FIG. 2, not shown in FIGS. 3, 4, 6, 7 and so on).

For instance, the substrate 1 is made of glass epoxy resin. The substrate 1 has a mount surface 10 and a back surface 11. The mount surface 10 and the back surface 11 face away from each other. Both of the mount surface 10 and the back surface 11 have a length in the direction x and a width in the direction y. The thickness direction of the substrate 1 corresponds to the direction z. A wiring pattern 8 is formed on the mount surface 10 and the back surface 11. The wiring pattern 8 is described later.

The light-emitting element 2 is an LED chip. The light-emitting element 2 emits infrared light. The light-emitting element 2 is arranged on the mount surface 10 of the substrate 1. The light-emitting element 2 is electrically connected to the wiring pattern 8 on the mount surface 10 via a wire 78. As viewed in x-y plane (viewed in the direction z), the light-emitting element 2 is in the form of a rectangle having a size of 0.35×0.35 mm. The light-emitting element 2 includes a cathode electrode 21 and an anode electrode 22. In this embodiment, the anode electrode 22 is bonded to the wiring pattern 8. To the cathode electrode 21 is bonded the wire 78.

The light-receiving element 3 converts the received infrared light into an electric signal corresponding to the received amount of infrared light. The light-receiving element 3 is electrically connected to the wiring pattern 8 on the mount surface 10 via the wire 79. As viewed in x-y plane, the light-receiving element 3 is in the form of a rectangle having a size of 1.6×1.8 mm. Further, in this embodiment, the light-receiving element 3 converts the received visible light into an electric signal corresponding to the received amount of visible light.

Figure 8:
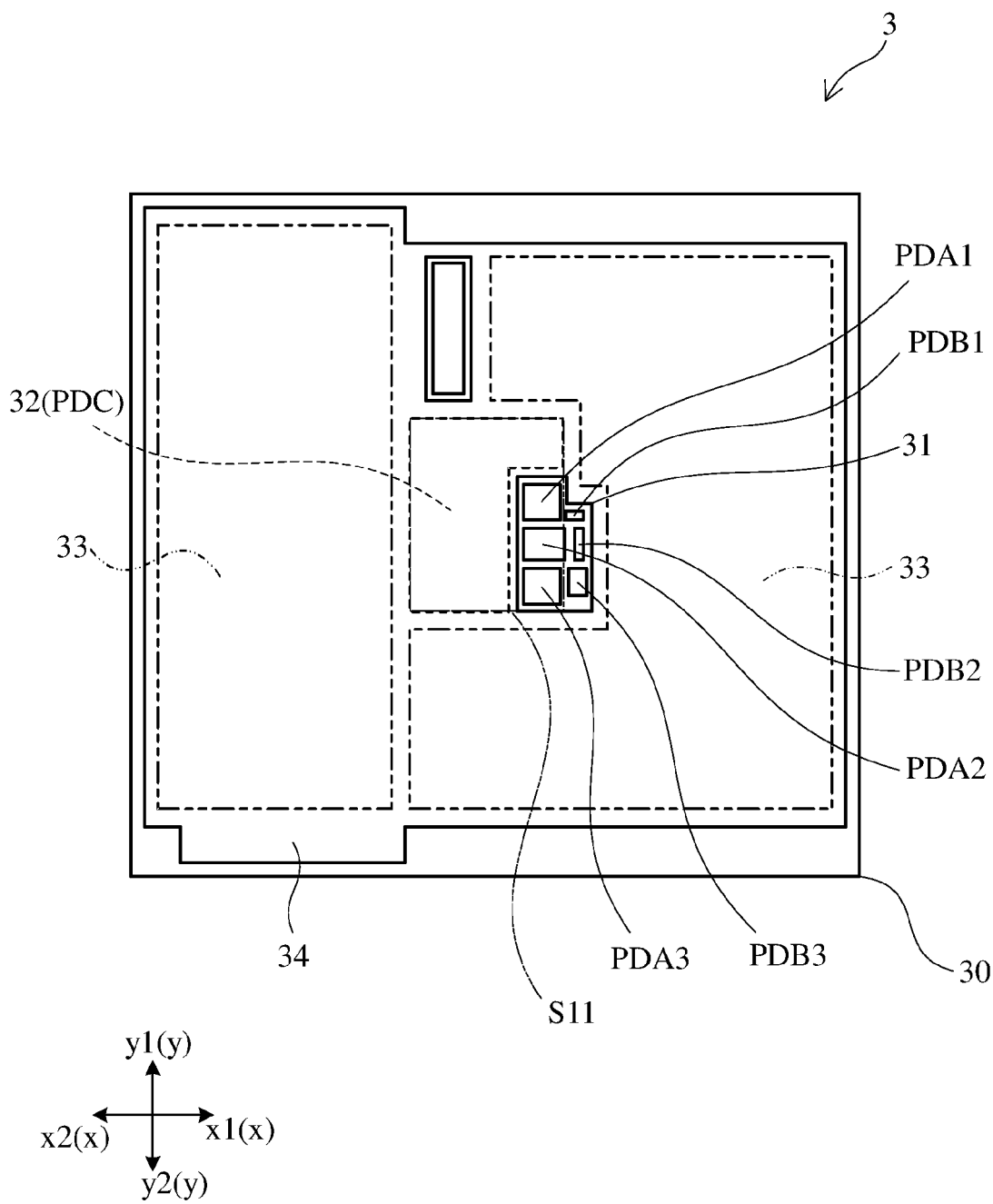
FIG. 8 is a plan view of a light-receiving element of the optical apparatus shown in FIG. 1.

FIG. 8 is a plan view of the light-receiving element 3 of the optical apparatus 101 shown in FIG. 1. As shown in the figure, the light-receiving element 3 includes a semiconductor substrate 30, a visible light detecting portion 31, an infrared light detecting portion 32, a functional element portion 33 and a multi-layered optical film 34.

For instance, the semiconductor substrate 30 is a silicon substrate. The visible light detecting portion 31, the infrared light detecting portion 32 and the functional element portion 33 are provided on the semiconductor substrate 30. The visible light detecting portion 31 and the infrared light detecting portion 32 are at the center of the semiconductor substrate 30 as viewed in x-y plane. As shown in FIG. 8, in the light-receiving element 3, part of the visible light detecting portion 31 is positioned inside the smallest rectangular region S11 enclosing the infrared light detecting portion 32 as viewed in x-y plane. In other words, the infrared light detecting portion 32 is L-shaped as viewed in x-y plane, and the visible light detecting portion 31 makes an inroad into the infrared light detecting portion 32 (makes an inroad into a portion within the smallest rectangular region S11 and out of the infrared light detecting portion 32).

The functional element portion 33 is on the outer side of the visible light detecting portion 31 and the infrared light detecting portion 32. A plurality of wiring layers (now shown) are formed on the semiconductor substrate 30. Of the wiring layers of the semiconductor substrate 30, the portion overlapping the infrared light detecting portion 32 and the functional element portion 33 is covered by the multi-layered optical film 34. The multi-layered optical film 34 has an opening in the portion overlapping the visible light detecting portion 31. Thus, of the wiring layers of the semiconductor substrate 30, the portion overlapping the visible light detecting portion 31 is not covered by the multi-layered optical film 34 but exposed from the multi-layered optical film 34.

The visible light detecting portion 31 and the semiconductor substrate 30 provide a plurality of photodiodes PDA1, PDA2, PDA3, PDB1, PDB2 and PDB3. Each of the photodiodes PDA1, PDA2 and PDA3 is formed by providing a pn junction surface (light-receiving surface) at a predetermined depth position from the surface of the semiconductor substrate 30 in the thickness direction of the semiconductor substrate 30. Each of the photodiodes PDA1, PDA2, PDA3 outputs a photocurrent corresponding to the received amount of visible light and infrared light by photoelectric conversion.

Each of the photodiodes PDB1, PDB2 and PDB3 is formed by providing a pn junction surface (light-receiving surface) at a predetermined depth position from the surface of the semiconductor substrate 30 in the thickness direction of the semiconductor substrate 30. The depth positions of the photodiodes PDB1, PDB2, PDB3 from the surface of the semiconductor substrate 30 are deeper than the depth positions of the photodiodes PDA1, PDA2, PDA3 from the surface of the semiconductor substrate 30. It is known that the spectral sensitivity characteristics of a photodiode generally depend on the depth of the pn junction surface (light-receiving surface) from the surface of the semiconductor substrate. As the position of the pn junction surface (light-receiving surface) from the surface of the semiconductor substrate becomes deeper, the peak of the spectral sensitivity characteristics shifts toward a longer wavelength side. Thus, the spectral sensitivity characteristics of the photodiodes PDB1, PDB2 and PDB3 are shifted toward a longer wavelength side as compared with the spectral sensitivity characteristics of the photodiodes PDA1, PDA2, PDA3. Therefore, each of the photodiodes PDB1, PDB2 and PDB3 outputs, by photoelectric conversion, a photocurrent corresponding to the received amount of infrared light only. The area of each photodiode PDB1, PDB2, PDB3 as viewed in x-y plane is smaller than that of each photodiode PDA1, PDA2, PDA3 as viewed in x-y plane.

Figure 9A:
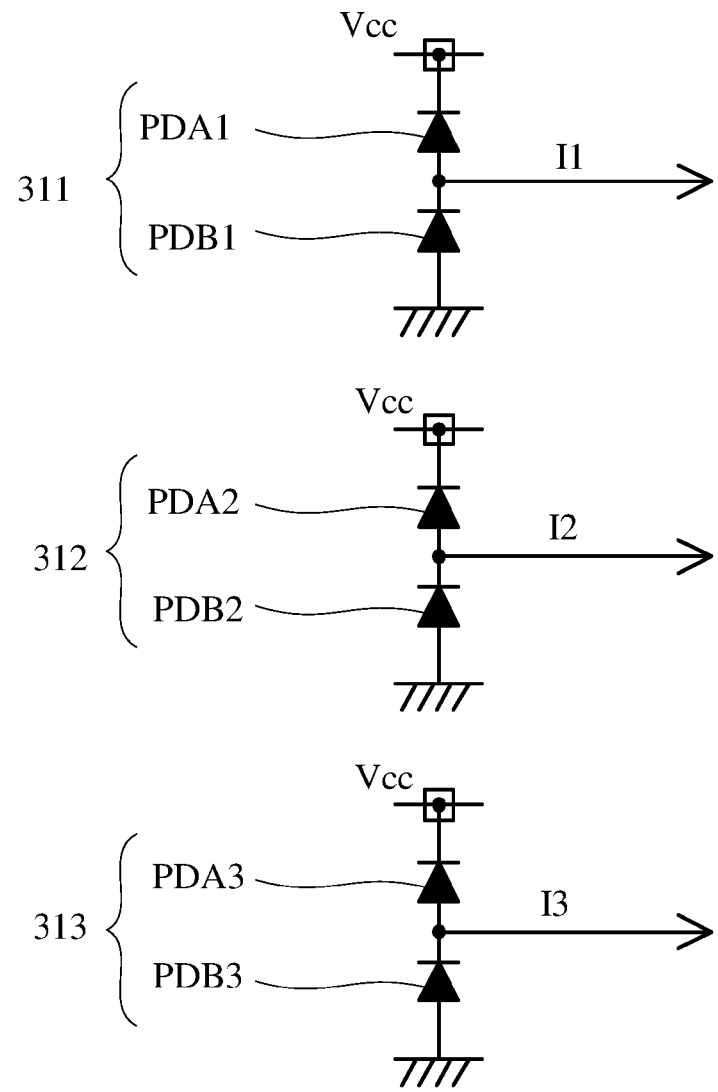
FIG. 9A is an equivalent circuit diagram schematically showing a visible light detecting portion of the light-receiving element shown in FIG. 8.

FIG. 9A is an equivalent circuit diagram schematically showing the visible light detecting portion 31 of the light-receiving element 3 shown in FIG. 8. As shown in FIG. 9A, the photodiodes PDA1 and PDB1 form a pair to provide a first light-receiving unit 311. The photodiodes PDA1 and PDB1 of the first light-receiving unit 311 are connected in series between the power supply potential Vcc and the ground potential. In the first light-receiving unit 311, current I1 is outputted from between the photodiodes PDA1 and PDB1. The current I1 is the difference obtained by subtracting the photocurrent from the photodiode PDB1, which contains an infrared light component, from the photocurrent from the photodiode PDA1, which contains a visible light component and an infrared light component. That is, the first light-receiving unit 311 outputs the current I1 corresponding to the difference between the amount of light received by the photodiode PDA1 and the amount of light received by the photodiode PDB1.

Similarly, the photodiodes PDA2 and PDB2 form a pair to provide a second light-receiving unit 312. The photodiodes PDA2 and PDB2 of the second light-receiving unit 312 are connected in series between the power supply potential Vcc and the ground potential. The second light-receiving unit 312 outputs the current I2 corresponding to the difference between the amount of light received by the photodiode PDA2 and the amount of light received by the photodiode PDB2.

Similarly, the photodiodes PDA3 and PDB3 form a pair to provide a third light-receiving unit 313. The photodiodes PDA3 and PDB3 of the third light-receiving unit 313 are connected in series between the power supply potential Vcc and the ground potential. The third light-receiving unit 313 outputs the current I3 corresponding to the difference between the amount of light received by the photodiode PDA3 and the amount of light received by the photodiode PDB3.

As shown in FIG. 8, the area ratio of the light-receiving surface of the photodiode PDB1 to that of the photodiode PDA1 in the first light-receiving unit 311, the area ratio of the light-receiving surface of the photodiode PDB2 to that of the photodiode PDA2 in the second light-receiving unit 312, and the area ratio of the light-receiving surface of the photodiode PDB3 to that of the photodiode PDA3 in the third light-receiving unit 313 are different from each other. Though not described in detail, the area ratios of the light-receiving surfaces are made different from each other in order that a constant output can be obtained with respect to a given illuminance, regardless of the kind of the light source of the light that impinges on the visible light detecting portion 31. That is, in this embodiment, a constant output is obtained with respect to a given illuminance, regardless of whether the light source is a halogen lamp that produces light containing a large amount of infrared light component, an incandescent lamp that produces light containing a still larger amount of infrared light component, or a fluorescent lamp that produces light that does not contain a large amount of infrared light component.

Figure 9B:
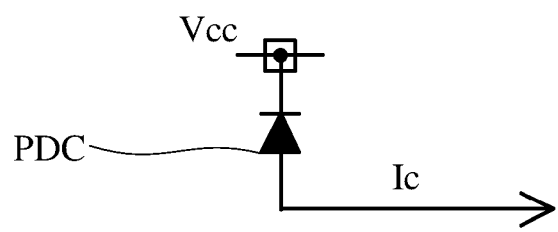
FIG. 9B is an equivalent circuit diagram schematically showing an infrared light detecting portion of the light-receiving element shown in FIG. 8.

The semiconductor substrate 30 and the infrared light detecting portion 32 provide a photodiode PDC. The photodiode PDC is formed by providing a pn junction surface (light-receiving surface) at a predetermined depth position from the surface of the semiconductor substrate 30 in the thickness direction of the semiconductor substrate 30. The depth position of the photodiode PDC from the surface of the semiconductor substrate 30 is almost the same as the depth position of the photodiodes PDB1, PDB2, PDB3 from the surface of the semiconductor substrate 30. Therefore, the photodiode PDC outputs, by photoelectric conversion, a photocurrent corresponding to the received amount of infrared light only. The area of the photodiode PDC as viewed in x-y plane is larger than the entire area of the visible light detecting portion 31 as viewed in x-y plane. FIG. 9B is an equivalent circuit diagram schematically showing the infrared light detecting portion 32 of the light-receiving element 3 shown in FIG. 8. As shown in the figure, the photodiode PDC is connected to the power supply potential Vcc. The photodiode PDC outputs a photocurrent Ic corresponding to the received amount of infrared light.

The functional element portion 33 performs computation with respect to an output from the visible light detecting portion 31 and an output from the infrared light detecting portion 32. The functional element portion 33 includes an analogue circuit and a digital circuit. The current I1 from the first light-receiving unit 311, the current I2 from the second light-receiving unit 312, the current I3 from the third light-receiving unit 313, and the photocurrent Ic from the photodiode PDC are inputted into the functional element portion 33. Based on the photocurrent Ic, the functional element portion 33 computes, as a digital value, the amount of infrared light received by the photodiode PDC. When the amount of infrared light received by the photodiode PDC exceeds a predetermined threshold, a proximity signal indicating that there is an object nearby is outputted to the outside. Further, based on the currents I1-I3, the functional element portion 33 computes, as a digital value, the amount of visible light received by the visible light detecting portion 31. The functional element portion 33 outputs to the outside an illuminance signal indicating the illuminance corresponding to the amount of visible light received by the visible light detecting portion 31.

The multi-layered optical film 34 is made of a resin that transmits only the light in the infrared wavelength range. As noted before, the multi-layered optical film 34 covers the infrared light detecting portion 32 and the functional element portion 33. Thus, the infrared light detecting portion 32 and the functional element portion 33 does not receive visible light but receive infrared light only. The multi-layered optical film 34 does not cover the visible light detecting portion 31. Thus, the visible light detecting portion 31 reliably receives visible light.

The light-transmitting resin 4 shown in FIGS. 1-3 and FIGS. 5-7 is a first light-transmitting resin and covers the light-receiving element 3 and the mount surface 10. The light-transmitting resin 4 is transparent and transmits light in the wavelength range from visible light to infrared light. For instance, the light-transmitting resin 4 is made of an epoxy resin. The light-transmitting resin 4 includes a flat surface 43 and a projection 40.

The flat surface 43 is planar and extends along a plane perpendicular to the direction z. The flat surface 43 is ring-shaped. The flat surface 43 faces the direction z1 side. The projection 40 is a first projection and elevated from the flat surface 43 toward the direction z1 side. As viewed in x-y plane, the outline of the projection 40 is in the form of a circle that is e.g. 1 mm in diameter. As viewed in x-y plane, the projection 40 is surrounded by the flat surface 43.

The projection 40 includes a light-incident surface 41. The light-incident surface 41 faces the direction z1 side. In this embodiment, the light-incident surface 41 is planar and extends along a plane perpendicular to the direction z. Unlike this embodiment, the light-incident surface 41 may be a convex surface bulging toward the direction z1 side. As viewed in x-y plane, the light-incident surface 41 overlaps the light-receiving element 3. More specifically, as viewed in x-y plane, the light-incident surface 41 overlaps the infrared light detecting portion 32 and the visible light detecting portion 31 of the light-receiving element 3. The arrangement that the light-incident surface 41 overlaps the infrared light detecting portion 32 as viewed in x-y plane advantageously causes the light traveling in the direction z2 to reliably reach the infrared light detecting portion 32. However, unlike this embodiment, as viewed in x-y plane, the light-incident surface 41 may not overlap the visible light detecting portion 31 and the flat surface 43 may overlap the visible light detecting portion 31.

The light-transmitting resin 5 shown in FIGS. 1, 2, 4 and 5 is a second light-transmitting resin and covers the light-emitting element 2 and the mount surface 10. The light-transmitting resin 5 is transparent and transmits light in the wavelength range from visible light to infrared light. For instance, the light-transmitting resin 5 is made of an epoxy resin. The light-transmitting resin 5 includes a flat surface 53 and a projection 50.

The flat surface 53 is planar and extends along a plane perpendicular to the direction z. The flat surface 53 faces the direction z1 side. The projection 50 is a second projection and elevated from the flat surface 53 toward the direction z1 side. As viewed in x-y plane, the projection 50 is surrounded by the flat surface 53.

The projection 50 includes a light-emitting surface 51 and a pair of cut surfaces 52A and 52B. The light-emitting surface 51 faces the direction z1 side. The light-emitting surface 51 is a convex surface bulging toward the direction z1 side. The light-emitting surface 51 is made convex toward the direction z1 side in order that a large amount of light from the light-emitting element 2 travels toward the direction z1 side. As viewed in x-y plane, the light-emitting surface 51 overlaps the light-emitting element 2. The light-emitting surface 51 has an edge which is arcuate as viewed in x-y plane at each of its two ends spaced apart from each other in the direction y. The maximum diameter of the light-emitting surface 51, which is the distance between these two edges, is e.g. 0.44 mm. Each cut surface 52A, 52B is planar and extends along the y-z plane. The cut surface 52A faces the direction x2 side, whereas the cut surface 52B faces the direction x1 side. Each of the cut surfaces 52A and 52B is connected to the light-emitting surface 51 at an end in the direction x. As shown in FIG. 5, the distance between the cut surface 52A and the light-receiving element 3 is smaller than the distance between the cut surface 52B and the light-receiving element 3. That is, the cut surface 52B is positioned further away from the light-receiving element 3 than the cut surface 52A is.

As shown in FIG. 2, the light-shielding resin 6 covers the light-transmitting resins 4, 5 and the mount surface 10. The light-shielding resin 6 transmits neither visible light nor infrared light. For instance, the light-shielding resin 6 is made of an epoxy resin. The light-shielding resin 6 is positioned between the light-transmitting resin 4 and the light-transmitting resin 5. Between the light-transmitting resin 4 and the light-transmitting resin 5, the light-shielding resin 6 is indirect contact with the mount surface 10 throughout the entire dimension of the mount surface 10 in the direction y. With this arrangement, infrared light emitted from the light-emitting element 2 is prevented from directly reaching the light-receiving element 3 by passing through the inside of the optical apparatus 101.

As shown in FIGS. 1 and 5, the light-shielding resin 6 includes a first surface 6A, a pair of second surfaces 6B and 6C, and a pair of third surfaces 6D and 6E.

The first surface 6A faces the direction z1 side. For instance, the first surface 6A is 5 mm in length along the direction x and 2.5 mm in width along the direction y. As shown in FIGS. 1 and 2, the first surface 6A includes a surface 601 (second irregular surface), a surface 602, a surface 603 (first irregular surface) and a surface 604. In this embodiment, the surfaces 601-604 have the same sectional shape. Detailed description is given below.

As shown in FIGS. 1 and 2, the surface 601 of the first surface 6A is a portion that is on the direction x2 side of the first opening 61, which will be described later. At the surface 601, the light-shielding resin 6 has a plurality of grooves 641 (not shown in FIG. 5). The grooves 641 extend in one direction. In this embodiment, the grooves 641 extend in the direction y. The surface 601 includes first groove surfaces 651a and second groove surfaces 651b. Each of the first groove surfaces and each of the second groove surfaces define one of the grooves 641 and face each other across the bottom of the groove. In each of the grooves 641, the first groove surface 651a is on the direction x2 side, whereas the second groove surface 651b is on the direction x1 side. That is, in each of the grooves 641, the first groove surface 651a is further away from the first opening 61 than the second groove surface 651b is. Both of the first groove surface 651a and the second groove surface 651b extend along the direction y and are planar.

Each first groove surface 651a is an inclined surface that proceeds toward the direction z2 side as proceeding toward the direction x1 side. The first groove surface 651a is inclined at a first angle θ11 with respect to the direction x. Each second groove surface 651b is an inclined surface that proceeds toward the direction z2 side as proceeding toward the direction x2 side. The second groove surface 651b is inclined at a second angle θ12 with respect to the direction x. Preferably, each of the first angle θ11 and the second angle θ12 is 50-70°. In this embodiment, the first angle θ11 and the second angle θ12 are the same.

As shown in FIGS. 1 and 2, the surface 602 of the first surface 6A is a portion that overlaps the first opening 61, which will be described later, in the direction x. At the surface 602, the light-shielding resin 6 has a plurality of grooves 642 (not shown in FIG. 5). The grooves 642 extend in one direction. In this embodiment, the grooves 642 extend in the direction y. The surface 602 includes first groove surfaces 652a and second groove surfaces 652b. Each of the first groove surfaces and each of the second groove surfaces define one of the grooves 642 and face each other across the bottom of the groove. In each of the grooves 642, the first groove surface 652a is on the direction x2 side, whereas the second groove surface 652b is on the direction x1 side. Both of the first groove surface 652a and the second groove surface 652b extend along the direction y and are planar.

Each first groove surface 652a is an inclined surface that proceeds toward the direction z2 side as proceeding toward the direction x1 side. The first groove surface 652a is inclined at a first angle θ21 with respect to the direction x. Each second groove surface 652b is an inclined surface that proceeds toward the direction z2 side as proceeding toward the direction x2 side. The second groove surface 652b is inclined at a second angle θ22 with respect to the direction x. Preferably, each of the first angle θ21 and the second angle θ22 is 50-70°. In this embodiment, the first angle θ21 and the second angle θ22 are the same.

As shown in FIGS. 1 and 2, the surface 603 of the first surface 6A is a portion that is on the direction x1 side of the first opening 61, which will be described later. Further, the surface 603 is on the direction x2 side of the second opening 62, which will be described later. That is, the surface 603 is positioned between the first opening 61 and the second opening 62. At the surface 603, the light-shielding resin 6 has a plurality of grooves 643 (not shown in FIG. 5). The grooves 643 extend in one direction. In this embodiment, the grooves 643 extend in the direction y. The surface 603 includes first groove surfaces 653a and second groove surfaces 653b. Each of the first groove surfaces and each of the second groove surfaces define one of the grooves 643 and face each other across the bottom of the groove. In each of the grooves 643, the first groove surface 653a is on the direction x2 side, whereas the second groove surface 653b is on the direction x1 side. That is, in each of the grooves 643, the second groove surface 653b is further away from the first opening 61 than the first groove surface 653a is. Both of the first groove surface 653a and the second groove surface 653b extend along the direction y and are planar.

Each first groove surface 653a is an inclined surface that proceeds toward the direction z2 side as proceeding toward the direction x1 side. The first groove surface 653a is inclined at a first angle θ31 with respect to the direction x. Each second groove surface 653b is an inclined surface that proceeds toward the direction z2 side as proceeding toward the direction x2 side. The second groove surface 653b is inclined at a second angle θ32 with respect to the direction x. Preferably, each of the first angle θ31 and the second angle θ32 is 50-70°. In this embodiment, the first angle θ31 and the second angle θ32 are the same.

As shown in FIGS. 1 and 2, the surface 604 of the first surface 6A is a portion that overlaps the second opening 62, which will be described later, in the direction x. At the surface 604, the light-shielding resin 6 has a plurality of grooves 644 (not shown in FIG. 5). The grooves 644 extend in one direction. In this embodiment, the grooves 644 extend in the direction y. The surface 604 includes first groove surfaces 654a and second groove surfaces 654b. Each of the first groove surfaces and each of the second groove surfaces define one of the grooves 644 and face each other across the bottom of the groove. In each of the grooves 644, the first groove surface 654a is on the direction x2 side, whereas the second groove surface 654b is on the direction x1 side. Both of the first groove surface 654a and the second groove surface 654b extend along the direction y and are planar.

Each first groove surface 654a is an inclined surface that proceeds toward the direction z2 side as proceeding toward the direction x1 side. The first groove surface 654a is inclined at a first angle θ41 with respect to the direction x. Each second groove surface 654b is an inclined surface that proceeds toward the direction z2 side as proceeding toward the direction x2 side. The second groove surface 654b is inclined at a second angle θ42 with respect to the direction x. Preferably, each of the first angle θ41 and the second angle θ42 is 50-70°. In this embodiment, the first angle θ41 and the second angle θ42 are the same.

Unlike this embodiment, the surfaces 601-604 may not be the above-described irregular surfaces, and all the surfaces 601-604 may be flat surfaces. Alternatively, of the first surface 6A, only the surface 603 may be an irregular surface, whereas surfaces other than the surface 603, i.e., the surfaces 601, 602 and 604 may be flat surfaces.

The second surface 6B faces the direction x1 side, whereas the second surface 6C faces the direction x2 side. At the second surface 6B, the light-transmitting resin 5 is exposed. That is, the light-transmitting resin 5 has an exposed surface 5b that is flush with the second surface 6B. The third surface 6D faces the direction y2 side, whereas the third surface 6E faces the direction y1 side. Except the first surface 6A, all the paired second surfaces 6B, 6C and the paired third surfaces 6D, 6E are flat surfaces.

As shown in FIGS. 1 and 2, the first opening 61 and the second opening 62 are provided in the light-shielding resin 6. Both of the first opening 61 and the second opening 62 are formed in the first surface 6A. The depth direction of the first opening 61 and the depth direction of the second opening 62 correspond to the direction z. For instance, the depth of the first opening 61 and the second opening 62 is 0.42 mm. For instance, the maximum inner diameter of the first opening 61 is 1.3 mm. For instance, the maximum inner diameter of the second opening 62 along the direction y is 0.59 mm.

The light-transmitting resin 4 is exposed through the first opening 61. More specifically, the light-incident surface 41 and the flat surface 43 of the light-transmitting resin 4 are exposed through the first opening 61. The projection 40 of the light-transmitting resin 4 is received in the first opening 61.

As shown in FIG. 5, the light-shielding resin 6 includes an inner circumferential wall 610 defining the first opening 61. As viewed in x-y plane, the inner circumferential wall 610 is generally circular. The projection 40 is spaced apart from the inner circumferential wall 610. The inner circumferential wall 610 is an inclined surface that proceeds toward the center of the first opening 61 as proceeding toward the deeper side (direction z2 side) in the depth direction of the first opening 61. The inclination angle of the inner circumferential wall 610 with respect to the direction z becomes larger as proceeding further away from the light-emitting element 2 in the direction x.

More specifically, as shown in FIGS. 6 and 7, the inner circumferential wall 610 includes portions 610A, 610B and 610C. The portion 610A is closer to the light-emitting element 2 than the portions 610B and 610C are. On the other hand, the 610C is further away from the light-emitting element 2 than the portions 610A and 610B are. The portion 610A and the portion 610C face each other in the direction x. The portion 610B is between the portion 610A and the portion 610C in the direction x.

The portion 610A is a second portion. The inclination angle φ11 of the portion 610A with respect to the direction z is substantially 0°. In the portion between the portion 610A and the portion 610B, the inclination angle with respect to the direction z gradually becomes larger as proceeding from the portion 610A toward the portion 610B. The inclination angle φ12 of the portion 610B with respect to the direction z is larger than the inclination angle φ11. For instance, the inclination angle φ12 is 7.5°. In the portion between the portion 610B and the portion 610C, the inclination angle with respect to the direction z gradually becomes larger as proceeding from the portion 610B toward the portion 610C. The portion 610C is a first portion. The inclination angle φ13 of the portion 610C with respect to the direction z is larger than both of the inclination angles φ11 and φ12. For instance, the inclination angle φ13 is 15°. The inclination angle φ13 may be made larger than 15°, in accordance with the depth or inner diameter of the first opening 61.

As shown in FIGS. 1-3, the inner circumferential wall 610 has an edge 611 as a first edge. The edge 611 is circular. At the edge 611, the inner circumferential wall 610 and the first surface 6A are connected to each other. In the depth direction (direction z) of the first opening 61, the edge 611 is offset in the direction from the light-receiving element 3 toward the light-incident surface 41 (direction z1) from any portion of the light-transmitting resin 4 exposed through the first opening 61.

The light-transmitting resin 5 is exposed through the second opening 62. More specifically, the light-emitting surface 51 and the flat surface 53 of the light-transmitting resin 5 are exposed through the second opening 62. The projection 50 of the light-transmitting resin 5 is received in the second opening 62.

As shown in FIG. 5, the light-shielding resin 6 includes an inner circumferential wall 620 defining the second opening 62. The projection 50 is spaced apart from the inner circumferential wall 620. The inner circumferential wall 620 is an inclined surface that proceeds toward the center of the second opening 62 as proceeding toward the deeper side (direction z2 side) in the depth direction of the second opening 62. The inclination angle of the inner circumferential wall 620 with respect to the depth direction is substantially constant throughout the entire circumference.

The inner circumferential wall 620 includes portions 620A and 620B. As viewed in x-y plane, the portion 610A is arcuate and along the outermost edge of the light-emitting surface 51. The portion 620B is flat and faces the cut surface 52A. On the side further from the light-receiving element 3 in the direction x, the inner circumferential wall 620 does not have a wall surface and is open. Thus, the cut surface 52B is exposed from the light-shielding resin 6 in the direction x1.

As shown in FIG. 1, the inner circumferential wall 620 has an edge 621 as a second edge. Part of the edge 621 is circular. At the edge 621, the inner circumferential wall 620 and the first surface 6A are connected to each other. In the depth direction (direction z) of the second opening 62, the edge 621 is offset in the direction from the light-emitting element 2 toward the light-emitting surface 51 (direction z1) from any portion of the light-transmitting resin 5 exposed through the second opening 62.

Figure 10:
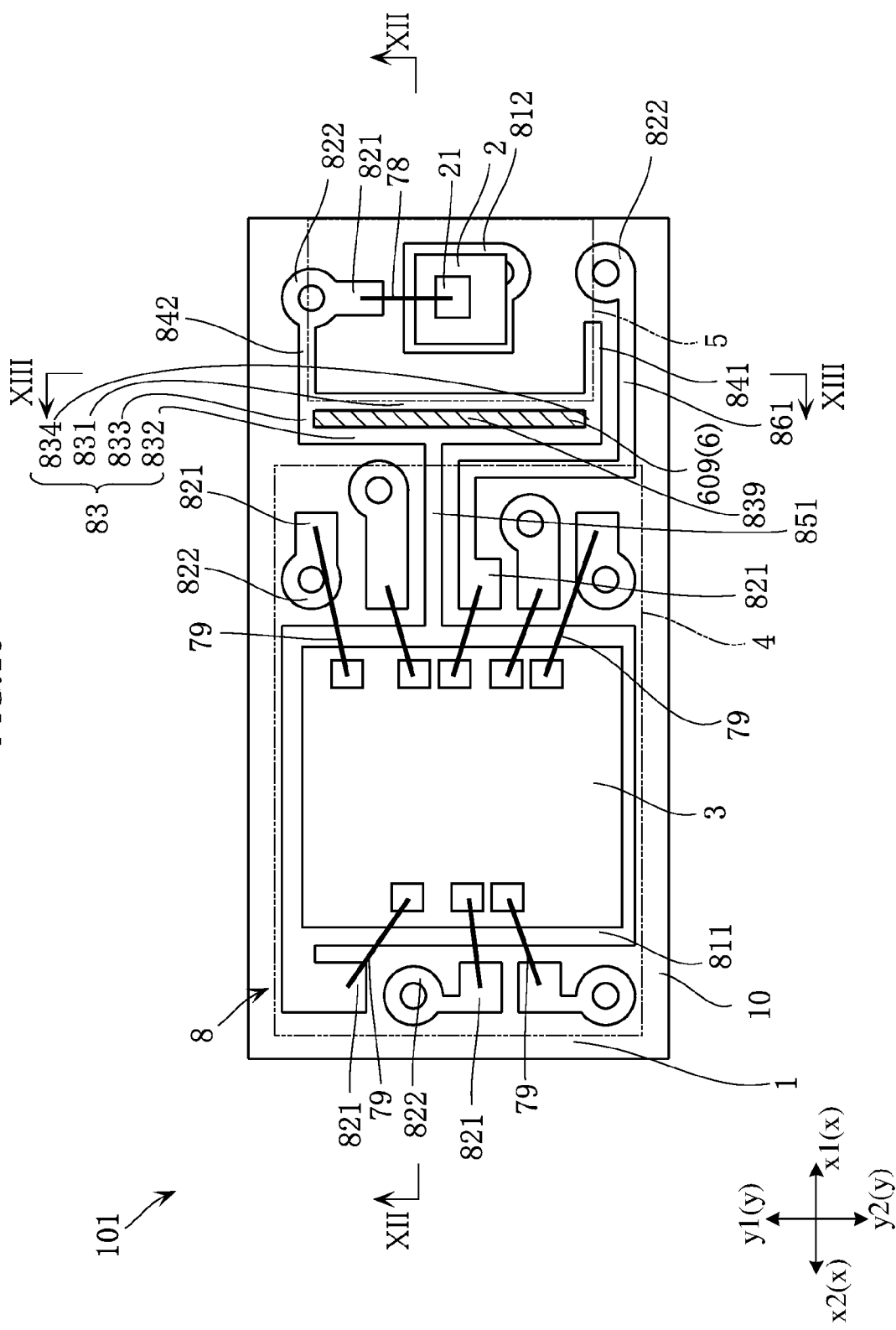
FIG. 10 is a plan view showing the state when the two light-transmitting resins and the light-shielding resin are omitted from FIG. 5.
Figure 11:
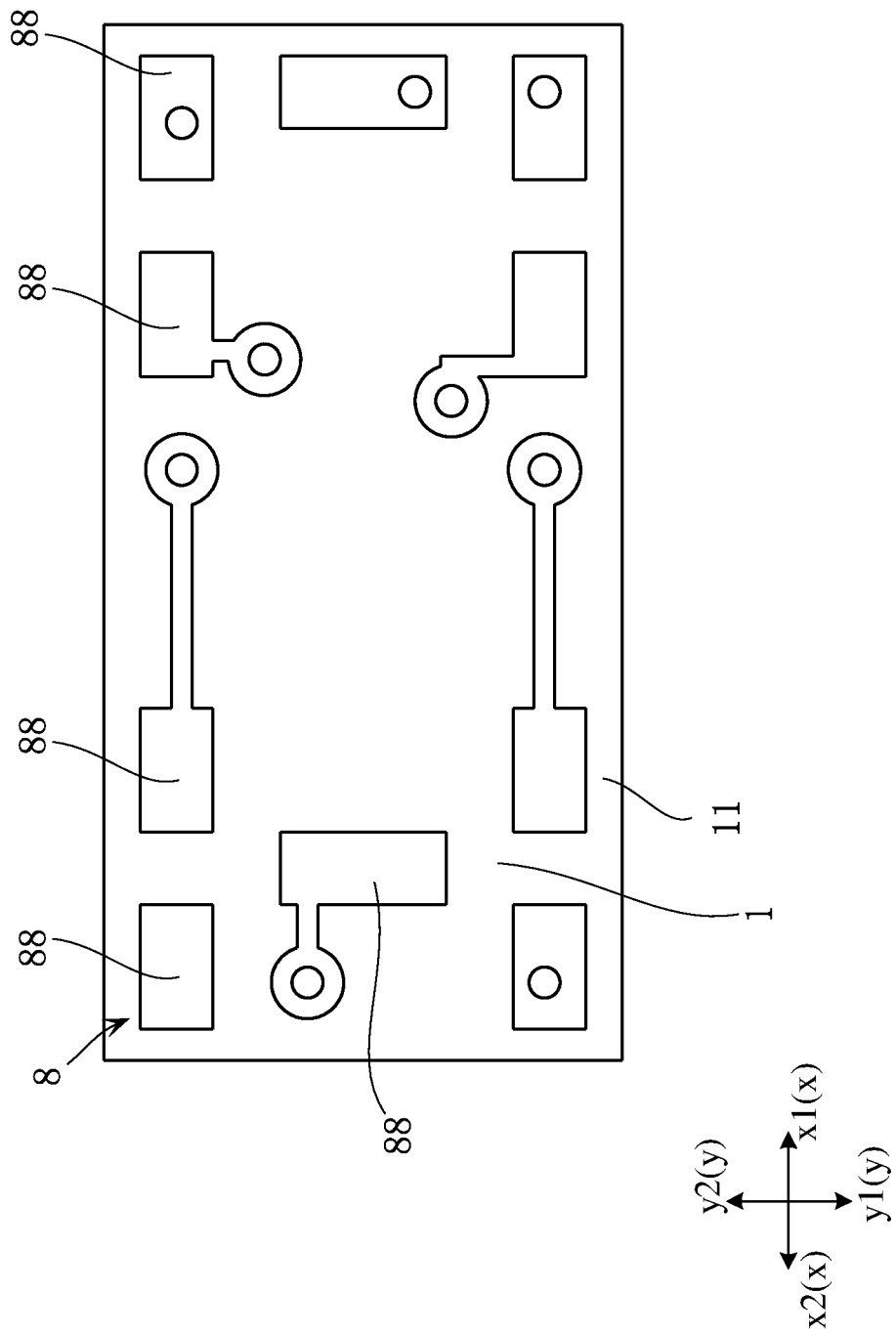
FIG. 11 is a bottom view of the optical apparatus according to the first embodiment.

FIG. 10 is a plan view showing the state when the light-transmitting resins 4, 5 and the light-shielding resin are omitted from FIG. 5. In this figure, the light-transmitting resins 4 and 5 are indicated by imaginary lines. FIG. 11 is a bottom view of the optical apparatus 101.

The wiring pattern 8 shown in FIGS. 2, 10 and 11 includes a light-receiving element pad 811, a light-emitting element pad 812, a plurality of wire bonding pads 821, a plurality of through-hole surrounding portions 822, a first light-blocking portion 83, a second light-blocking portion 841, a third light-blocking portion 842, a connecting portion 851, a connecting wiring 861, and mounting terminals 88.

The light-receiving element pad 811, the light-emitting element pad 812, the wire bonding pads 821, the through-hole surrounding portions 822, the first light-blocking portion 83, the second light-blocking portion 841, the third light-blocking portion 842, the connecting portion 851 and the connecting wiring 861 are provided on the mount surface 10 of the substrate 1. The mounting terminals 88 are provided on the back surface 11 of the substrate 1. That is, the mounting terminals 88 are provided on a side of the substrate 1 which is opposite from the side where the first light-blocking portion 83 is provided. For instance, the wiring pattern 8 is formed by electroplating. A resist layer (not shown) made of a resin may be provided on the wiring pattern 8.

On the light-receiving element pad 811 shown in FIG. 10 is mounted the light-emitting element 3. On the light-emitting element pad 812 is mounted the light-emitting element 2. As viewed in plan, the area of the light-emitting element pad 812 is smaller than that of the light-receiving element pad 811.

A wire 78 or a wire 79 is bonded to each of the wire bonding pads 821. Each wire bonding pad 821 is generally rectangular as viewed in plan. Each through-hole surrounding portion 822 is connected to a wire bonding pad 821.

Each through-hole surrounding portion 822 includes a generally circular portion as viewed in plan.

Figure 12:
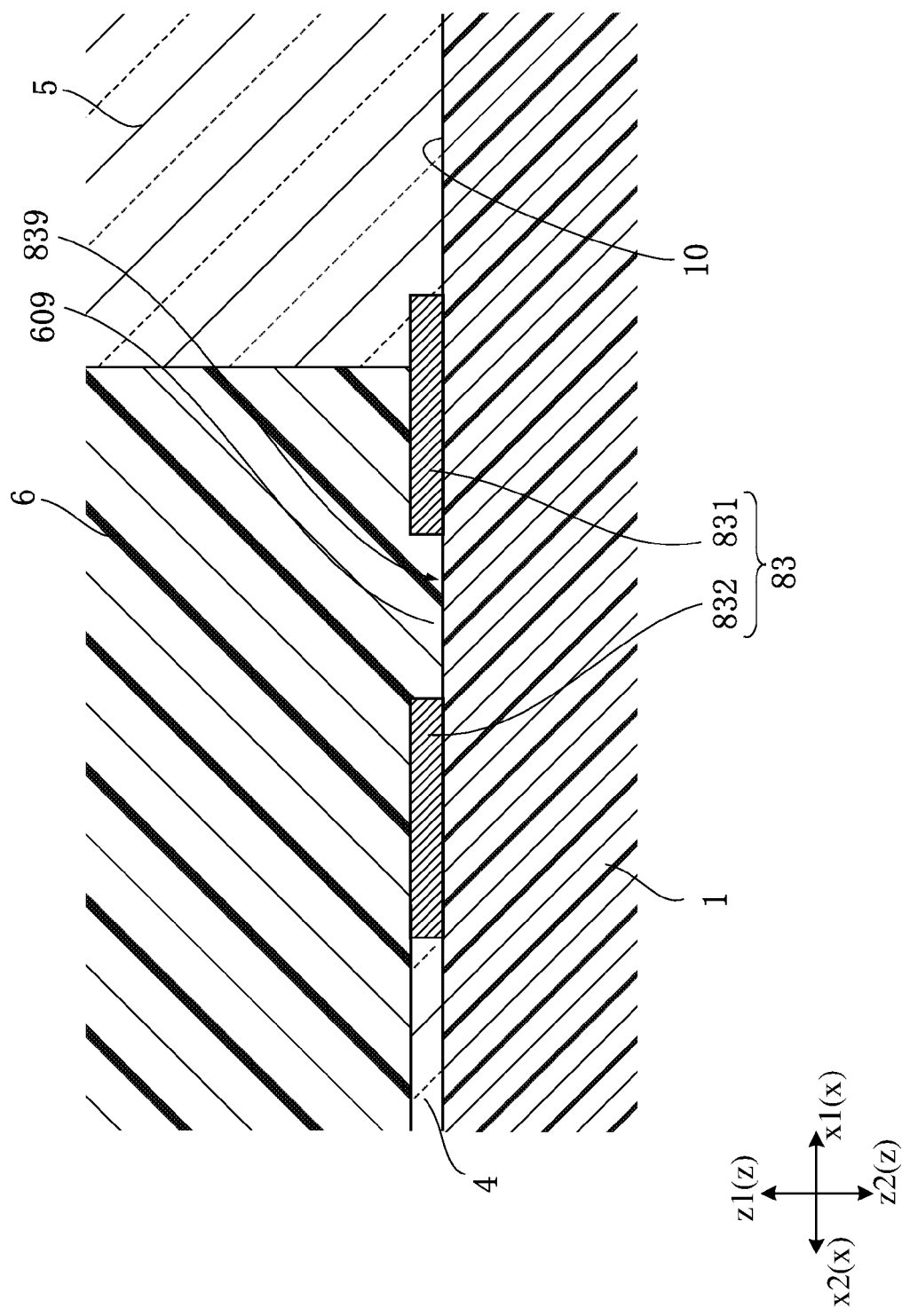
FIG. 12 is a schematic enlarged sectional view taken along lines XII-XII in FIG. 10.

FIG. 12 is a schematic enlarged sectional view taken along lines XII-XII in FIG. 10.

The first light-blocking portion 83 shown in FIGS. 10 and 12 is interposed between the light-shielding resin 6 and the substrate 1. As shown in FIG. 10, as viewed in x-y plane, the first light-blocking portion 83 is positioned between the light-receiving element 2 and the light-emitting element 3. The first light-blocking portion 83 extends across the light-emitting element 2 as viewed in the direction x. That is, the end of the first light-blocking portion 83 on the direction y1 side is positioned on the direction y1 side of the light-emitting element 2, and the end of the first light-blocking portion 83 on the direction y2 side is positioned on the direction y2 side of the light-emitting element 2. In this embodiment, the first light-blocking portion 83 extends along the direction y. However, the first light-blocking portion 83 may have a curved shape open toward the light-emitting element pad 812 as viewed in x-y plane. The first light-blocking portion 83 has an opening 839. In this embodiment, the opening 839 is elongated in the direction y. Part of the light-shielding resin 6 is received in the opening 839. The portion of the light-shielding resin 6 which is received in the opening 839 is in contact with the substrate 1. This portion of the light-shielding resin 6 which is received in the opening 839 is the bonding portion 609. In other words, the light-shielding resin 6 includes the bonding portion 609 bonded to the substrate 1. In FIG. 10, the bonding portion 609 is indicated by hatching.

The first light-blocking portion 83 includes a first portion 831, a second portion 832 and joint portions 833, 834. The first portion 831 and the second portion 832 are spaced apart from each other. In this embodiment, the first portion 831 and the second portion 832 are spaced apart from each other in the direction x as viewed in x-y plane. Each of the first portion 831 and the second portion 832 is in the form of a strip elongated in the direction y. The first portion 831 and the second portion 832 sandwich the bonding portion 609. The first portion 831 (i.e., the first light-blocking portion 83) may include a portion covered by the light-transmitting resin 5, as shown in FIG. 12. Unlike this embodiment, the first light-blocking portion 83 may not be covered by the light-transmitting resin 5. The joint portions 833 and 834 are spaced apart from each other, sandwiching the bonding portion 609 between them. Each joint portion 833, 834 is connected to the first portion 831 and the second portion 832. The first portion 831, the second portion 832 and the joint portions 833, 834 define the opening 839.

Figure 13:
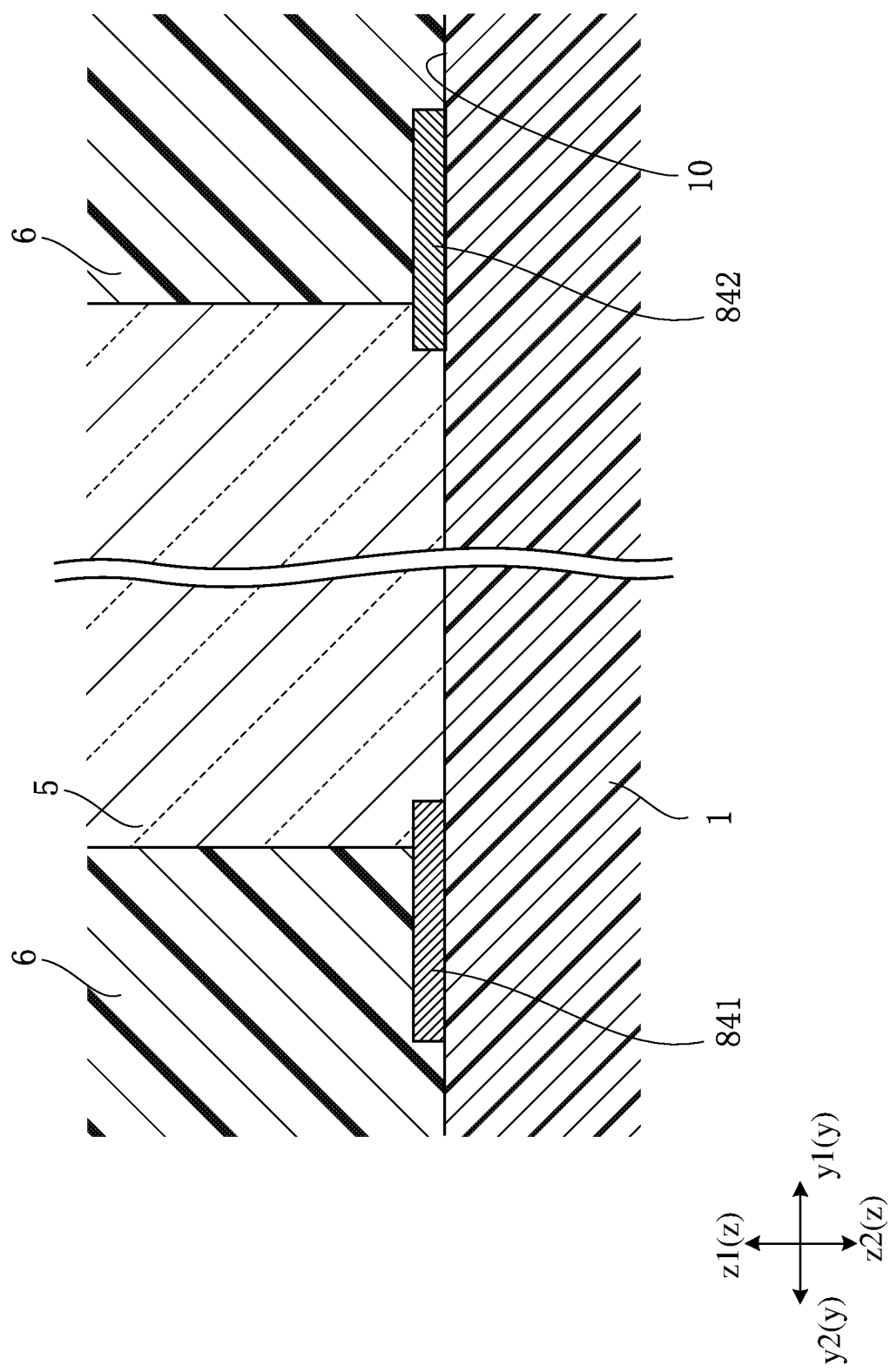
FIG. 13 a schematic enlarged sectional view taken along lines XIII-XIII in FIG. 10.

FIG. 13 is a schematic enlarged sectional view taken along lines XIII-XIII in FIG. 10.

The second light-blocking portion 841 shown in FIGS. 10 and 13 is interposed between the light-shielding resin 6 and the substrate 1. In this embodiment, the second light-blocking portion 841 is in the form of a strip elongated in the direction x. In the direction x, the second light-blocking portion 841 overlaps the light-emitting element pad 812. The second light-blocking portion 841 is on the direction y2 side of the light-emitting element pad 812. The second light-blocking portion 841 may include a portion covered by the light-transmitting resin 5, as shown in FIG. 13. Unlike this embodiment, the second light-blocking portion 841 may not be covered by the light-transmitting resin 5. Preferably, the second light-blocking portion 841 is connected to the first light-blocking portion 83.

The third light-blocking portion 842 shown in FIGS. 10 and 13 is interposed between the light-shielding resin 6 and the substrate 1. In this embodiment, the third light-blocking portion 842 is in the form of a strip elongated in the direction x. In the direction x, the third light-blocking portion 842 overlaps the light-emitting element pad 812. The third light-blocking portion 842 is on the direction y2 side of the light-emitting element pad 812. Thus, the light-emitting element pad 812 is between the third light-blocking portion 842 and the second light-blocking portion 841. The third light-blocking portion 842 may include a portion covered by the light-transmitting resin 5, as shown in FIG. 13. Unlike this embodiment, the third light-blocking portion 842 may not be covered by the light-transmitting resin 5. Preferably, the third light-blocking portion 842 is connected to the first light-blocking portion 83.

In this embodiment, the third light-blocking portion 842 is electrically connected to the wire bonding pad 821 on which the wire 78 is bonded. Thus, the first light-blocking portion 83, which is connected to the third light-blocking portion 842, is electrically connected to the wire bonding pad 821 on which the wire 78 is bonded. As noted before, the wire 78 is bonded to the cathode electrode 21 of the light-emitting element 2. Thus, both of the third light-blocking portion 842 and the first light-blocking portion 83 are electrically connected to the cathode electrode 21 of the light-emitting element 2. The first light-blocking portion 83 may be a ground electrode in a circuit including the light-emitting element 2.

As shown in FIG. 10, the connecting portion 851 is connected to the light-receiving element pad 811 and the first light-blocking portion 83. The connecting wiring 861 is connected to the wire bonding pad 821 on which the wire 79 bonded to the light-receiving element 3 is bonded, and to the through-hole surrounding portion 822. The connecting wiring 861 is insulated from the first light-blocking portion 83 and extends across the first light-blocking portion 83 in the direction x.

As shown in FIG. 11, each of the mounting terminals 88 is rectangular as viewed in x-y plane. Each mounting terminal 88 is electrically connected to a through-hole surrounding portion 822, the light-receiving element pad 811, the light-emitting element pad 812 or the like via a through-hole electrode 89 (only one is shown in FIG. 2, not shown in other figures) penetrating the substrate 1.

A method for making the optical apparatus 101 is briefly explained below.

Figure 14:
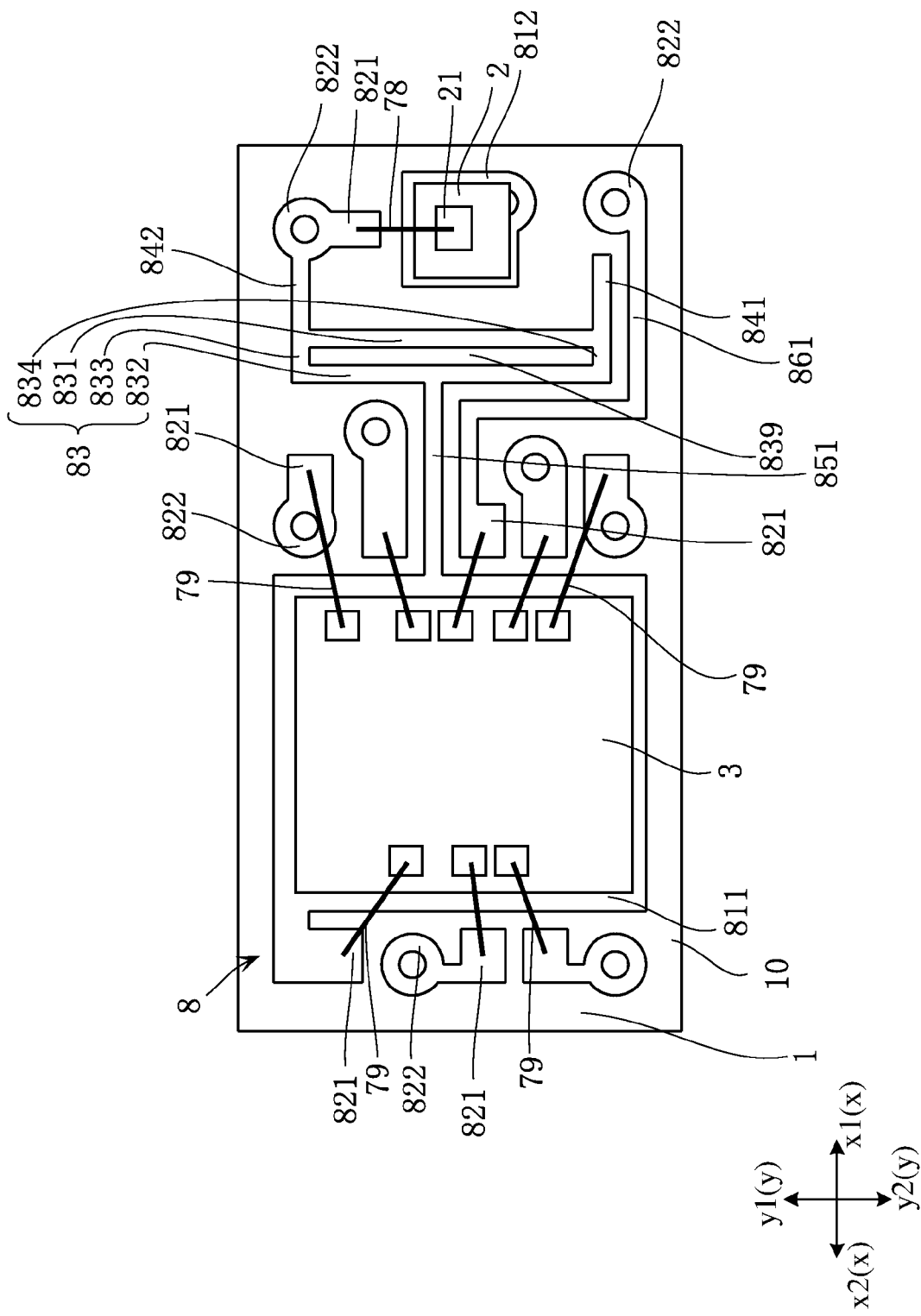
FIG. 14 is a plan view showing a step in a process of making the optical apparatus according to the first embodiment.

FIG. 14 is a plan view showing a step in a process of making the optical apparatus 101. First, as shown in FIG. 14, a substrate 1 is prepared. A wiring pattern 8 is formed on the substrate 1. Then, as shown in the figure, a light-emitting element 2 and a light-receiving element 3 are placed on the substrate 1. Then, a wire 78 is bonded to the light-emitting element 2 and wiring pattern 8, and wires 79 are bonded to the light-receiving elements 3 and the wiring pattern 8.

Figure 15:
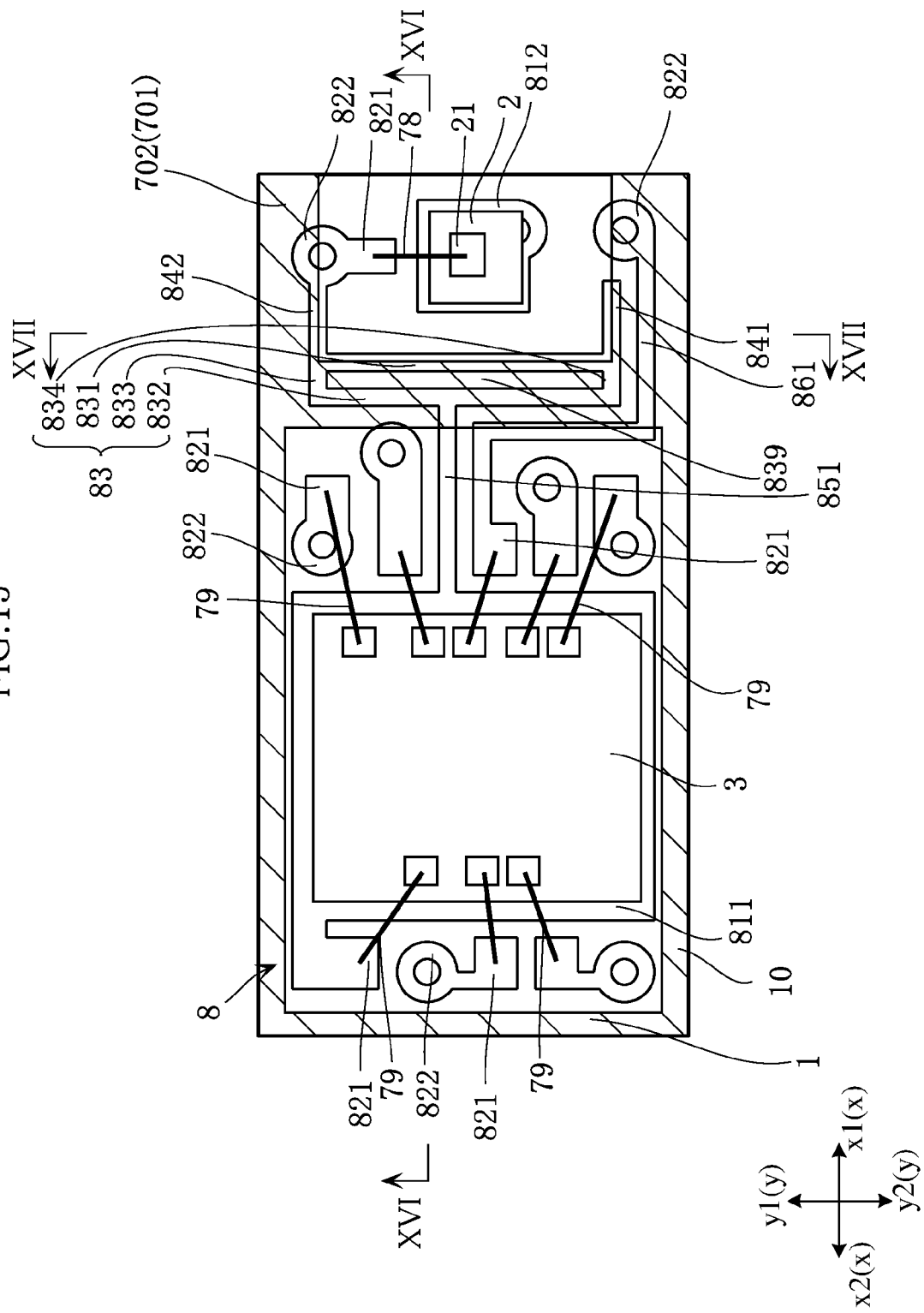
FIG. 15 is a plan view showing a step subsequent to FIG. 14.
Figure 16:
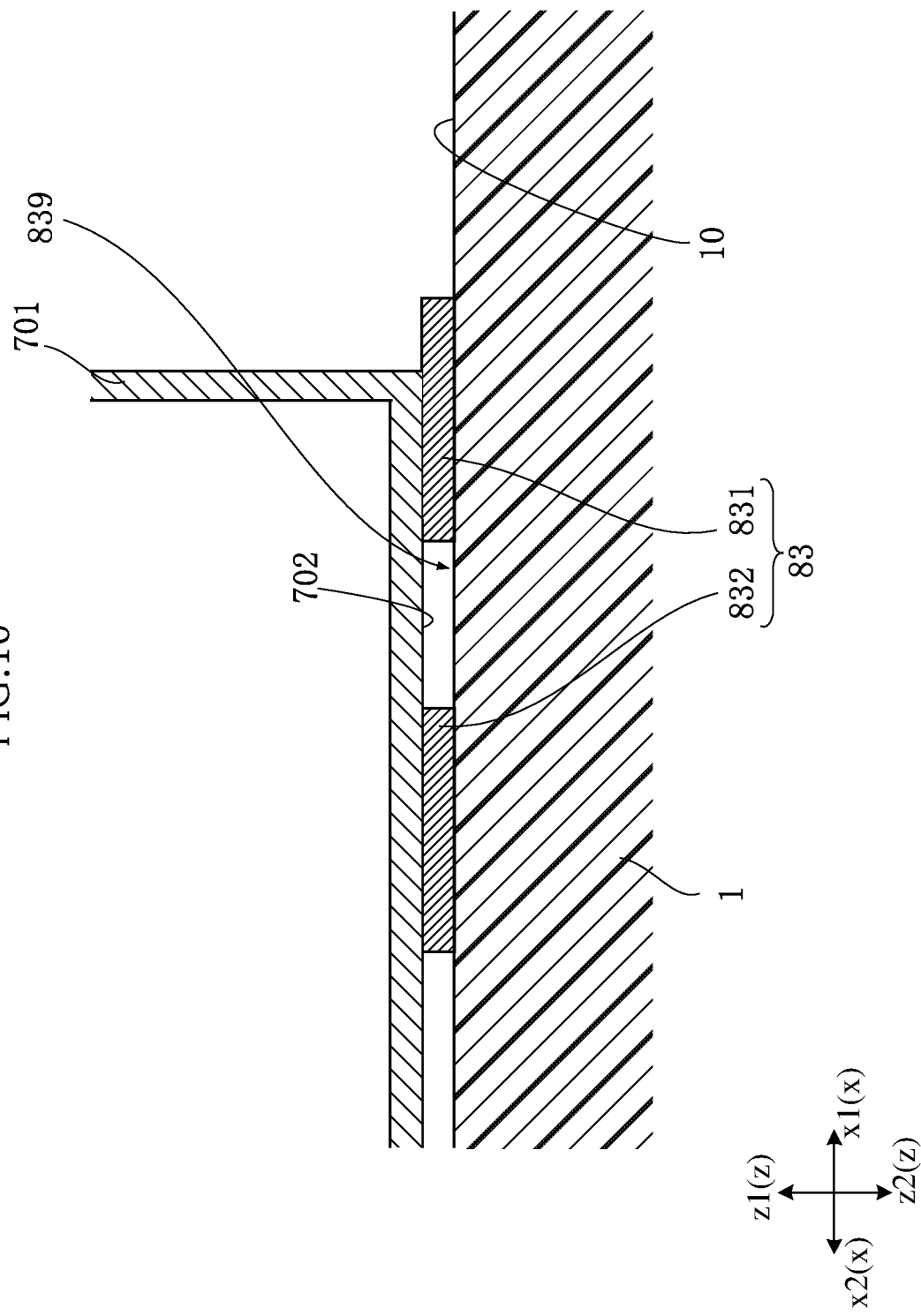
FIG. 16 is a schematic enlarged sectional view taken along lines XVI-XVI in FIG. 15.
Figure 17:
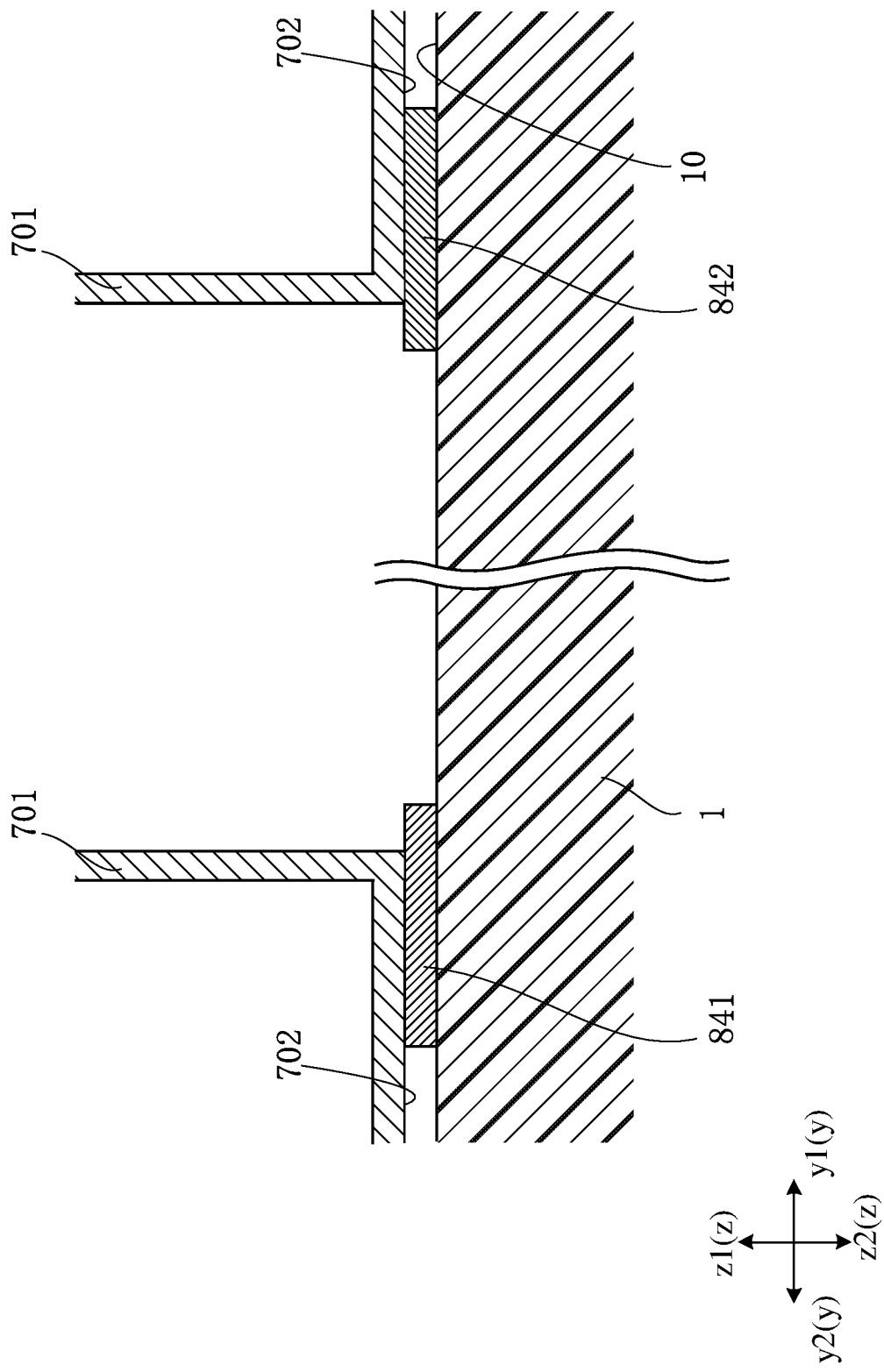
FIG. 17 is a schematic enlarged sectional view taken along lines XVII-XVII in FIG. 15.

FIG. 15 is a plan view showing a step subsequent to FIG. 14. FIG. 16 is a schematic enlarged sectional view taken along lines XVI-XVI in FIG. 15. FIG. 17 is a schematic enlarged sectional view taken along lines XVII-XVII in FIG. 15. Then, a molding step for forming the light-transmitting resins 4 and 5 is performed. This molding step is referred to as a primary resin molding step. In the primary resin molding step, a mold 701 is first pressed against the substrate 1, as shown in FIGS. 16 and 17. The mold 701 has a flat surface 702 facing the mount surface 10 of the substrate 1. In FIG. 15, the region of the substrate 1 which overlaps the flat surface 702 is indicated by hatching. In pressing the mold 701 against the substrate 1, the flat surface 702 is brought into contact with the first light-blocking portion 83.

In this process, as shown in FIG. 16, the opening 839 formed in the first light-blocking portion 83 is closed by the flat surface 702. Similarly, as shown in FIG. 17, in pressing the mold 701 against the substrate 1, the flat surface 702 is brought into contact with the second light-blocking portion 841 and the third light-blocking portion 842.

Figure 18:
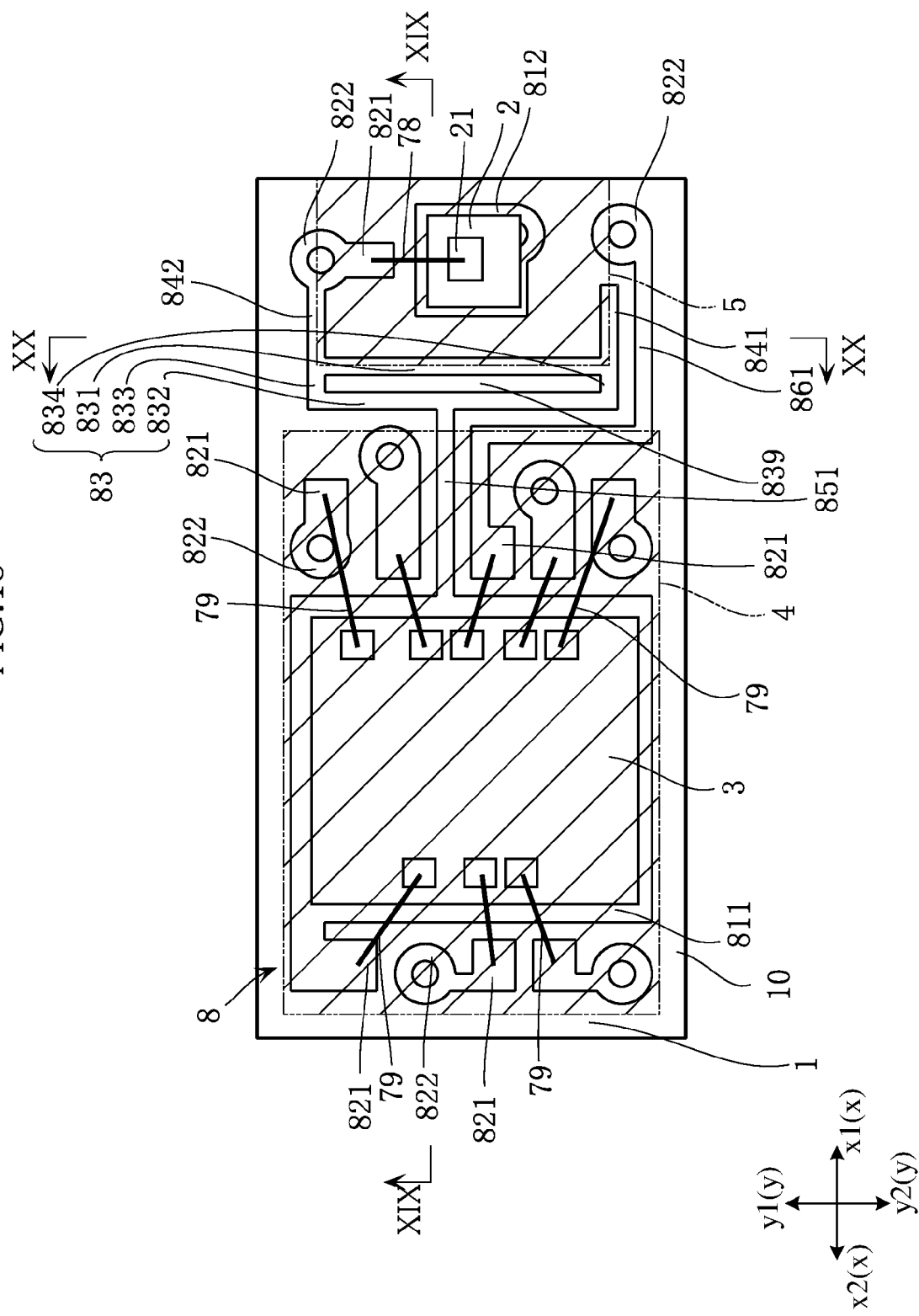
FIG. 18 is a plan view showing a step subsequent to FIG. 15.
Figure 19:
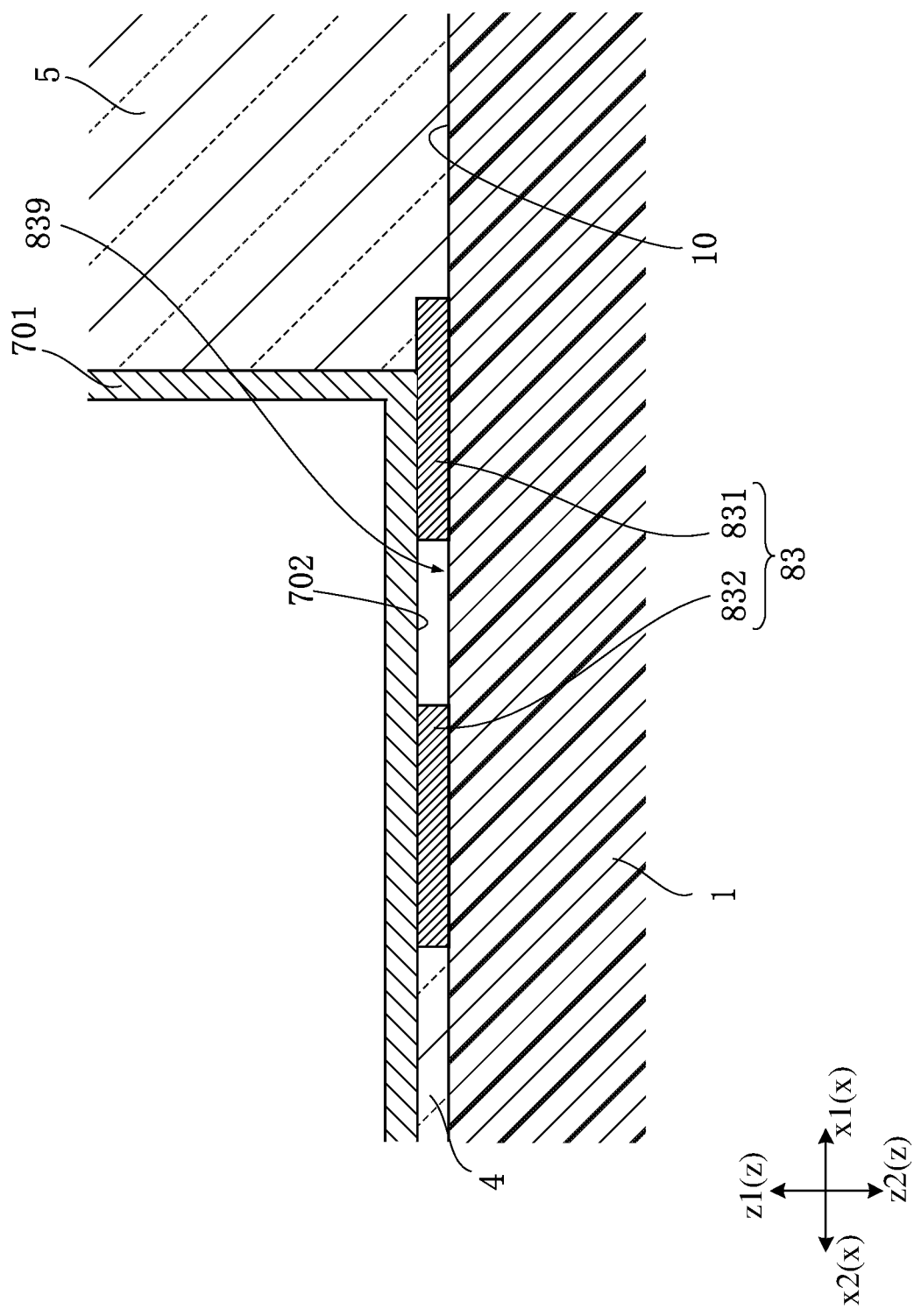
FIG. 19 is a schematic enlarged sectional view taken along lines XIX-XIX in FIG. 18.
Figure 20:
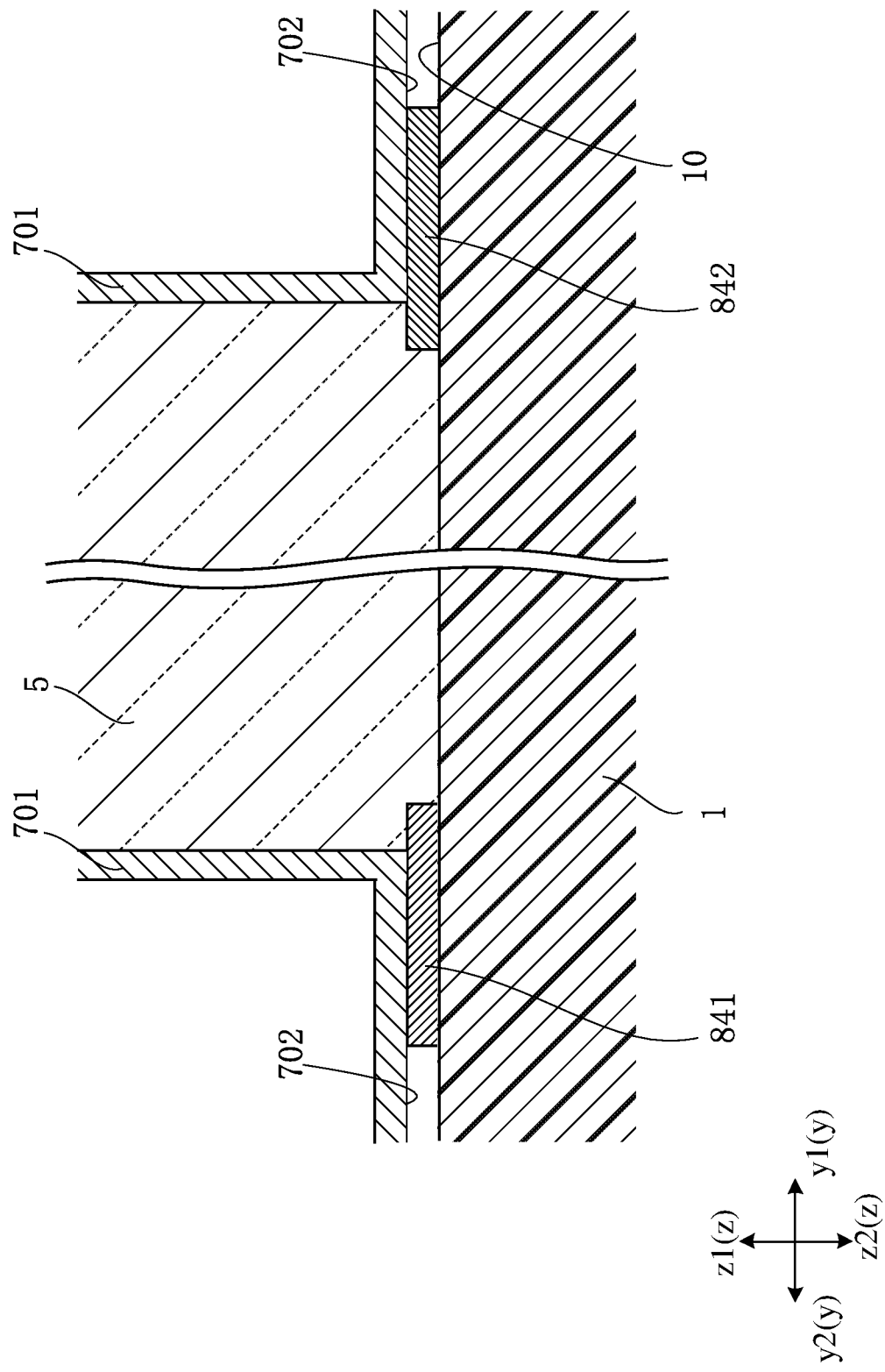
FIG. 20 is a schematic enlarged sectional view taken along lines XX-XX in FIG. 18.

FIG. 18 is a plan view showing a step subsequent to FIG. 15. FIG. 19 is a schematic enlarged sectional view taken along lines XIX-XIX in FIG. 18. FIG. 20 is a schematic enlarged sectional view taken along lines XX-XX in FIG. 18. Then, as shown in FIGS. 19 and 20, a resin material is introduced into the space enclosed by the substrate 1 and the mold 701, and then the resin material is hardened. By this process, the light-transmitting resin 4 covering the light-receiving element 3 and the light-transmitting resin 5 covering the light-emitting element 2 are formed. As shown in FIG. 19, in introducing a resin material into the space enclosed by the substrate 1 and the mold 701, the resin does not enter the opening 839 because the opening 839 is closed by the flat surface 702. Thus, the light-transmitting resin is not formed in the opening 839. In FIG. 18, the region of the substrate 1 on which the light-transmitting resin 4, 5 is formed is indicated by hatching.

Then, a light-shielding resin 6 to cover the light-transmitting resins 4, 5 and the substrate 1 is formed by a molding step. This molding step is referred to as a secondary rein molding step. By the secondary resin molding step, as shown in FIGS. 12 and 13, the light-shielding resin 6 that covers the first light-blocking portion 83, the second light-blocking portion 841 and the third light-blocking portion 842 are formed. Further, since the light-transmitting resin 5 is not formed in the opening 839 as shown in FIG. 19, the light-shielding resin 6 is formed also in the opening 839 as shown in FIG. 12. Thus, the bonding portion 609 for bonding to the substrate 1 is formed in the light-shielding resin 6.

Figure 21:
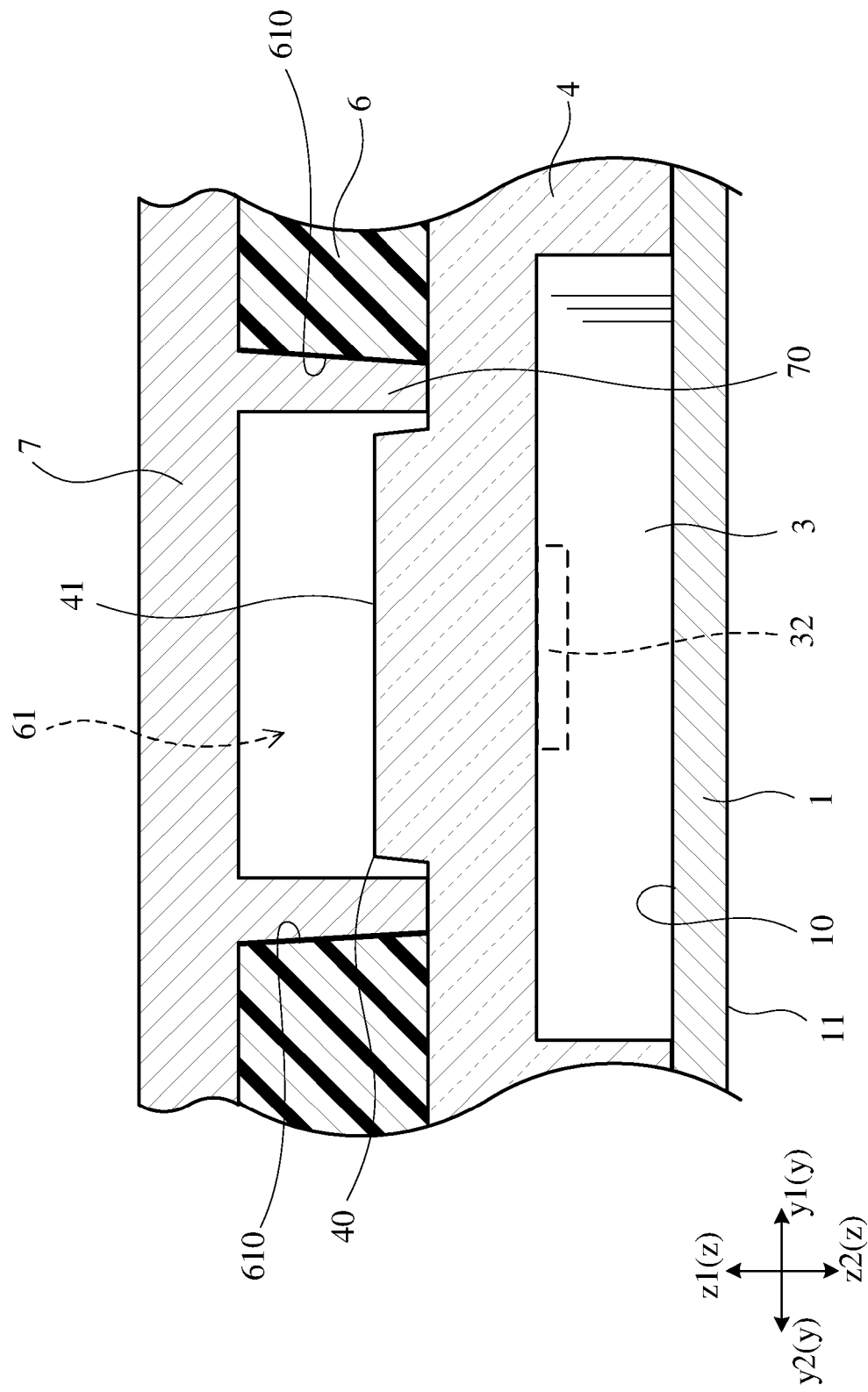
FIG. 21 is a sectional view showing a step in a process of making the optical apparatus according to the first embodiment.

As shown in FIG. 21, a mold 7 is used in the secondary resin molding step. The mold 7 includes a cylindrical portion 70 corresponding to the shape of the first opening 61 and a cylindrical portion 70 corresponding to the shape of the second opening 62. In FIG. 21, only the cylindrical portion 70 corresponding to the first opening 61 is shown. The cylindrical portion 70 is arranged around the projection 40 or the projection 50 and removed from the light-shielding resin 6 after the resin is hardened. Thus, the inner circumferential wall 610 of the opening 61 is formed without the contact of the cylindrical portion 70 with the projection 40. This prevents the resin material for forming the light-shielding resin 6 from adhering to the light-incident surface 41. Similarly, the inner circumferential wall 620 of the second opening 62 is formed without the contact of the cylindrical portion 70 with the projection 50. This prevents the resin material for forming the light-shielding resin 6 from adhering to the light-emitting surface 51. In order for the cylindrical portion 70 to be easily removed from the light-shielding resin 6, the inner circumferential wall 610 is made an inclined surface that proceeds toward the center of the first opening 61 as proceeding deeper (direction z2 side) in the depth direction of the first opening 61. This holds true for the inner circumferential wall 620.

The use of the electronic device 801 is described below.

Figure 23:
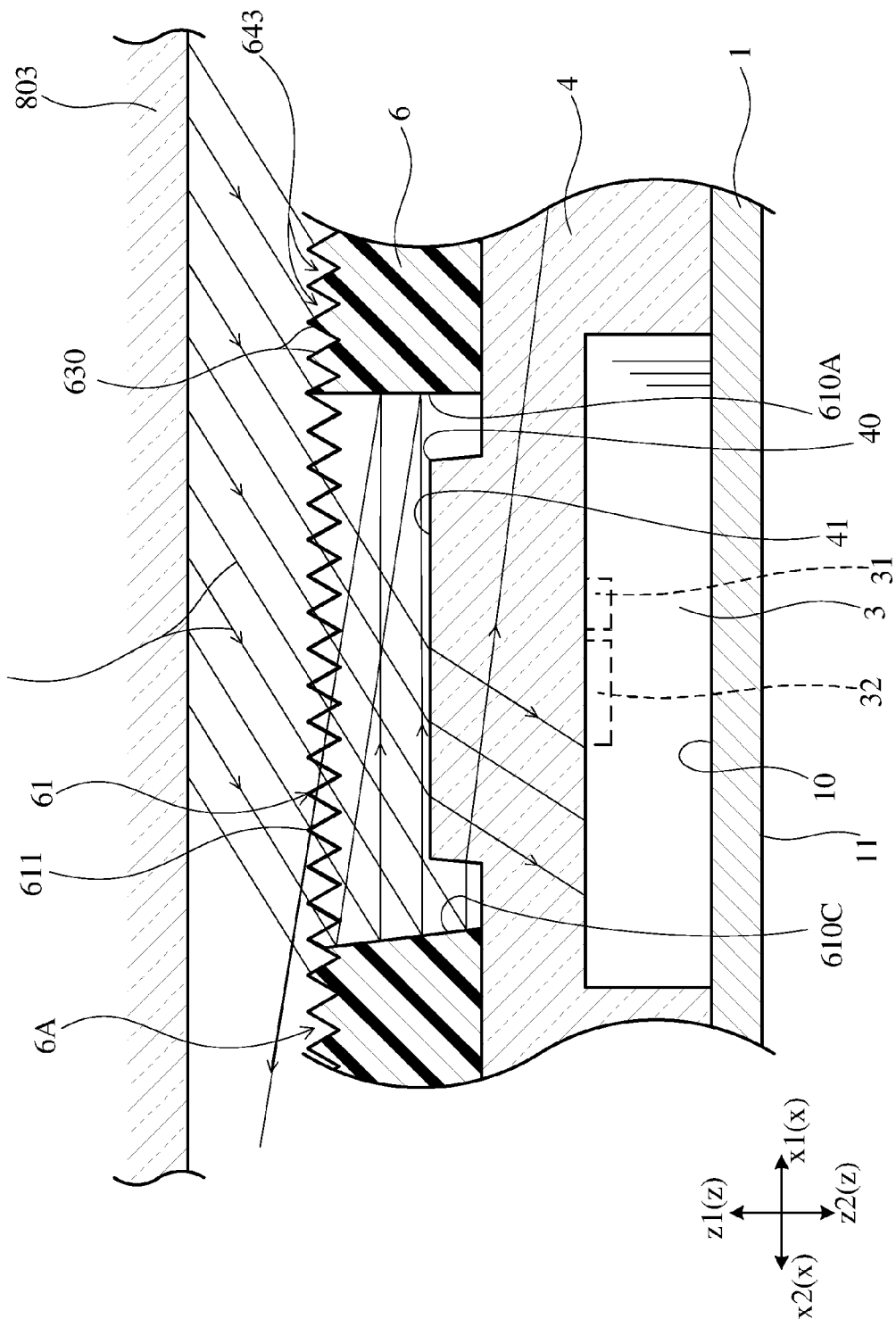
FIG. 23 is a sectional view of an electronic device according to the first embodiment.

As shown in FIGS. 22 and 23, the infrared light L11 emitted from the light-emitting element 2 travels through the light-emitting surface 51 toward the light-transmitting cover 803. The infrared light L11 passes through the light-transmitting cover 803. When there is an object 891 close to the light-transmitting cover 803 as shown in the figure, the infrared light L11 passing through the light-transmitting cover 803 is reflected by the object 891 and then travels again toward the light-transmitting cover 803. The infrared light L11 reflected by the object 891 passes through the light-transmitting cover 803 and the light-incident surface 41 and is then received by the infrared light detecting portion 32 of the light-receiving element 3. The functional element portion 33 of the light-receiving element 3 outputs to the outside the above-described proximity signal indicating that there is an object 891 close to light-transmitting cover 803. When the functional element portion 33 outputs to the outside a proximity signal during the emission of infrared light L11 from the light-emitting element 2, it indicates that the optical apparatus 101 has detected the object 891 close to the light-transmitting cover 803. On the other hand, when there is no object close to the light-transmitting cover 803, the infrared light L11 emitted from the light-emitting element 2 and passing through the light-transmitting cover 803 continues to travel in the direction z1. Thus, the infrared light L11 emitted from the light-emitting element 2 is not received by the infrared light detecting portion 32 of the light-receiving element 3. In this case, the functional element portion 33 of the light-receiving element 3 does not output the above-described proximity signal to the outside. When the functional element portion 33 does not output a proximity signal during the emission of infrared light L11 from the light-emitting element 2, it indicates that the optical apparatus 101 has not detected any object 891 close to the light-transmitting cover 803. In this way, the optical apparatus 101 detects presence or absence of the object 891 close to the light-transmitting cover 803. Although the travel direction of the infrared light L11 shown in FIG. 22 is not along the direction z, the travel direction of the infrared light L11 passing through the light-emitting surface 51, reflected by the object 891 and received by the light-receiving element 3 actually extends substantially along the direction z.

The advantages of this embodiment are described below.

As shown in FIGS. 10 and 12, in the optical apparatus 101, the wiring pattern 8 has the first light-blocking portion 83. The first light-blocking portion 83 is interposed between the light-shielding resin 6 and the substrate 1, and also between the light-emitting element 2 and the light-receiving element 3 as viewed in x-y plane. The first light-blocking portion 83 extends across the light-emitting element 2 in the direction y. With this arrangement, between the light-emitting element 2 and the light-receiving element 3, the first light-blocking portion 83 blocks the travel path of the light from the light-transmitting resin 5 to the light-transmitting resin 4 through a gap between the light-shielding resin 6 and the substrate 1. Thus, between the light-emitting element 2 and the light-receiving element 3, the light emitted from the light light-emitting element 2 is prevented from traveling from the light-transmitting resin 5 to the light-transmitting resin 4 by passing through a gap between the light-shielding resin 6 and the substrate 1. Thus, the light emitted from the light-emitting element 2 is prevented from passing through a gap between the light-shielding resin 6 and the substrate 1 to be received by the light-receiving element 3. This reduces false detection such as determining an object 891 to exist close to the light-transmitting cover 803, though the object 891 actually does not exist close to the light-transmitting cover.

As shown in FIGS. 10 and 12, in the optical apparatus 101, the first light-blocking portion 83 has the first portion 831 and the second portion 832 which are spaced apart from each other. The light-shielding resin 6 has the bonding portion 609 sandwiched between the first portion 831 and the second portion 832 and in contact with the substrate 1. In this arrangement, the bonding strength between the material forming the bonding portion 609, which is part of the light-shielding resin 6, and the material forming the substrate 1 is generally larger than the bonding strength between the material forming the light-shielding resin 6 and the material forming the wiring pattern 8. Also, even in the case where a resist layer (not shown) is provided on the wiring pattern 8, the bonding strength between the material forming the bonding portion 609 and the material forming the substrate 1 is generally larger than the bonding strength between the material forming the bonding portion 609 and the material forming the resist layer. Thus, the arrangement that the light-shielding resin 6 has the bonding portion 609 in contact with the substrate 1 is suitable for reliably bonding the light-shielding resin 6 to the substrate 1. Thus, the optical apparatus 101 reliably prevents the light-shielding resin 6 from being detached from the substrate 1.

As shown in FIGS. 10 and 13, in the optical apparatus 101, the wiring pattern 8 has the second light-blocking portion 841 interposed between the light-shielding resin 6 and the substrate 1. The second light-blocking portion 841 overlaps the light-emitting element pad 812 in the direction x. With this arrangement, even when the light emitted from the light-emitting element 2 travels within the light-transmitting resin 5 toward the direction y2 side of the light-emitting element pad 812, the second light-blocking portion 841 prevents the light from passing through a gap between the light-shielding resin 6 and the substrate 1. Thus, even when the light from the light-emitting element 2 travels toward the direction y2 side of the light-emitting element pad 812 within the light-transmitting resin 5, the light from the light-emitting element 2 is prevented from traveling from the light-transmitting resin 5 to the light-transmitting resin 4 by passing through a gap between the light-shielding resin 6 and the substrate 1. Thus, the light emitted from the light-emitting element 2 is prevented from passing through a gap between the light-shielding resin 6 and the substrate 1 to be received by the light-receiving element 3. This reduces false detection such as determining an object 891 to exist close to the light-transmitting cover 803, though the object 891 actually does not exist close to the light-transmitting cover.

In the optical apparatus 101, the second light-blocking portion 841 is connected to the first light-blocking portion 83. This arrangement eliminates the gap between the second light-blocking portion 841 and the first light-blocking portion 83. Thus, between the second light-blocking portion 841 and the first light-blocking portion 83, the light from the light-emitting element 2 is prevented from traveling from the light-transmitting resin 5 to the light-transmitting resin 4 by passing through a gap between the light-shielding resin 6 and the substrate 1. Thus, the light emitted from the light-emitting element 2 is prevented from passing through a gap between the light-shielding resin 6 and the substrate 1 to be received by the light-receiving element 3. This further reduces the above-described false detection.

As shown in FIGS. 10 and 13, in the optical apparatus 101, the wiring pattern 8 has the third light-blocking portion 842 interposed between the light-shielding resin 6 and the substrate 1. The third light-blocking portion 842 overlaps the light-emitting element pad 812 in the direction x. In the direction y, the light-emitting element pad 812 is positioned between the second light-blocking portion 841 and the third light-blocking portion 842. This further reduces the false detection for the same reason as described above with respect to the second light-blocking portion 841.

In the optical apparatus 101, the third light-blocking portion 842 is connected to the first light-blocking portion 83. This reduces the false detection for the same reason as described above with respect to the second light-blocking portion 841.

In the optical apparatus 101, the first light-blocking portion 83, which tends to have a relatively large area as viewed in x-y plane, can function as an antenna. When the first light-blocking portion 83 functions as an antenna, the circuit including the light-emitting element 2, for example, may malfunction. Thus, it is preferable that the first light-blocking portion 83 is a ground electrode. When the first light-blocking portion 83 is a ground electrode, the potential of the first light-blocking portion 83 is constant even when the first light-blocking portion 83 functions as an antenna. This reduces malfunction of the circuit including the light-emitting element 2.

In the optical apparatus 101, some part of the infrared light L11 exiting the light-emitting surface 51 impinges on the light-transmitting cover 803 with a relatively large incident angle. As shown in FIGS. 22 and 23, the part of the infrared light L11 which impinges on the light-transmitting cover 803 with a relatively large incident angle does not pass through the light-transmitting cover 803 but is reflected by the inner surface of the light-transmitting cover 803 to become noise light L12. Part of the noise light L12 travels toward the first surface 6A or the first opening 61 while forming a relatively large angle with respect to the direction z. In the optical apparatus 101, in the depth direction (direction z) of the first opening 61, the edge 611 of the inner circumferential wall 610 is offset in the direction from the light-receiving element 3 toward the light-incident surface 41 (direction z1) from any portion of the light-transmitting resin 4 exposed through the first opening 61. Thus, the light-shielding resin 6 blocks part of the noise light L12 that travels while forming a relatively large angle with respect to the direction z before the light reaches the light-incident surface 41. This reduces the amount of noise light L12 that passes through the light-incident surface 41 to reach the light-receiving element 3. Reducing the amount of the noise light L12 reaching the light-receiving element 3 reduces false detection such as determining an object 891 to exist close to the light-transmitting cover 803, though the object 891 actually does not exist close to the light-transmitting cover.

In the optical apparatus 101, the inner circumferential wall 610 has portions 610A and 610C that face each other in the direction (direction x) perpendicular to the depth direction (direction z) of the first opening 61. The inclination angle $\phi 13$ of the portion 610C with respect to the depth direction of the first opening 61 (direction z) is larger than the inclination angle $\phi 11$ of the portion 610A with respect to the depth direction of the first opening 61 (direction z). As shown in FIG. 23, part of the noise light L12 enters the first opening 61. The part of the light entering the first opening 61 is reflected by the portion 610C. As the inclination angle $\phi 13$ is larger than the inclination angle $\phi 11$, the noise light L12 reflected by the portion 610C does not travel toward the light-emitting surface 41 but travels toward the portion 610A. Thus, the amount of the noise light L12 that reaches the light-emitting surface 41 after being reflected by the portion 610C reduces. Accordingly, the amount of the noise light L12 that reaches the light-receiving element 3 reduces, which leads to further reduction of false detection.

Figure 25:
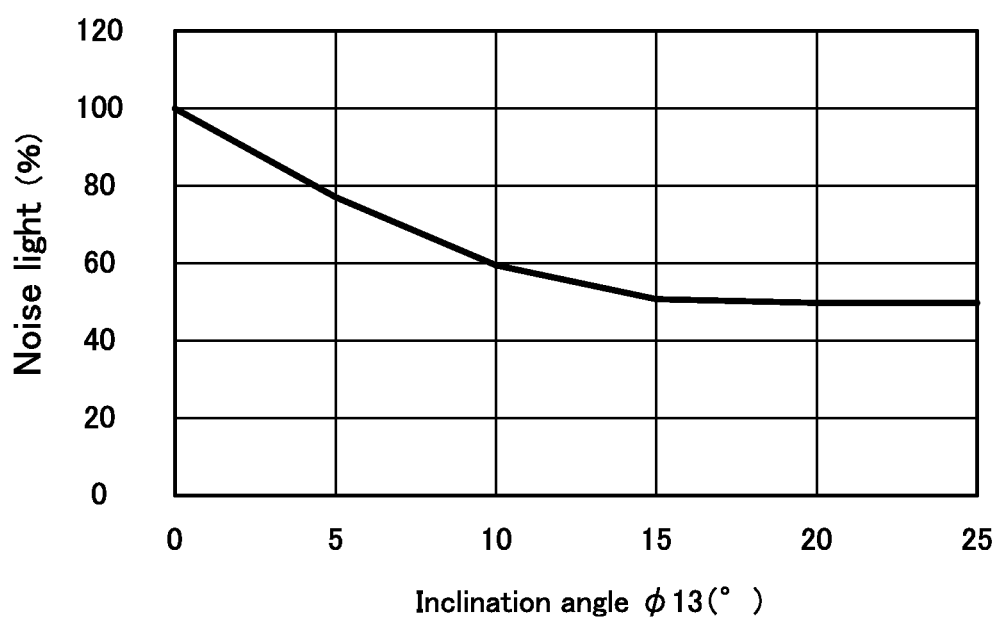
FIG. 25 is a graph for explaining noise light reduction effect.

FIG. 25 is a graph obtained by simulation, showing the amount of the noise light L12 received by the light-receiving element 3 with respect to the inclination angle $\phi 13$ of the portion 610C of the inner circumferential wall 610. In this graph, the output level of the light-receiving element 3 when the inclination angle φ13 is 0° is determined to be "100%" as a reference level. As will be understood from the graph, the amount of the noise light L12 reduces to the lower limit level when the inclination angle φ13 is 15° or larger.

In the optical apparatus 101, the light-incident surface 41 is flat. With this arrangement, the amount of the noise light L12 that impinges on the light-emitting surface 41 after being reflected by the portion 610C is smaller than the case where the light-incident surface 41 is convex.

In the optical apparatus 101, in the depth direction (direction z) of the second opening 62, the edge 621 of the inner circumferential wall 620 is offset in the direction from the light-emitting element 3 toward the light-emitting surface 51 (direction z1) from any portion of the light-transmitting resin 5 exposed through the second opening 62. With this arrangement, the light traveling from the light-emitting surface 51 in a direction that forms a large incident angle to the light-transmitting cover 803 is easily blocked by the inner circumferential wall 620. This reduces the amount of noise light L12 received by the light-receiving element 3, which leads to reduction of false detection.

In the optical apparatus 101, the cut surface 52B is exposed from the light-shielding resin 6 in the direction x1. With this arrangement, the infrared light L11 is emitted from the cut surface 52B as well. The infrared light L11 emitted from the cut surface 52B travels in the direction x1 without being blocked by the inner circumferential wall 620. This also reduces the amount of noise light L12 received by the light-receiving element 3, which leads to reduction of false detection.

In the optical apparatus 101, the light-shielding resin 6 has the surface 603. The surface 603 is irregular, faces the direction z1, and is positioned on the direction x1 side of the first opening 61. The surface 603, which is irregular, can be arranged in such a manner that the noise light L12 reflected by the surface 603 does not travel toward the first opening 61. Thus, the amount of the noise light L12 that travels toward the first opening 61 can be reduced. In particular, in the optical apparatus 101, the light-shielding resin 6 has a plurality of grooves 643 elongated in one direction on the surface 603. The surface 603 includes first groove surfaces 653a and second groove surfaces 653b. Each of the first groove surfaces and each of the second groove surfaces define one of the grooves 643 and face each other across the bottom of the groove. In each of the grooves 643, the second groove surface 653b is further away from the first opening 61 than the first groove surface 653a is. According to this arrangement, part of the noise light L12 is reflected by the first groove surface 653a to travel toward the side opposite from the first opening 61. Thus, the amount of the noise light L12 traveling toward the first opening 61 reduces. Unlike this embodiment, the surface 603 may be made irregular by forming minute irregularities on the surface 603.

Figure 24:
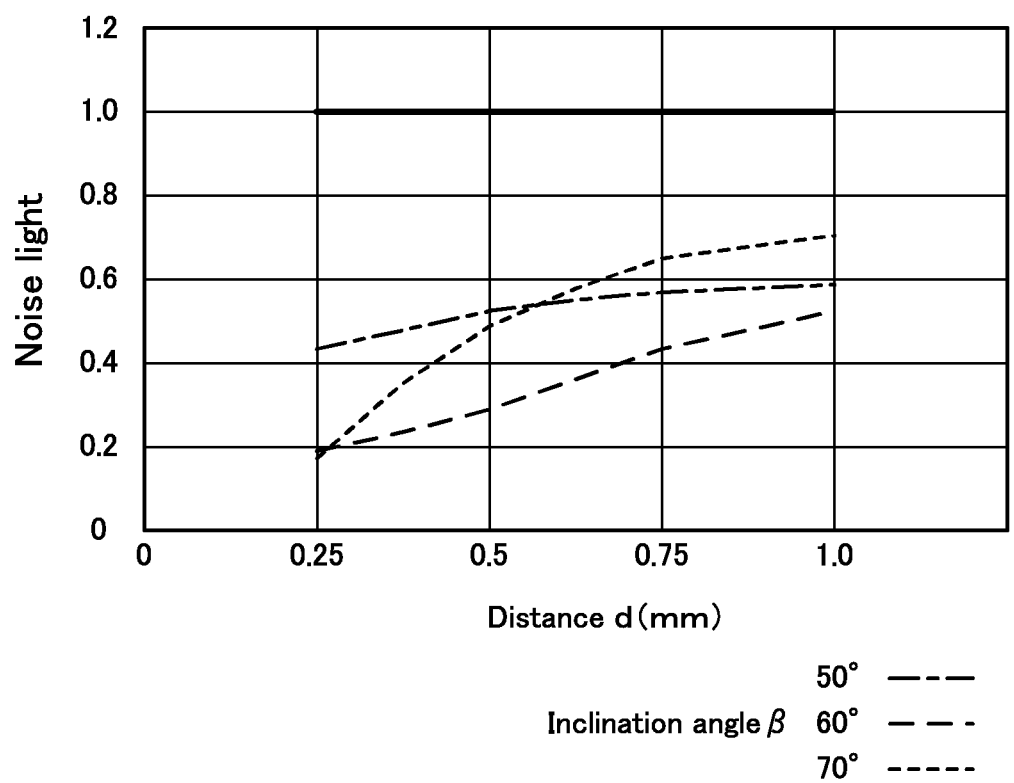
FIG. 24 is a graph for explaining noise light reduction effect.

FIG. 24 is a graph obtained by simulation, showing the amount of the noise light L12 received by the light-receiving element 3, depending on the inclination angle θ31, with respect to the distance d between the optical apparatus 101 and the light-transmitting cover 803. In this graph, the output level of the light-receiving element 3 when the inclination angle θ31 is 0° is determined to be "1" as a reference level. As will be understood from the graph, when the inclination angle θ31 is 50°, 60° or 70°, the amount of the noise light L12 received by the light-receiving element 3 is effectively reduced even when the distance d changes in the range of from 0.25 to 1 mm.

In the optical apparatus 101, the light-receiving element 3 has the semiconductor substrate 30, the visible light detecting portion 31 and the infrared light detecting portion 32. The visible light detecting portion 31 and the infrared light detecting portion 32 are provided on the same semiconductor substrate 30. According to this structure, a single-chip light-receiving element 3 having the visible light detecting function and the infrared light detecting function is provided. This arrangement achieves size reduction of the light-receiving element 3, as compared with the case where each of the visible light detecting function and the infrared light detecting function is realized by an individual chip. Size reduction of the light-receiving element 3 contributes to size reduction of the optical apparatus 101. In the structure including a single-chip light-receiving element 3 having the visible light detecting function and the infrared light detecting function, both of the light to reach the visible light detecting portion 31 and the light to reach the infrared light detecting portion 32 pass through the light-incident surface 41. Thus, it is not necessary to provide a light-incident surface for the light to reach the infrared light detecting portion 32, separately from the light-incident surface for the light to reach the visible light detecting portion 31. This also contributes to size reduction of the optical apparatus 101.

In the optical apparatus 101, the light-receiving element 3 has the multi-layered optical film 34 that covers the infrared light detecting portion 32 and transmits the infrared light. With this structure, in molding the light-transmitting resin 4 on the light-receiving element 3, an individual resin molding step is not necessary for each of the visible light detecting portion 31 and the infrared light detecting portion 32. Moreover, the multi-layered optical film 34 is formed in a semiconductor process for forming a thin film on the semiconductor substrate 30. Thus, an additional process for forming the multi-layered optical film 34 is not necessary, and semiconductor manufacturing equipment can be used. Thus, the manufacturing cost reduces.

Figure 26:
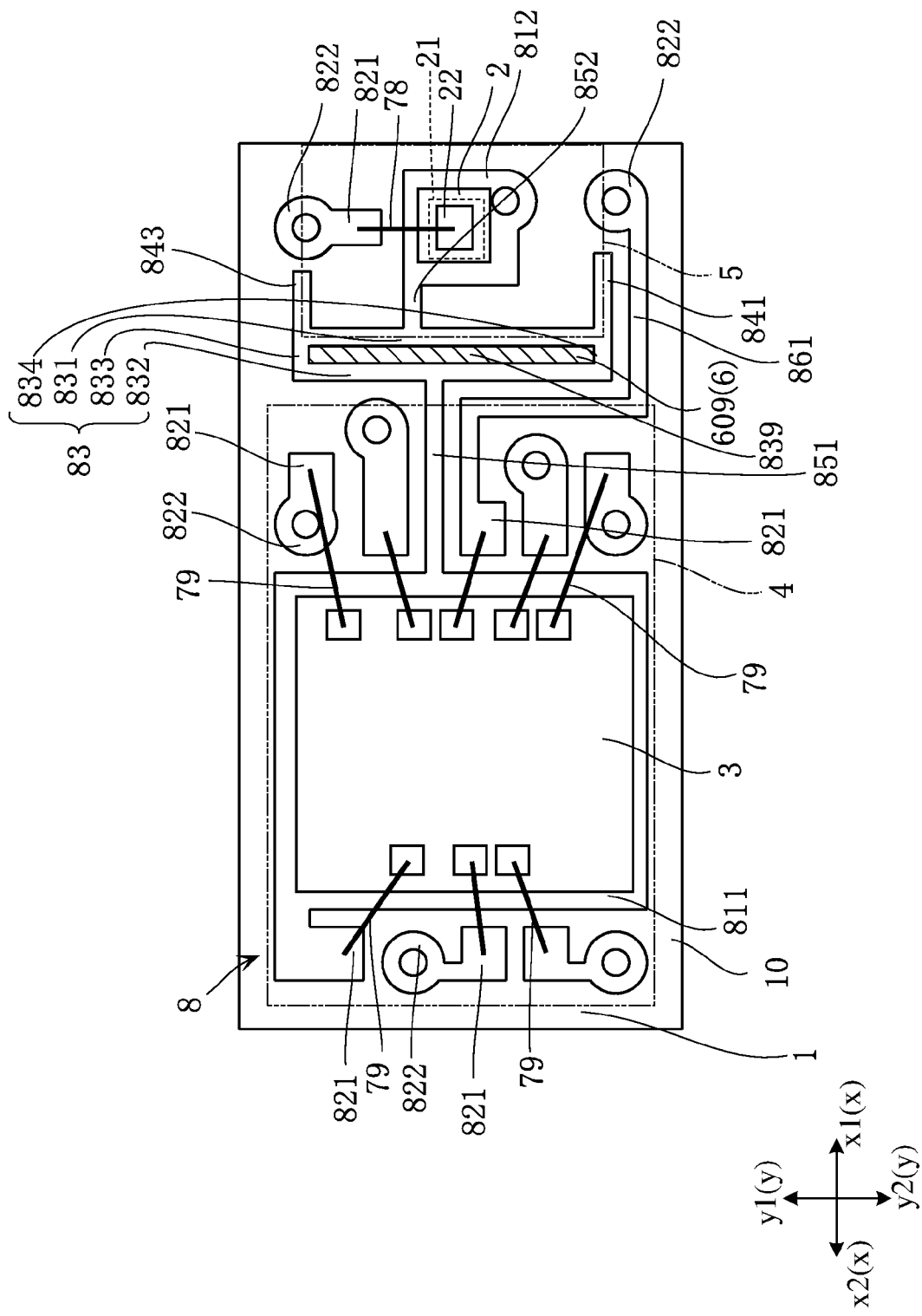
FIG. 26 is a plan view showing a variation of the optical device according to the first embodiment.

A variation of the first embodiment is described below with reference to FIG. 26. In the variation below, the elements that are identical or similar to those of the foregoing optical apparatus 101 are designated by the same reference signs as those used for the foregoing optical apparatus, and the description is omitted.

This figure is a plan view showing a variation of the optical apparatus according to the first embodiment. The optical apparatus of this variation differs from the optical apparatus 101 in that the wiring pattern 8 includes a third light-blocking portion 843 instead of the light-blocking portion 842, the wiring pattern includes a linking portion 852, the cathode electrode 21 is bonded on the light-emitting element pad 812, and a wire 78 is bonded on the anode electrode 22. Other structures are the same.

In this variation, unlike the third light-blocking portion 842 of the optical apparatus 101, the third light-blocking portion 843 is not electrically connected to the wire bonding pad 821 on which the wire 78 is bonded. Specifically, the third light-blocking portion 843 is interposed between the light-shielding resin 6 and the substrate 1. In this variation, the third light-blocking portion 843 is in the form of a strip elongated in the direction x. The third light-blocking portion 843 overlaps the light-emitting element pad 812 in the direction x. The third light-blocking portion 843 is on the direction y2 side of the light-emitting element pad 812. Thus, the light-emitting element pad 812 is positioned between the third light-blocking portion 843 and the second light-blocking portion 841. Similarly to the third light-blocking portion 842, the third light-blocking portion 843 may include a portion covered by the light-transmitting resin 5, or the third light-blocking portion 843 may not be covered by the light-transmitting resin 5. Preferably, the third light-blocking portion 843 is connected to the first light-blocking portion 83.

The linking portion 852 is connected to the light-emitting element pad 812 and the first light-blocking portion 83. In this variation, the linking portion 852 is in the form of a strip elongated in the direction x. However, the shape of the linking portion 852 is not limited to this. The linking portion 852 is positioned between the light-emitting element pad 812 and the first light-blocking portion 83 and covered by the light-transmitting resin 5.

As noted before, the cathode electrode 21 is bonded to the light-emitting element pad 812. Thus, both of the linking portion 852 and the first light-blocking portion 83 are electrically connected to the cathode electrode 21 of the light-emitting element 2. In this variation again, the first light-blocking portion 83 may be a ground electrode in a circuit including the light-emitting element 2.

With this structure again, the same advantages as those of the optical apparatus 101 are obtained.

The above-described structure of the wiring pattern 8 may be applied to the optical apparatus according to the second through the sixth embodiments.

A second through a ninth embodiments are described below. In the embodiments below, the elements that are identical or similar to those of the first embodiment are designated by the same reference signs as those used for the first embodiment, and the description is omitted.

Second Embodiment

Figure 27:
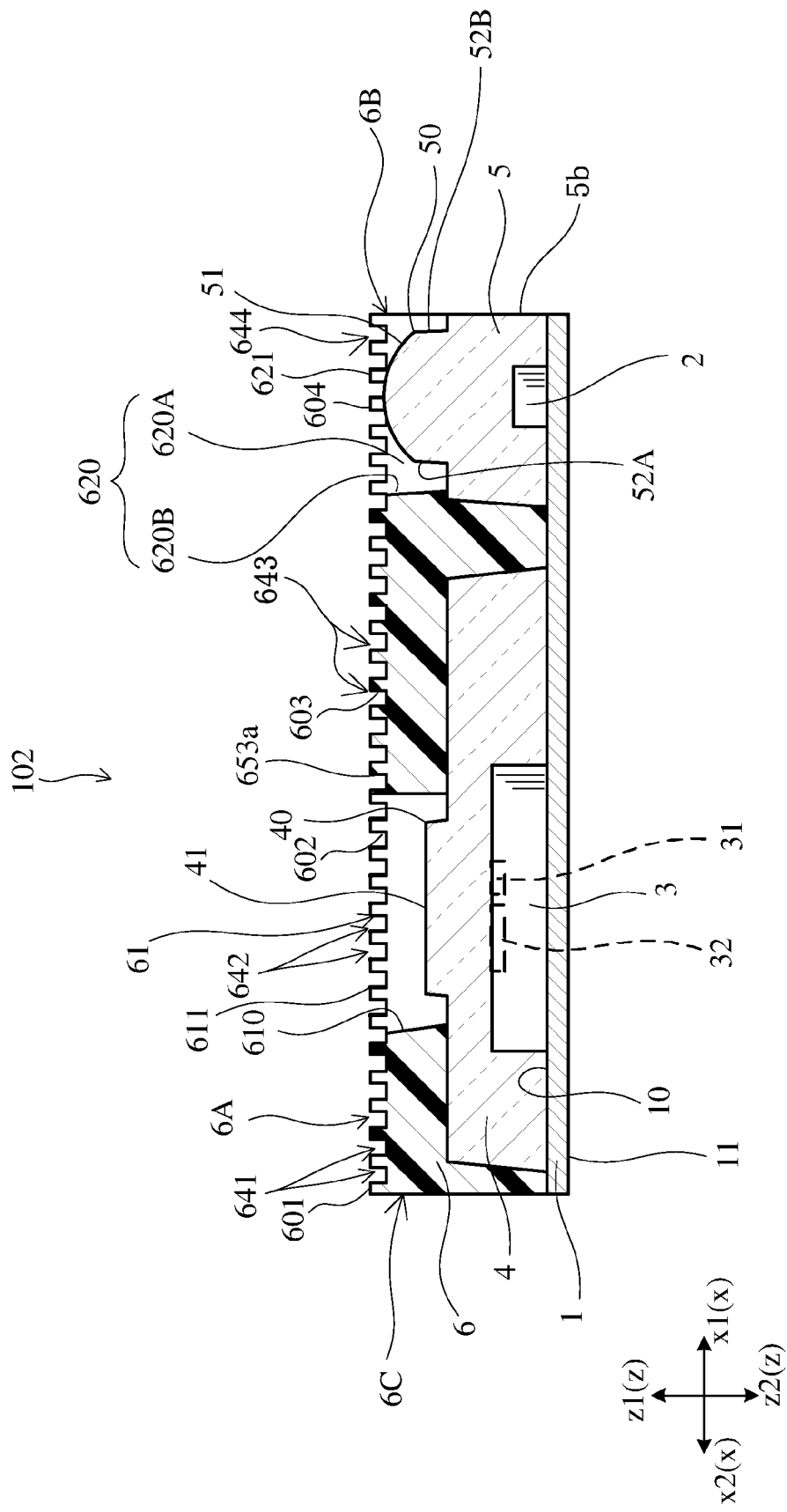
FIG. 27 is a sectional view of an optical apparatus according to a second embodiment.

FIG. 27 is a sectional view of an optical apparatus according to a second embodiment.

The optical apparatus 102 shown in the figure is different from the foregoing optical apparatus 101 in that each of the grooves 641-644 has a rectangular cross section. Except the cross sectional shape of the grooves 641-644, the structure of the optical apparatus 102 is the same as that of the optical apparatus 101, so that the description is omitted. With this structure again, similarly to the first embodiment, the first groove surface 653a reflects part of the noise light L12 to cause the noise light to travel toward the side opposite from the first opening 61. Thus, the noise light L12 traveling toward the first opening 61 reduces.

Third Embodiment

Figure 28:
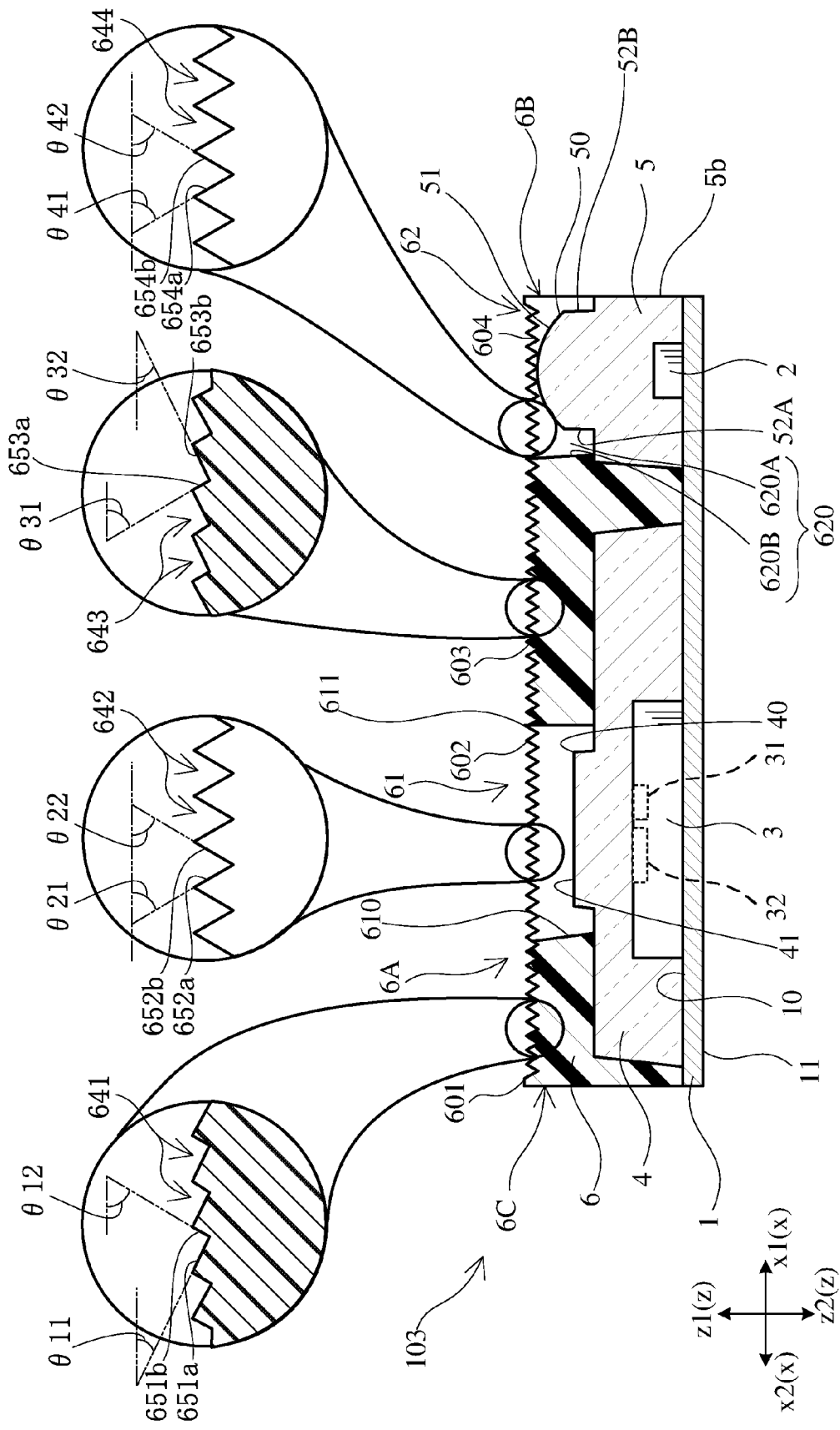
FIG. 28 is a sectional view of an optical apparatus according to a third embodiment.

FIG. 28 is a sectional view of an optical apparatus according to a third embodiment.

The optical apparatus 103 shown in the figure is different from the optical apparatus 101 in cross sectional shape of the grooves 641-644. That is, at the surface 601 of the optical apparatus 103, the first angle θ11 that is the inclination angle of each groove surface 651a with respect to the direction x is smaller than the second angle θ12 that is the inclination angle of each groove surface 651b with respect to the direction x. At the surface 603 of the optical apparatus 103, the first angle θ31 that is the inclination angle of each groove surface 653a with respect to the direction x is larger than the second angle θ32 that is the inclination angle of each groove surface 653b with respect to the direction x. The inclination angle 821 and the inclination angle θ22 are the same. Similarly, the inclination angle θ41 and the inclination angle θ42 are the same.

According to this structure, at the surface 603, the first angle θ31 is larger than the second angle θ32. This arrangement reduces the amount of noise light L12 that is reflected by the first groove surface 653a and then impinges on the second groove surface 653b, and reliably causes the light reflected by the first groove surface 653a to travel toward the side opposite from the first opening 61. This arrangement is suitable for reducing the amount of noise light L12 traveling toward the first opening 61.

Moreover, at the surface 601, the first angle θ11 is smaller than the second angle θ12. According to this structure, the noise light L12 traveling from between the surface 603 and the light-transmitting cover 803 to the space between the surface 601 and the light-transmitting cover 803 is reliably reflected by the first groove surface 651a so that the noise light travels toward the direction x2 side. This arrangement is suitable for reducing the amount of noise light L12 traveling toward the first opening 61.

Fourth Embodiment

Figure 29:
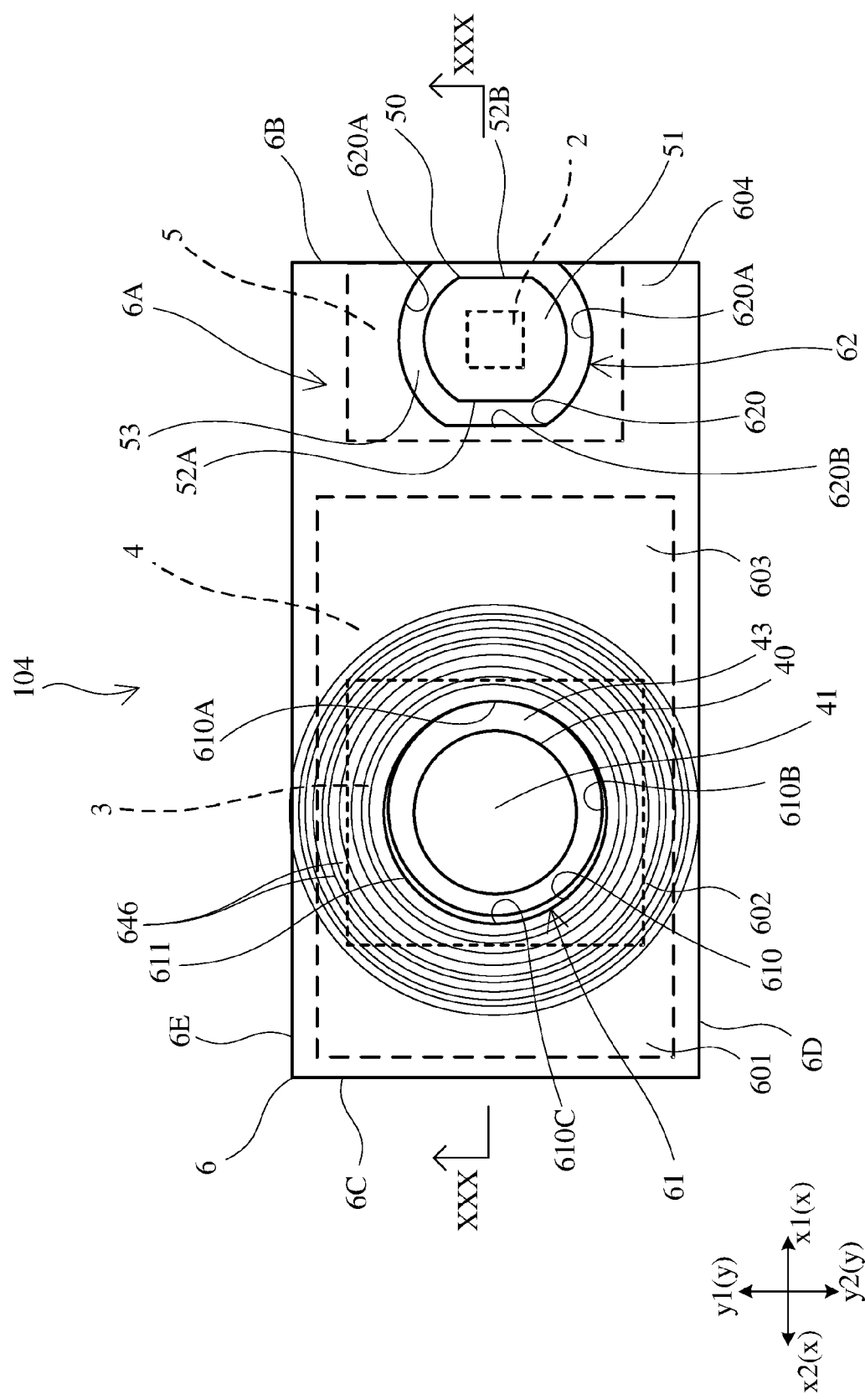
FIG. 29 is a plan view of an optical apparatus according to a fourth embodiment.
Figure 30:
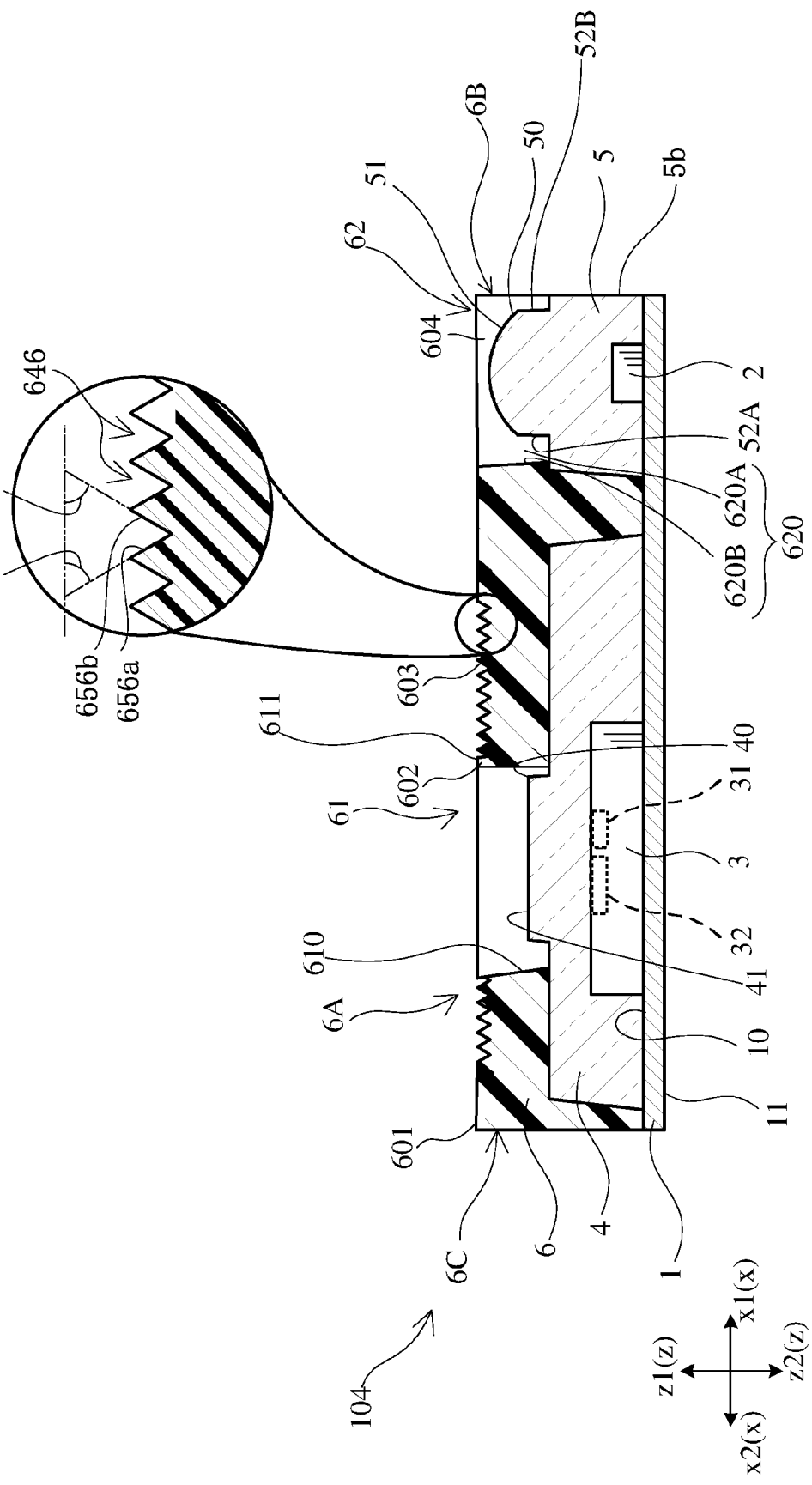
FIG. 30 is a sectional view taken along lines XXX-XXX in FIG. 29.

FIG. 29 is a plan view of an optical apparatus according to a fourth embodiment. FIG. 30 is a sectional view taken along lines XXX-XXX in FIG. 29.

In the optical apparatus 104 shown in the figure, a plurality of grooves 646 are provided on the surfaces 601-603 of the first surface 6A of the light-shielding resin 6. Each groove 646 extends in the same direction. In this embodiment, each groove 646 extends circumferentially around the center of the first opening 61. The surfaces 601-603 include first groove surfaces 656a and second groove surfaces 656b. Each of the first groove surfaces and each of the second groove surfaces define one of the grooves 646 and face each other across the bottom of the groove 646. At the center of the surface 603 in the direction y, the first groove surface 656a of each groove 646 is positioned on the direction x2 side, whereas the second groove surface 656b is positioned on the direction x1 side. That is, at the center of the surface 603 in the direction y, the second groove surface 656b of each groove 646 is further away from the first opening 61 than the first groove surface 656a is. The first groove surface 656a and the second groove surface 656b at the center of the surface 603 in the direction y are described below.

Each first groove surface 656a is an inclined surface that proceeds toward the direction z2 side as proceeding toward the direction x1 side. The first groove surface 656a is inclined at a first angle θ61 with respect to the direction x. Each second groove surface 656b is an inclined surface that proceeds toward the direction z2 side as proceeding toward the direction x2 side. The second groove surface 656b is inclined at a second angle θ62 with respect to the direction x. Preferably, each of the first angle θ61 and the second angle θ62 is 50-70°. In this embodiment, the first angle θ61 and the second angle θ62 are the same. However, as in the third embodiment, the first angle θ61 may be larger than the second angle θ62.

With this arrangement again, the first groove surface 656a reflects part of the noise light L12 to cause the noise light to travel toward the side opposite from the first opening 61. Thus, the noise light L12 traveling toward the first opening 61 reduces.

Fifth Embodiment

Figure 31:
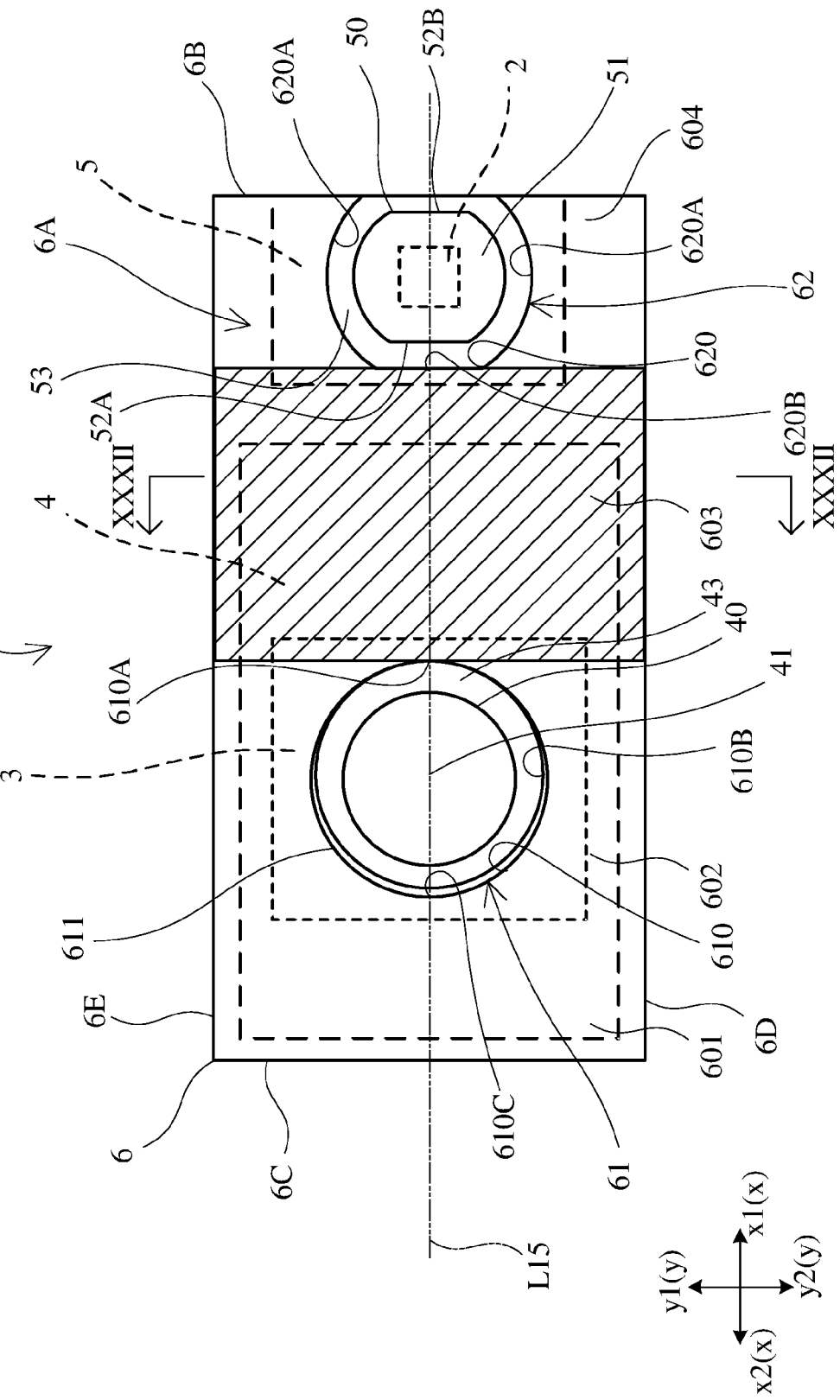
FIG. 31 is a plan view of an optical apparatus according to a fifth embodiment.
Figure 32:
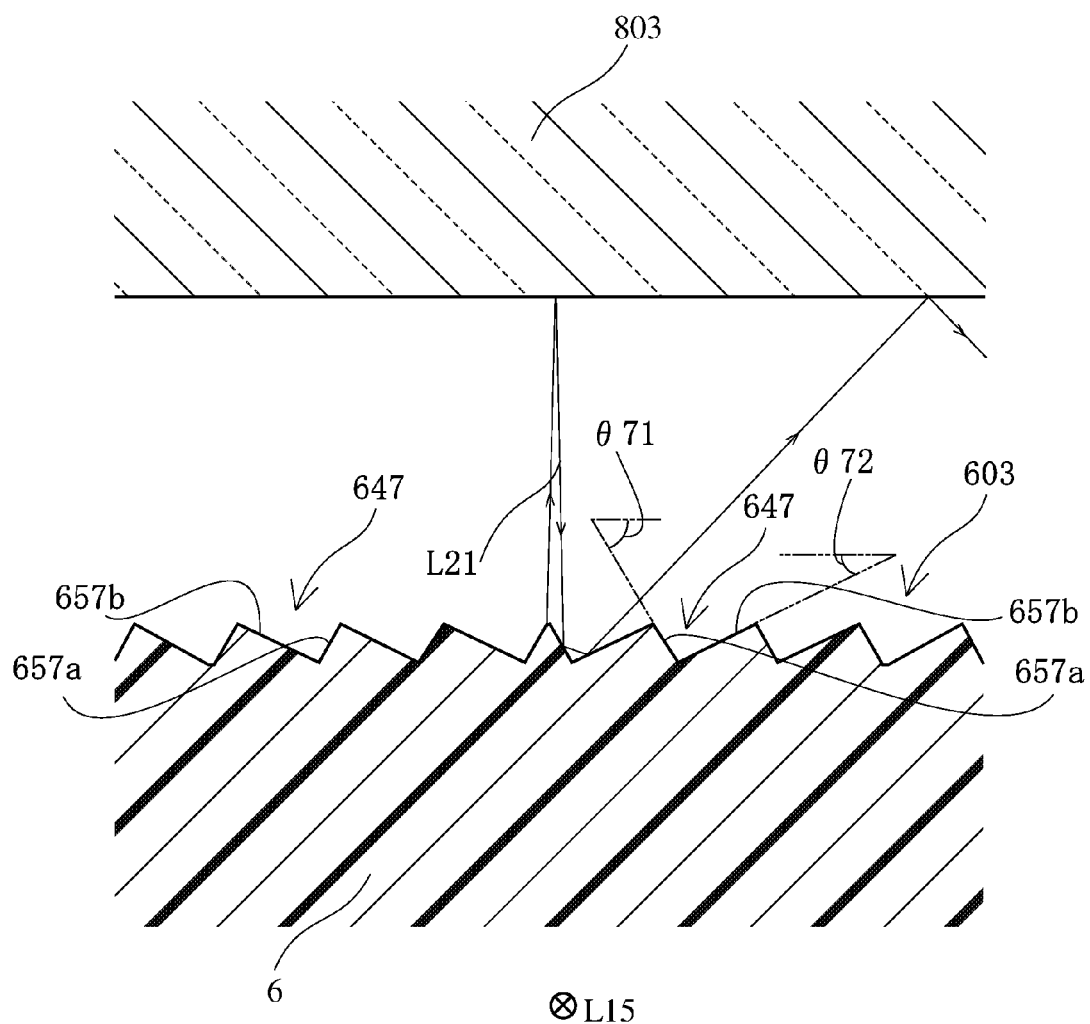
FIG. 32 is a sectional view taken along lines XXXII-XXXII in FIG. 31.

FIG. 31 is a plan view of an optical apparatus according to a fifth embodiment. FIG. 32 is a sectional view taken along lines XXXII-XXXII in FIG. 31.

In the optical apparatus 105 shown in the figures, a plurality of grooves 647 are provided on the surface 603 of the first surface 6A of the light-shielding resin 6. The grooves 647 extend in one direction. In FIG. 31, the region having the grooves 647 is indicated by hatching for convenience. In this embodiment, each groove 647 extends in the direction x. The surface 603 includes first groove surfaces 657a and second groove surfaces 657b. Each of the first groove surfaces and each of the second groove surfaces define one of the grooves 647 and face each other across the bottom of the groove 647. In each groove 647, the second groove surface 657b is further away from the imaginary straight line L15 extending through the center of the first opening 610 in the direction x than the first groove surface 657a is.

Each first groove surface 657a is an inclined surface that proceeds toward the direction z2 side as proceeding away from the imaginary L15 in the direction y. The first groove surface 657a is inclined at a first angle θ71 with respect to the direction y. Each second groove surface 657b is an inclined surface that proceeds toward the direction z2 side as proceeding toward the imaginary line L15 in the direction y. The second groove surface 657b is inclined at a second angle θ72 with respect to the direction y. Preferably, each of the first angle θ71 and the second angle θ72 is 50-70°. In this embodiment, the first angle θ71 is larger than the second angle θ72.

With this structure, the noise light L12 reflected by the first groove surface 657a travels to proceed away from the imaginary straight line L15 as viewed in x-y plane. Thus, the noise light L12 traveling toward the first opening 61 reduces.

Sixth Embodiment

Figure 33:
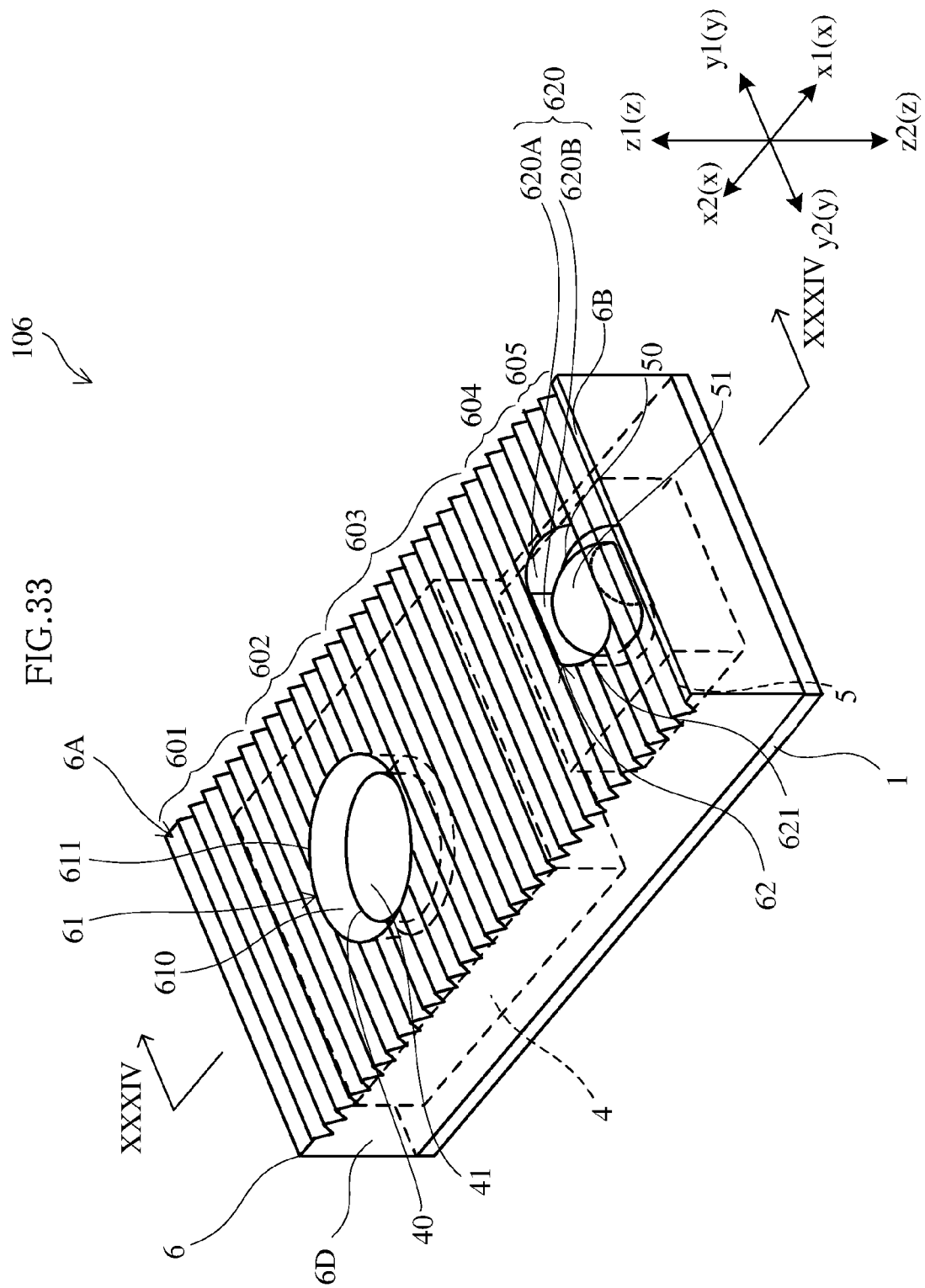
FIG. 33 is a perspective view of an optical apparatus according to a sixth embodiment.
Figure 34:
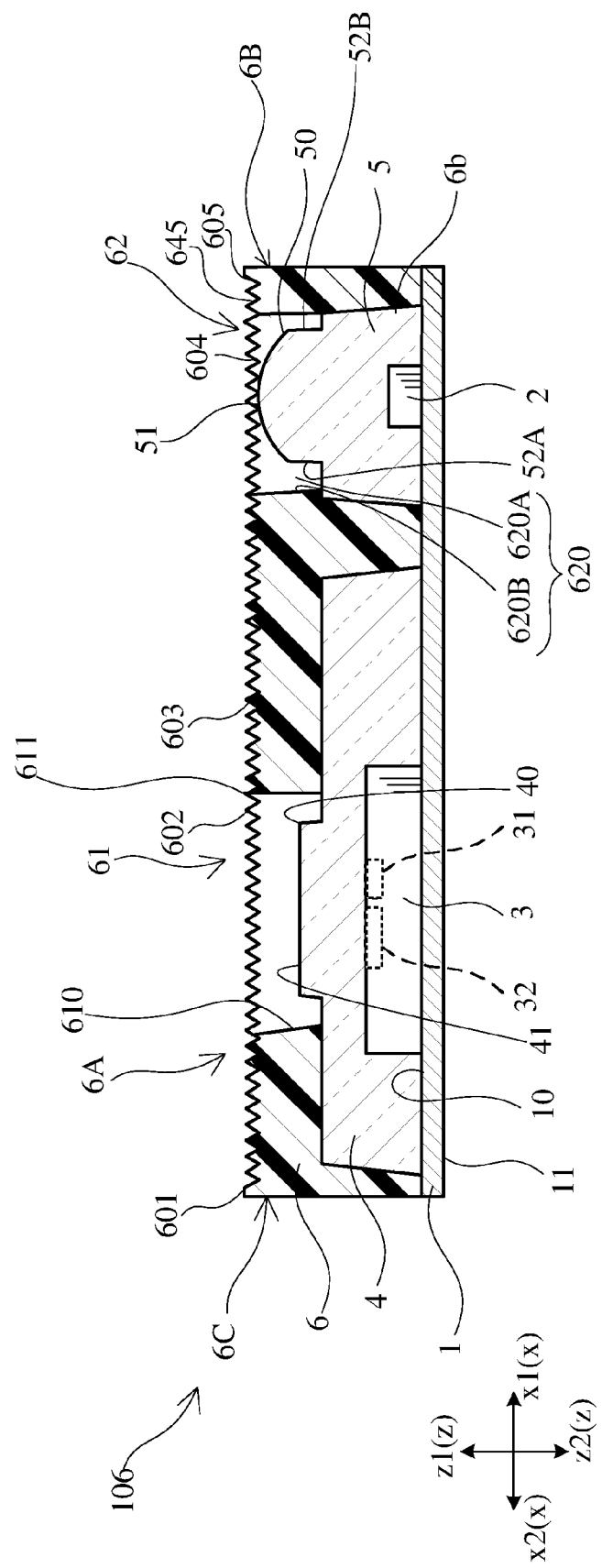
FIG. 34 is a sectional view taken along lines XXIV-XXIV in FIG. 33.

FIG. 33 is a perspective view of an optical apparatus according to a sixth embodiment. FIG. 34 is a sectional view taken along lines XXXIV-XXXIV in FIG. 33.

The optical apparatus 106 shown in the figure differs from the foregoing optical apparatus 101 in that the light-transmitting resin 5 is not exposed from the light-shielding resin 6 in the direction x1. The first surface 6A of the light-shielding resin 6 includes a surface 605 positioned on the direction x1 side of the second opening 62. In this embodiment, the surface 605 has a plurality of grooves 645. Unlike this embodiment, the surface 605 may not have grooves and may be a flat surface. This structure provides substantially the same advantages as those of the optical apparatus 101.

Seventh Embodiment

Figure 35:
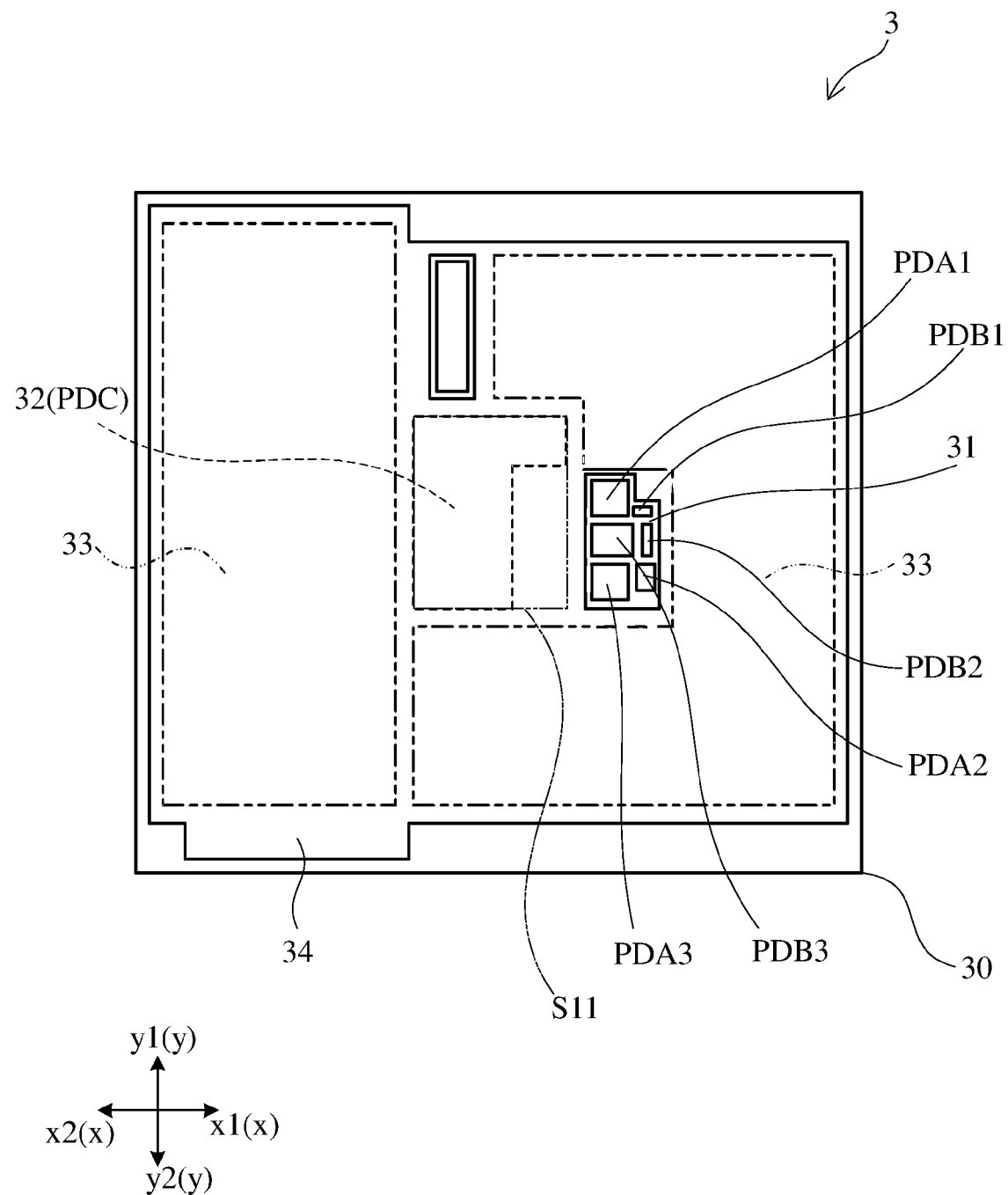
FIG. 35 is a plan view showing a light-receiving element of an optical apparatus according to a seventh embodiment.

FIG. 35 is a plan view showing a light-receiving element of an optical apparatus according to a seventh embodiment.

As shown in the figure, in the light-receiving element 3, the entirety of the visible light detecting portion 31 is positioned outside the smallest rectangular region S11 enclosing the infrared light detecting portion 32 as viewed in x-y plane. Moreover, as viewed in x-y plane, the infrared light detecting portion 32 is positioned further away from the light-emitting element 2 than the visible light detecting portion 31 is. This structure provides the same advantages as those of the optical apparatus 101.

Eighth Embodiment

Figure 36:
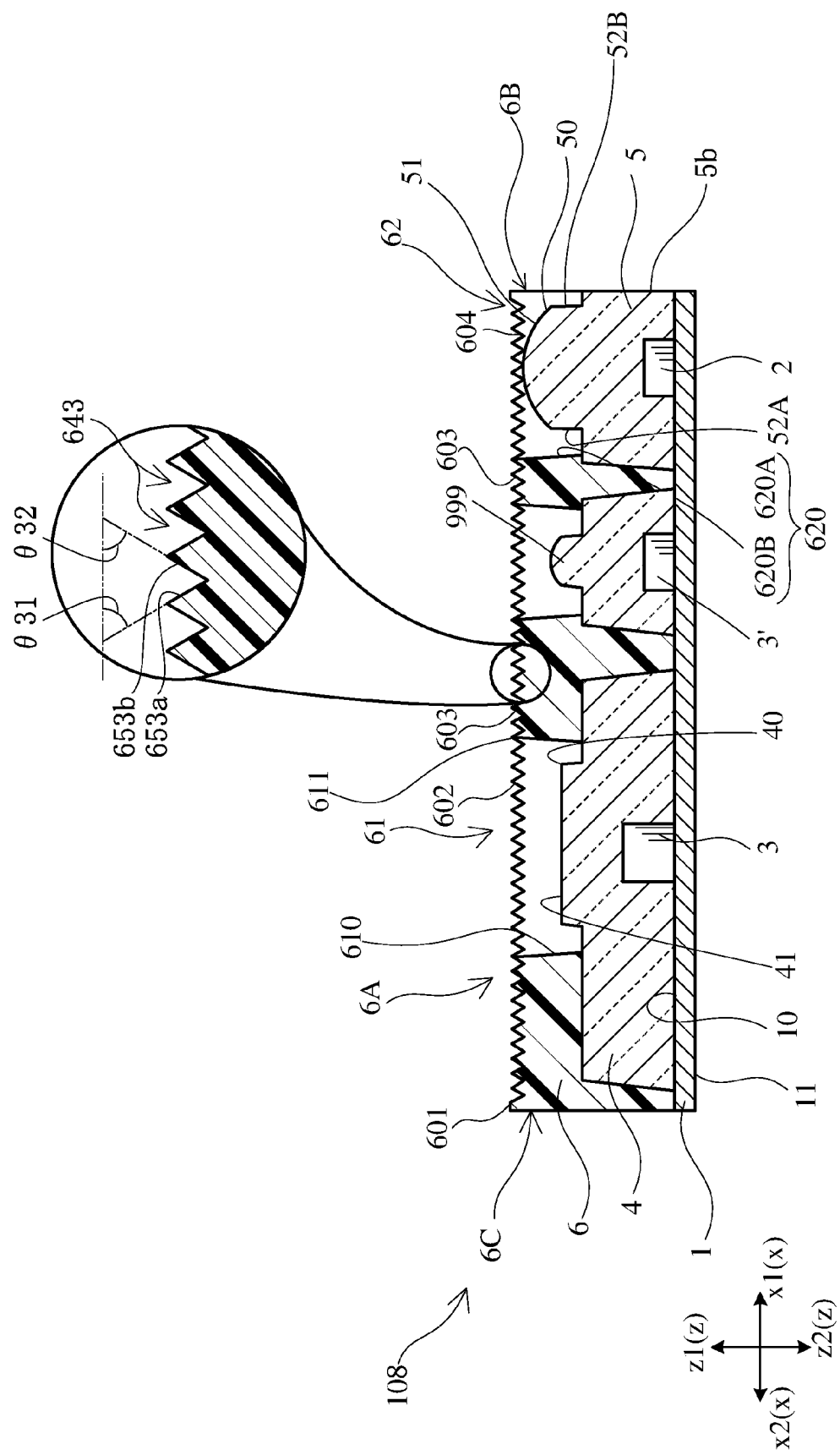
FIG. 36 is a sectional view of an optical apparatus according to an eighth embodiment.

FIG. 36 is a sectional view of an optical apparatus according to an eighth embodiment.

The optical apparatus 108 shown in the figure differs from the optical apparatus 101 in that the light-receiving element 3 comprises a photodiode that does not include a visible light detecting portion. The optical apparatus 108 includes a substrate 1, a light-emitting element 2, a light-receiving element 3, an illuminance sensor element 3', light-transmitting resins 4, 5, 999 and a light-shielding resin 6. Since the structures of the substrate 1, the light-emitting element 2, the light-transmitting resins 4, 5 and the light-shielding resin 6 are substantially the same as those of the optical apparatus 101, description of these is omitted. The illuminance sensor element 3' has the same function as that of the visible light detecting portion 31 of the light-receiving element 3 of the optical apparatus 101. The light-transmitting resin 999 covers the illuminance sensor element 3' and is exposed from the light-shielding resin 6. Visible light impinges on the illuminance sensor element 3' through a portion of the light-transmitting resin 999 which is exposed from the light-shielding resin 6. This arrangement also reduces the noise light L12 that travels toward the first opening 61.

Ninth Embodiment

Figure 37:
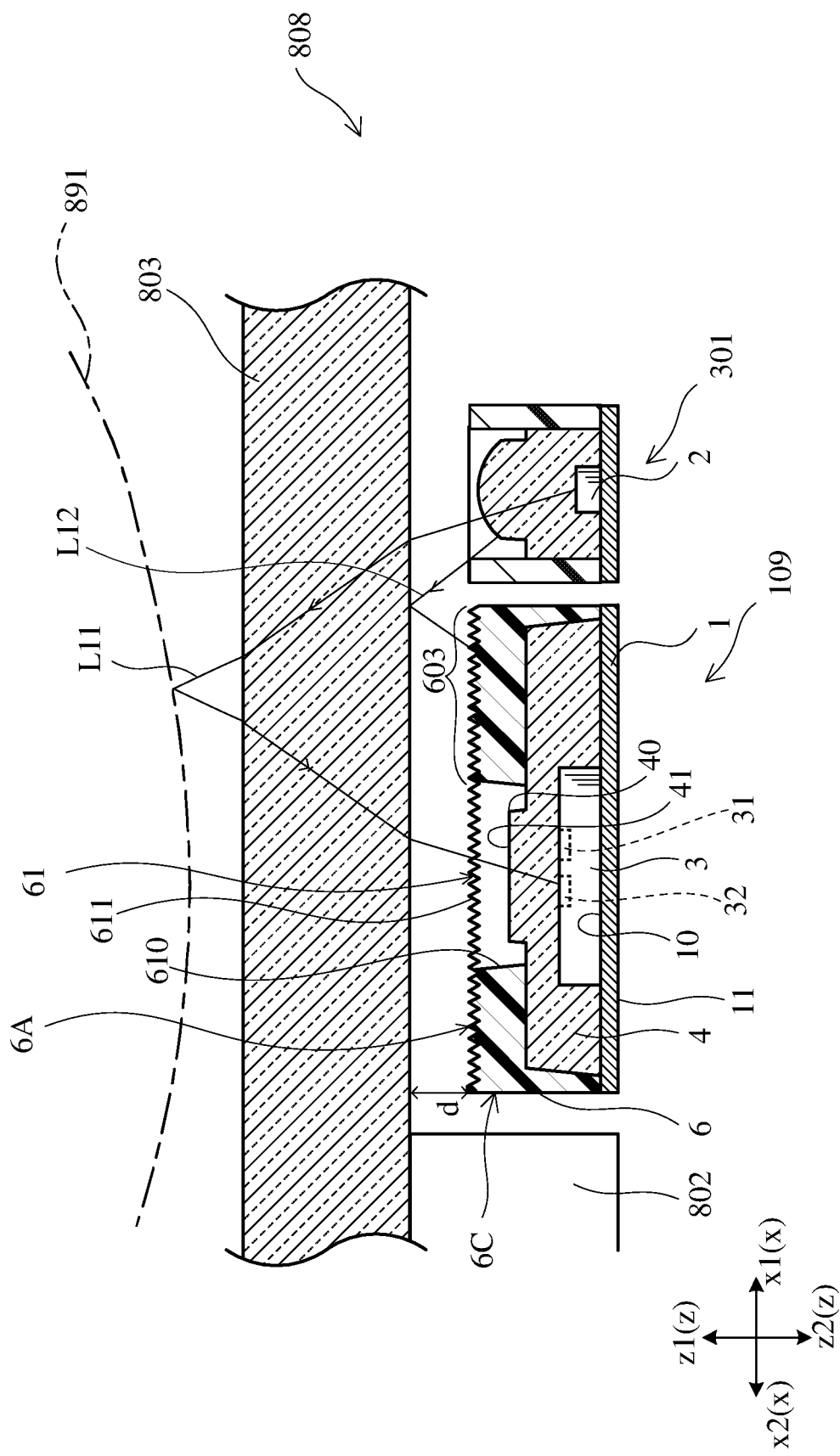
FIG. 37 is a sectional view of an electronic device according to a ninth embodiment.
Figure 38:
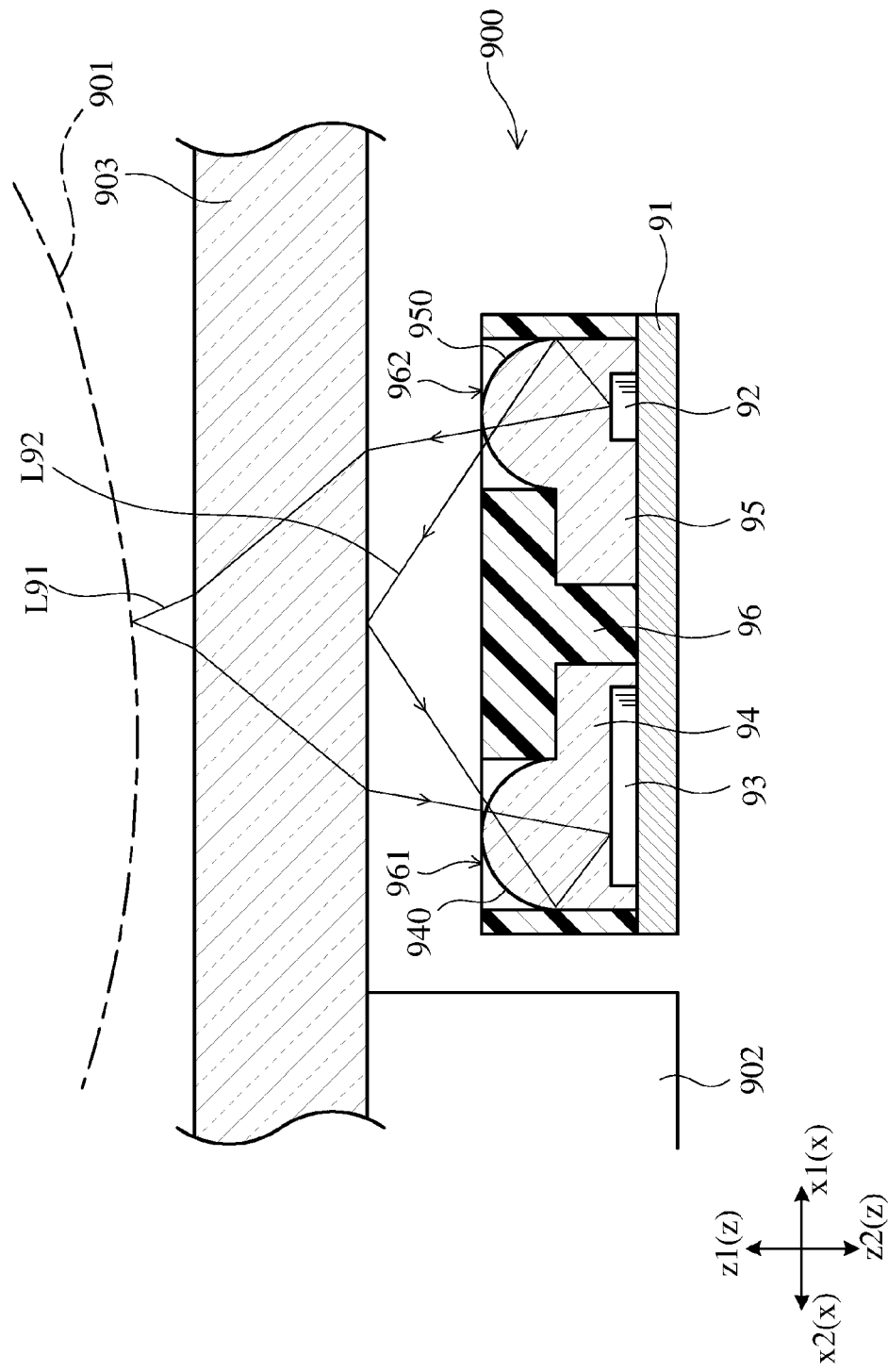
FIG. 38 is a sectional view showing a proximity sensor of related art.

FIG. 37 is a sectional view of an electronic device according to a ninth embodiment.

The electronic device 808 shown in the figure is different from the above-described electronic device 801 in that the optical apparatus 109 does not include the light-emitting element 2 and the light-transmitting resin 5. Since the other parts are the same as those of the optical apparatus 101, the description is omitted. For instance, the optical apparatus 109 can be used along with a light-emitting device 301 including a light-emitting element 2 and separate from the optical apparatus 109, to function as a proximity sensor. This arrangement also reduces the noise light L12 that travels toward the first opening 61.

The scope of the present invention is not limited to the foregoing embodiments. The specific structure of each part of the present invention can be varied in design in many ways.

The invention claimed is:

1. An optical apparatus comprising:
   a base, comprising:
      a substrate having a first part and a second part opposite to the first part; and
      a first conductive pattern formed on the substrate;
   a light-emitting element and a light-receiving element that are disposed on the first part side of the substrate, the light-emitting element being spaced apart from the light-receiving element in a first direction perpendicular to a thickness direction of the substrate;
   a first wire bonded to each of the light-receiving element and the first conductive pattern;
   a first resin covering the light-emitting element;
   a second resin covering the light-receiving element; and
   a light-shielding portion disposed between the light-emitting element and the light-receiving element, the light-shielding portion being spaced apart from each of the light-emitting element and the light-receiving element,
   wherein the light-receiving element is disposed between the first wire and the light-emitting element, and
   the base is provided with a recess, and a part of the light-shielding portion is disposed in the recess.

2. The optical apparatus according to claim 1, wherein the base further comprises:
   a second conductive pattern formed on the second part side; and a first electrode extending through the substrate from the first part side to the second part side, and the second conductive pattern is electrically connected to the first conductive pattern by the first electrode.

3. The optical apparatus according to claim 2, wherein the base further comprises a second electrode extending through the substrate from the first part side to the second part side, and the second electrode is spaced apart from the first electrode as viewed in the thickness direction of the substrate.

4. The optical apparatus according to claim 3, wherein each of the first electrode and the second electrode is spaced apart from the light-receiving element as viewed in the thickness direction of the substrate.

5. The optical apparatus according to claim 4, wherein the light-receiving element is disposed between the light-emitting element and the first electrode, and the light-receiving element is disposed between the light-emitting element and the second electrode.

6. The optical apparatus according to claim 3, further comprising a second wire bonded to the light-emitting element, wherein the first conductive pattern includes an extension, at least a part of the extension extending in a second direction perpendicular to the first direction and the thickness direction, and the second wire is bonded to the extension of the first conductive pattern.

7. The optical apparatus according to claim 6, wherein the base further comprises a third electrode extending through the substrate, and the third electrode is electrically connected to the extension of the first conductive pattern.

8. The optical apparatus according to claim 7, wherein the first conductive pattern includes portion that is electrically connected to the extension and the third electrode.

9. The optical apparatus according to claim 7, wherein the base further comprises a fourth electrode extending through the substrate, the first conductive pattern includes a light-emitting element pad on which the light-emitting element is mounted, and the fourth electrode is electrically connected to the light-emitting element pad.

10. The optical apparatus according to claim 9, wherein the light-emitting element is disposed between at least a part of the third electrode and at least a part of the fourth electrode in the second direction.

11. The optical apparatus according to claim 10, wherein the light-emitting element has a side surface facing the light-receiving element side, and the side surface of the light-emitting element is disposed between the light-receiving element and each of the second wire, the third electrode, and the fourth electrode in the first direction.

12. The optical apparatus according to claim 2, wherein the first electrode is spaced apart from the light-receiving element as viewed in the thickness direction of the substrate.

13. The optical apparatus according to claim 2, wherein the light-receiving element is disposed between the light-emitting element and the first electrode as viewed in the thickness direction of the substrate.

14. The optical apparatus according to claim 2, wherein the second part includes a first edge and a second edge that are spaced apart from each other in a second direction perpendicular to the first direction and the thickness direction, each of the first edge and the second edge extending in the first direction, and the second conductive pattern includes four first terminals and four second terminals, the first terminals being disposed along the first edge of the second part, and the second terminals being disposed along the second edge of the second part.

15. The optical apparatus according to claim 1, wherein the first resin has a first projection that projects toward an opposite direction to the first part of the substrate.

16. The optical apparatus according to claim 15, wherein the second resin has a second projection that projects toward the opposite direction to the first part of the substrate.

17. The optical apparatus according to claim 1, wherein the light-receiving element is greater in length in a second direction perpendicular to the first direction and the thickness direction than the light-emitting element.

18. The optical apparatus according to claim 1, wherein the light-receiving element is greater in length in the first direction than the light-emitting element.

19. The optical apparatus according to claim 1, wherein the first resin and the second resin are spaced apart from each other.

20. An optical apparatus comprising:
a base, comprising:
a substrate having a first part and a second part opposite to the first part; and
a first conductive pattern formed on the substrate;
a second conductive pattern formed on the second part side;
a light-emitting element and a light-receiving element that are disposed on the first part side of the substrate, the light-emitting element being spaced apart from the light-receiving element in a first direction perpendicular to a thickness direction of the substrate;
a first wire bonded to each of the light-receiving element and the first conductive pattern;
a second wire bonded to the light-emitting element;
a first resin covering the light-emitting element;
a second resin covering the light-receiving element;
a first electrode extending through the substrate from the first part side to the second part side; and
a second electrode extending through the substrate from the first part side to the second part side,
wherein the light-receiving element is disposed between the first wire and the light-emitting element,
the second conductive pattern is electrically connected to the first conductive pattern by the first electrode,
the second electrode is spaced apart from the first electrode as viewed in the thickness direction of the substrate,
the first conductive pattern includes an extension, at least a part of the extension extending in a second direction perpendicular to the first direction and the thickness direction,
the second wire is bonded to the extension of the first conductive pattern, and
the base is provided with a recess, and a part of a light-shielding portion is disposed in the recess.

21. The optical apparatus according to claim 20, wherein the first electrode is spaced apart from the light-receiving element as viewed in the thickness direction of the substrate.

22. The optical apparatus according to claim 20, wherein the light-receiving element is disposed between the light-emitting element and the first electrode as viewed in the thickness direction of the substrate.

23. The optical apparatus according to claim 20, wherein each of the first electrode and the second electrode is spaced apart from the light-receiving element as viewed in the thickness direction of the substrate.

24. The optical apparatus according to claim 23, wherein the light-receiving element is disposed between the light-emitting element and the first electrode, and
the light-receiving element is disposed between the light-emitting element and the second electrode.

25. The optical apparatus according to claim 20, wherein the first resin has a first projection that projects toward an opposite direction to the first part of the substrate.

26. The optical apparatus according to claim 20, wherein the second resin has a second projection that projects toward the opposite direction to the first part of the substrate.

27. The optical apparatus according to claim 20, wherein the second part includes a first edge and a second edge that are spaced apart from each other in a second direction perpendicular to the first direction and the thickness direction, each of the first edge and the second edge extending in the first direction, and
the second conductive pattern includes four first terminals and four second terminals, the first terminals being disposed along the first edge of the second part, and the second terminals being disposed along the second edge of the second part.

28. The optical apparatus according to claim 20, wherein the light-receiving element is greater in length in a second direction perpendicular to the first direction and the thickness direction than the light-emitting element.

29. The optical apparatus according to claim 20, wherein the light-receiving element is greater in length in the first direction than the light-emitting element.

30. The optical apparatus according to claim 20, wherein the first resin and the second resin are spaced apart from each other.

* * * * *